US012811054B2

(12) United States Patent
Wada

(10) Patent No.: US 12,811,054 B2
(45) Date of Patent: Nov. 24, 2026

(54) INSULATION CHIP AND SIGNAL TRANSMISSION DEVICE

(71) Applicant: ROHM CO., LTD., Kyoto (JP)

(72) Inventor: Keiji Wada, Kyoto (JP)

(73) Assignee: ROHM CO., LTD., Kyoto (JP)

(*) Notice: Subject to any disclaimer, the term of this patent is extended or adjusted under 35 U.S.C. 154(b) by 416 days.

(21) Appl. No.: 18/614,972

(22) Filed: Mar. 25, 2024

(65) Prior Publication Data

US 2024/0331932 A1 Oct. 3, 2024

(30) Foreign Application Priority Data

Mar. 27, 2023 (JP) ................................ 2023-050131

(51) Int. Cl.

| | |
|---|---|
| ***H01F 27/32*** | (2006.01) |
| ***H01F 17/00*** | (2006.01) |
| ***H10D 1/20*** | (2025.01) |
| ***H10W 70/40*** | (2026.01) |
| *H10W 72/90* | (2026.01) |
| *H10W 90/00* | (2026.01) |

(52) U.S. Cl.

CPC ....... *H01F 27/324* (2013.01); *H01F 17/0013* (2013.01); *H10D 1/20* (2025.01); *H10W 70/411* (2026.01); *H01F 2017/0073* (2013.01); *H01F 2017/0086* (2013.01); *H10W 72/932* (2026.01); *H10W 90/756* (2026.01)

(58) Field of Classification Search

CPC ............... H01F 27/324; H01F 17/0013; H01F 2017/0073; H01F 2017/0086; H10D 1/20; H10W 70/411; H10W 72/932; H10W 90/756

See application file for complete search history.

(56) References Cited

U.S. PATENT DOCUMENTS

2022/0077081 A1* 3/2022 Kurita ................ H01F 27/2804

FOREIGN PATENT DOCUMENTS

JP 2018078169 A 5/2018

* cited by examiner

*Primary Examiner* — Samuel A Gebremariam

(74) *Attorney, Agent, or Firm* — HSML P.C.

(57) ABSTRACT

An insulation chip includes a first unit, second unit provided on the first unit, and an insulating bonding material for bonding the first and second units. The first unit includes a first element insulating layer including a first element front surface facing the second unit and a first element back surface, and a first insulating element buried in the first element insulating layer at a position spaced apart from the first element front surface in a thickness direction of the first element insulating layer. The second unit includes a second element insulating layer including a second element front surface and a second element back surface, a second insulating element buried in the second element insulating layer at a position spaced apart from the second element front surface in a thickness direction of the second element insulating layer, and a second semiconductor substrate in contact with the second element back surface.

18 Claims, 32 Drawing Sheets

INSULATION CHIP AND SIGNAL TRANSMISSION DEVICE

CROSS-REFERENCE TO RELATED APPLICATION

This application is based upon and claims the benefit of priority from Japanese Patent Application No. 2023-050131, filed on Mar. 27, 2023, the entire contents of which are incorporated herein by reference.

TECHNICAL FIELD

The present disclosure relates to an insulation chip and a signal transmission device.

BACKGROUND

As an example of a signal transmission device, an insulated gate driver that applies a gate voltage to a gate of a switching element such as a transistor is known. As an example of an insulation chip used in such a gate driver, in an element insulating layer, a structure that includes a first coil and a second coil arranged to face each other in a thickness direction of the element insulating layer is known.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
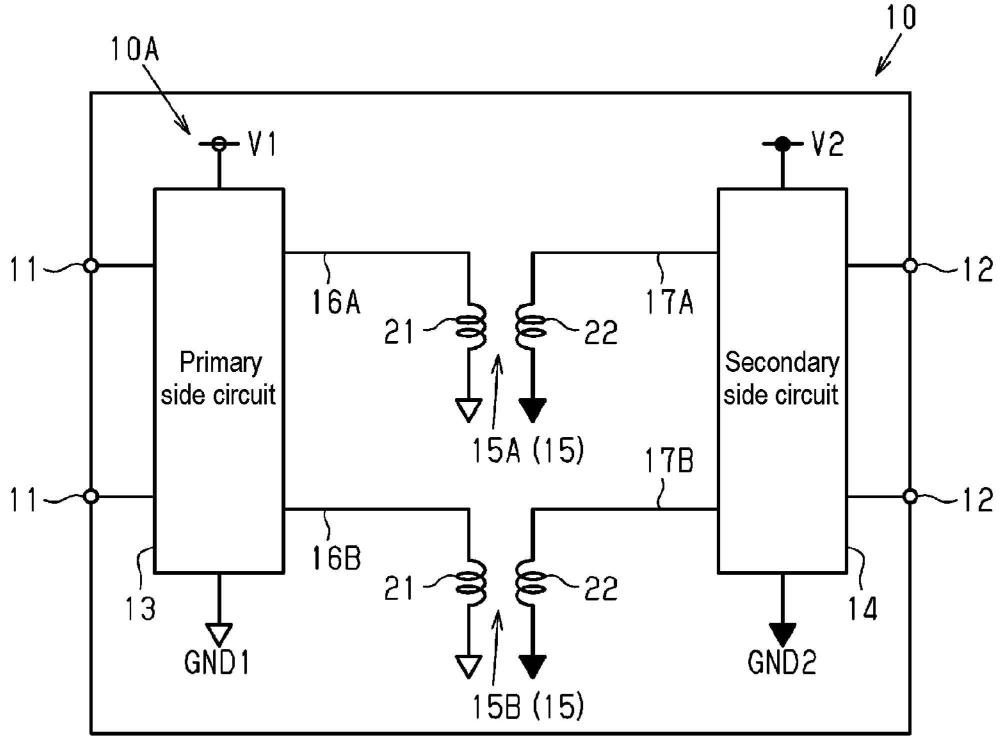
FIG. 1 is a circuit diagram schematically showing a circuit configuration of a signal transmission device according to a first embodiment.

Hereinafter, some embodiments of an insulation chip and a signal transmission device according to the present disclosure will be described with reference to the accompanying drawings. It should be noted that, for simplicity and clarity of explanation, components shown in the drawings are not necessarily drawn to scale. Further, in order to facilitate understanding, hatching lines may be omitted in cross-sectional views. The accompanying drawings merely illustrate embodiments of the present disclosure and should not be considered as limiting the present disclosure.

The following detailed description includes devices, systems, and methods embodying exemplary embodiments of the present disclosure. This detailed description is for illustrative purposes only and is not intended to limit the embodiments of the present disclosure or the applications and uses of such embodiments.

First Embodiment

[Configuration of Signal Transmission Device]

Figure 2:
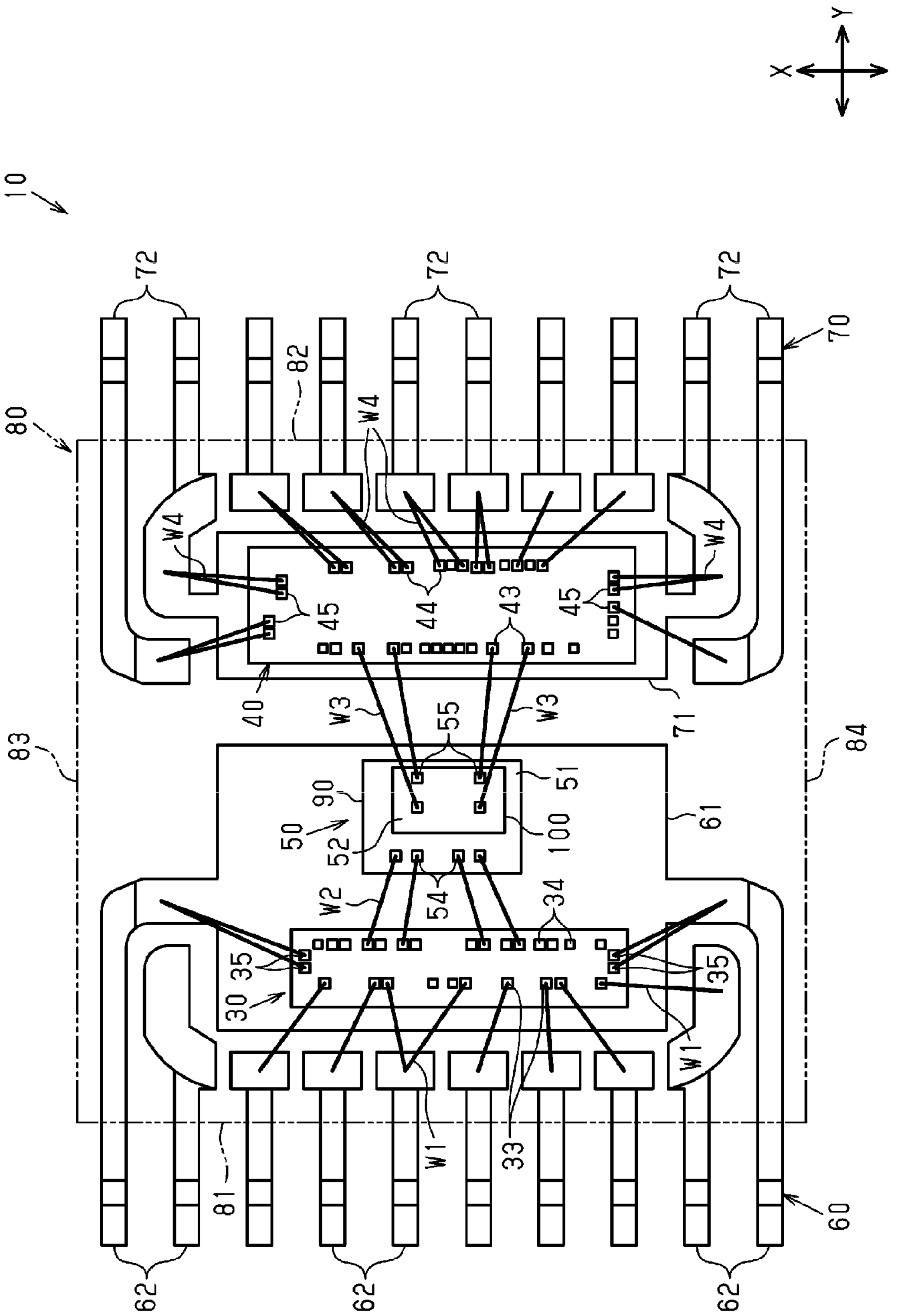
FIG. 2 is a schematic plan view schematically showing a configuration of the signal transmission device of FIG. 1.
Figure 3:
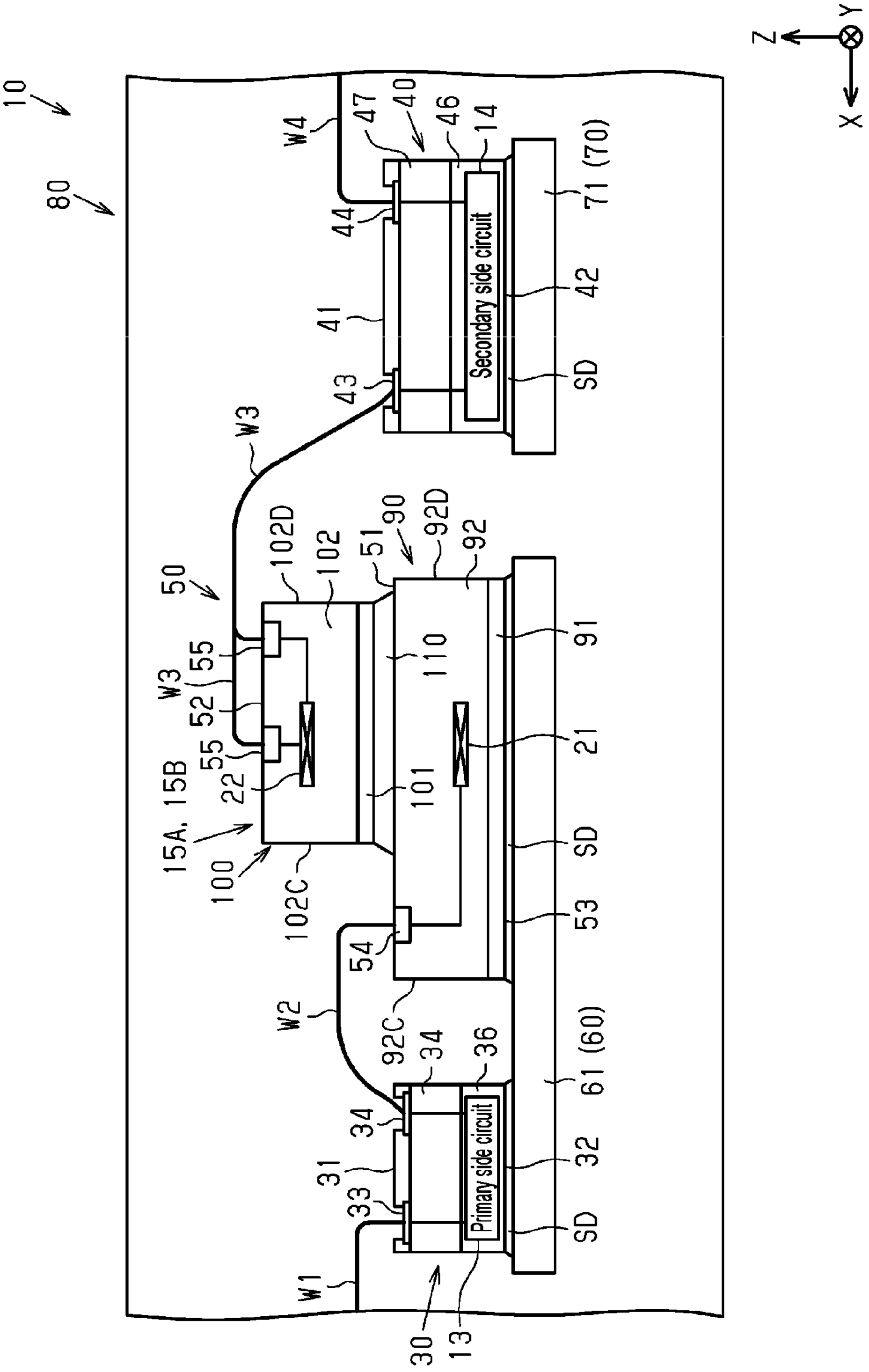
FIG. 3 is a schematic cross-sectional view schematically showing the configuration of the signal transmission device of FIG. 2.

A schematic configuration of a signal transmission device 10 according to a first embodiment will be described with reference to FIGS. 1 to 3. FIG. 1 shows a simplified example of a circuit configuration of the signal transmission device 10 of the first embodiment. FIG. 2 shows a schematic planar structure of an interior of the signal transmission device 10 of the first embodiment. FIG. 3 shows a simplified internal structure of a portion of the signal transmission device 10 of FIG. 2. Hatching lines are omitted in FIG. 3 to facilitate understanding of the drawings.

As shown in FIG. 1, the signal transmission device 10 is configured to transmit a pulse signal while electrically insulating a primary-side terminal 11 and a secondary-side terminal 12. The signal transmission device 10 is, for example, a digital isolator. An example of the digital isolator is a DC/DC converter. The signal transmission device 10 includes a signal transmission circuit 10A including a primary-side circuit 13 electrically connected to the primary-side terminal 11, a secondary-side circuit 14 electrically connected to the secondary-side terminal 12, and a transformer 15 that electrically insulates the primary-side circuit 13 from the secondary-side circuit 14. Here, in the present disclosure, the primary-side circuit 13 corresponds to a "first circuit," and the secondary-side circuit 14 corresponds to a "second circuit."

The primary-side circuit 13 is configured to operate when a first voltage V1 is applied thereto. The primary-side circuit 13 is electrically connected to, for example, an external control device (not shown). The secondary-side circuit 14 is configured to operate when a second voltage V2 different from the first voltage V1 is applied thereto. The first voltage V1 and the second voltage V2 are DC voltages. The secondary-side circuit 14 is electrically connected to, for example, a drive circuit (not shown) to be controlled by a control device. An example of the drive circuit is a switching circuit including a switching element. Examples of the switching element may include SiMOSFET, SiCMOSFET, IGBT, and the like. The secondary-side circuit 14 is electrically connected to the gate of the switching element. Further, the secondary-side circuit 14 supplies a gate drive signal to the gate of the switching element.

In the signal transmission circuit 10A, when a control signal from the control device is input to the primary-side circuit 13 via the primary-side terminal 11, a signal is transmitted from the primary-side circuit 13 to the secondary-side circuit 14 via the transformer 15. Then, the signal transmitted to the secondary-side circuit 14 is output from the secondary-side circuit 14 to the drive circuit via the secondary-side terminal 12.

The signal transmitted from the primary-side circuit 13 to the secondary-side circuit 14, that is, the signal output from the primary-side circuit 13, is, for example, a signal for driving the switching element. Examples of this signal may include a set signal (SET) and a reset signal (RESET). The set signal is a signal that transmits the rise of the control signal from the control device, and the reset signal is a signal that transmits the fall of the control signal from the control device. It can be said that the set signal and the reset signal are signals for generating the gate drive signal of the switching element.

More specifically, the primary-side circuit 13 generates the set signal and the reset signal based on the control signal input from the control device. In one example, the primary-side circuit 13 generates the set signal in response to a rising edge of the control signal and generates the reset signal in response to a falling edge of the control signal. Then, the primary-side circuit 13 transmits the generated set signal and reset signal to the secondary-side circuit 14.

The secondary-side circuit 14 generates the gate drive signal for driving the switching element based on the set signal and the reset signal received from the primary-side circuit 13. Then, the secondary-side circuit 14 supplies the gate drive signal to the gate of the switching element. In other words, it can be said that the secondary-side circuit 14 generates the gate drive signal to be supplied to the gate of the switching element based on a first signal output from the primary-side circuit 13. More specifically, the secondary-side circuit 14 generates the gate drive signal for turning on the switching element based on the set signal, and then supplies the gate drive signal to the gate of the switching element. On the other hand, the secondary-side circuit 14 generates the gate drive signal for turning off the switching element based on the reset signal, and then supplies the gate drive signal to the gate of the switching element. In this way, the signal transmission device 10 controls the turn-on/off of the switching element.

The secondary-side circuit 14 includes, for example, an RS type flip-flop circuit to which the set signal and the reset signal are input, and a driver part that generates the gate drive signal based on an output signal of the RS type flip-flop circuit. However, a specific circuit configuration of the secondary-side circuit 14 may be changed arbitrarily.

As described above, the primary-side circuit 13 and the secondary-side circuit 14 are electrically insulated from each other by the transformer 15. More specifically, while the transformer 15 restricts the transmission of a DC voltage between the primary-side circuit 13 and the secondary-side circuit 14, it is possible to transmit various signals such as the set signal and the reset signal between the primary-side circuit 13 and the secondary-side circuit 14.

In other words, the state in which the primary-side circuit 13 and the secondary-side circuit 14 are insulated from each other means a state in which the transmission of a DC voltage is cut off between the primary-side circuit 13 and the secondary-side circuit 14, and the transmission of signals is permitted between the primary-side circuit 13 and the secondary-side circuit 14.

A dielectric breakdown voltage of the signal transmission device 10 is, for example, 2,500 Vrms or more and 7,500 Vrms or less. In one example, the dielectric breakdown voltage of the signal transmission device 10 is about 5,000 Vrms. However, a specific numerical value of the dielectric breakdown voltage of the signal transmission device 10 is not limited thereto and may be changed arbitrarily.

In the example shown in FIG. 1, a ground GND1 of the primary-side circuit 13 and a ground GND2 of the secondary-side circuit 14 are provided independently. Hereinafter, a potential of the ground GND1 of the primary-side circuit 13 is referred to as a first reference potential, and a potential of the ground GND2 of the secondary-side circuit 14 is referred to as a second reference potential. In this case, the first voltage V1 is a voltage from the first reference potential, and the second voltage V2 is a voltage from the second reference potential. The first voltage V1 is, for example, 4.5 V or more and 5.5 V or less, and the second voltage V2 is, for example, 9 V or more and 24 V or less.

Next, a detailed configuration of the signal transmission device 10 will be described. The signal transmission device 10 includes two transformers 15 for transmitting two types of signals, such as the set signal and the reset signal, from the primary-side circuit 13 to the secondary-side circuit 14. More specifically, the signal transmission device 10 includes a transformer 15 used to transmit the set signal from the primary-side circuit 13 to the secondary-side circuit 14, and a transformer 15 used to transmit the reset signal from the primary-side circuit 13 to the secondary-side circuit 14. Hereinafter, for the sake of convenience in explanation, the transformer 15 used to transmit the set signal is referred to as a "transformer 15A," and the transformer 15 used to transmit the reset signal is referred to as a "transformer 15B."

The signal transmission device 10 includes a primary-side signal line 16A that connects the primary-side circuit 13 and the transformer 15A, and a primary-side signal line 16B that connects the primary-side circuit 13 and the transformer 15B. Therefore, the primary-side signal line 16A transmits the set signal from the primary-side circuit 13 to the transformer 15A. The primary-side signal line 16B transmits the reset signal from the primary-side circuit 13 to the transformer 15B.

The signal transmission device 10 includes a secondary-side signal line 17A that connects the transformer 15A and the secondary-side circuit 14, and a secondary-side signal line 17B that connects the transformer 15B and the secondary-side circuit 14. Therefore, the secondary-side signal line 17A transmits the set signal from the transformer 15A to the secondary-side circuit 14. The secondary-side signal line 17B transmits the reset signal from the transformer 15B to the secondary-side circuit 14.

The transformer 15A is configured to electrically insulate the primary-side circuit 13 from the secondary-side circuit 14 while transmitting the set signal from the primary-side circuit 13 to the secondary-side circuit 14. The transformer 15B is configured to electrically insulate the primary-side circuit 13 from the secondary-side circuit 14 while transmitting the reset signal from the primary-side circuit 13 to the secondary-side circuit 14.

Each of the transformers 15A and 15B includes a first coil 21 and a second coil 22. The first coil 21 and the second coil 22 are electrically insulated from each other and are configured to be magnetically coupled to each other.

The first coils 21 of the transformers 15A and 15B are electrically connected to the primary-side circuit 13. In one example, a first end of the first coil 21 of the transformer 15A is electrically connected to the primary-side circuit 13 via the primary-side signal line 16A, and a second end of the first coil 21 of the transformer 15A is electrically connected to the ground GND1 of the primary-side circuit 13. A first end of the first coil 21 of the transformer 15B is electrically connected to the primary-side circuit 13 via the primary-side signal line 16B, and a second end of the first coil 21 of the transformer 15B is connected to the ground GND1 of the primary-side circuit 13. Therefore, a potential at the second ends of the first coils 21 of the transformers 15A and 15B becomes the first reference potential. The first reference potential is, for example, 0 V.

The second coils 22 of the transformers 15A and 15B are electrically connected to the secondary-side circuit 14. In one example, the first end of the second coil 22 of the transformer 15A is electrically connected to the secondary-side circuit 14 via the secondary-side signal line 17A, and the second end of the second coil 22 of the transformer 15A is electrically connected to the ground GND2 of the secondary-side circuit 14. The first end of the second coil 22 of the transformer 15B is electrically connected to the secondary-side circuit 14 via the secondary-side signal line 17B, and the second end of the second coil 22 of the transformer 15B is electrically connected to the ground GND2 of the secondary-side circuit 14. Therefore, a potential at the second ends of the second coils 22 of the transformers 15A and 15B becomes the second reference potential. The ground GND2 of the secondary-side circuit 14 is electrically connected, for example, to a source of the switching element in the switching circuit electrically connected to the secondary-side circuit 14.

Meanwhile, depending on how to use the switching circuit, the source of the switching element changes as the switching circuit operates. In this case, the source of the switching element may be, for example, 600 V or higher. Therefore, the ground GND2 of the secondary-side circuit 14, that is, the second reference potential, may be 600 V or more. Thus, the transformers 15A and 15B are required to have dielectric breakdown voltages corresponding to the first reference potential and the second reference potential.

As described above, when the second reference potential is 600 V or more, since the secondary-side circuit 14 operates at a higher potential than the primary-side circuit 13, in other words, the second voltage V2 is higher than the first voltage V1, it may be referred to as a "high voltage circuit." On the other hand, since the primary-side circuit 13 operates at a lower potential than the secondary-side circuit 14, in other words, the first voltage V1 is lower than the second voltage V2, it may be referred to as a "low voltage circuit." Therefore, of the transformers 15A and 15B, the first coil 21 electrically connected to the primary-side circuit 13 (the low voltage circuit) may be referred to as a "low voltage coil." Further, of the transformers 15A and 15B, the second coil 22 electrically connected to the secondary-side circuit 14 (the high voltage circuit) may be referred to as a "high voltage coil."

FIG. 2 shows an exemplary plan view showing an internal configuration of the signal transmission device 10. Since FIG. 1 shows the circuit configuration of the signal transmission device 10 in a simplified manner, the number of external terminals (primary-side terminals 11 and secondary-side terminals 12) of the signal transmission device 10 of FIG. 2 is larger than the number of external terminals of the signal transmission device 10 of FIG. 1. Further, the number of signal lines (wires W1 to W4 which will be described later) that transmit signals from the primary-side circuit 13 to the secondary-side circuit 14 in the signal transmission device 10 of FIG. 2 is larger than the number of signal lines in the signal transmission device 10 of FIG. 1.

FIG. 3 shows an exemplary cross-sectional view showing an internal configuration of the signal transmission device 10. Since FIG. 3 shows the internal configuration of the signal transmission device 10 in a simplified manner, the cross-sectional structures of a first chip 30, a second chip 40, and a transformer chip 50, which will be described later, are simplified. Therefore, the cross-sectional structure of the transformer chip 50 shown in FIG. 3 is different from the cross-sectional structure of the transformer chip 50 shown in FIGS. 10, 12 to 14, and the like.

As shown in FIG. 2, the signal transmission device 10 is a semiconductor device in which a plurality of semiconductor chips are packaged into one. A package format of the signal transmission device 10 is an SO (Small Outline) type, and in the example of FIG. 2, it is an SOP (Small Outline Package). The signal transmission device 10 includes the first chip 30, the second chip 40, and the transformer chip 50 as semiconductor chips. Further, the signal transmission device 10 includes a first lead frame 60 on which the first chip 30 is arranged, a second lead frame 70 on which the second chip 40 is arranged, and a sealing resin 80 for sealing the chips 30, 40, and 50 and portions of the lead frames 60 and 70. The transformer chip 50 is an example of an "insulation chip." Further, the package format of the signal transmission device 10 may be changed arbitrarily. Further, in FIG. 2, the sealing resin 80 is indicated by a two-dot chain line for the sake of convenience in explaining the internal structure of the signal transmission device 10.

The sealing resin 80 is formed of a material having electrical insulation. In one example, the sealing resin 80 is made of resin containing, for example, epoxy resin. The sealing resin 80 is formed in a rectangular plate shape whose thickness direction is a Z direction. The sealing resin 80 has four resin-side surfaces 81 to 84. The resin-side surfaces 81 and 82 constitute both end surfaces of the sealing resin 80 in an X direction. The resin-side surfaces 83 and 84 constitute both end surfaces of the sealing resin 80 in a Y direction. In the following description, viewing the signal transmission device 10 and its components from the Z direction is referred to as "in a plan view." Further, the X direction and the Y direction are directions that intersect with the Z direction in a plan view, and are perpendicular to each other. In one example, both the X direction and the Y direction are perpendicular to the Z direction.

Each of the first lead frame 60 and the second lead frame 70 is a conductor and is formed of a material containing, for example, Cu (copper), Fe (iron), or the like. Each of the lead frames 60 and 70 is provided across the inside and outside of the sealing resin 80.

The first lead frame 60 includes a first die pad 61 arranged within the sealing resin 80 and a plurality of first leads 62 arranged across the inside and outside of the sealing resin 80. Each of the first leads 62 constitutes the primary-side terminal 11 (see FIG. 1).

In the example of FIG. 2, both the first chip 30 and the transformer chip 50 are arranged on the first die pad 61. In a plan view, the first die pad 61 is arranged such that its center in the X direction is closer to the resin-side surface 81 than the center of the sealing resin 80 in the X direction. In one example, the first die pad 61 is not exposed from the sealing resin 80. The first die pad 61 is formed in a rectangular flat plate shape whose thickness direction is the Z direction. The shape of the first die pad 61 in a plan view is a rectangular shape in which the Y direction is a longitudinal direction and the X direction is a lateral direction.

The plurality of first leads 62 are arranged to be spaced apart from each other in the Y direction. Of the plurality of first leads 62, each of the first leads 62 arranged at both ends in the Y direction is integrated with the first die pad 61. A portion of each first lead 62 protrudes from the resin-side surface 81 outward of the sealing resin 80.

The second lead frame 70 includes a second die pad 71 arranged within the sealing resin 80 and a plurality of second leads 72 arranged across the inside and outside of the sealing resin 80. Each of the second leads 72 constitutes the secondary-side terminal 12 (see FIG. 1).

In the example of FIG. 2, the second chip 40 is arranged on the second die pad 71. In a plan view, the second die pad 71 is arranged to be closer to the resin-side surface 82 than the first die pad 61 and spaced apart from the first die pad 61 in the X direction. As described above, since the first die pad 61 and the second die pad 71 are arranged in the X direction, it can be said that the X direction is an arrangement direction of the first die pad 61 and the second die pad 71.

In one example, the second die pad 71 is not exposed from the sealing resin 80. The second die pad 71 is formed in a rectangular flat plate shape whose thickness direction is the Z direction. The shape of the second die pad 71 in a plan view is a rectangular shape in which the Y direction is the longitudinal direction and the X direction is the lateral direction. Dimensions of the first die pad 61 and the second die pad 71 in the X direction are set according to the size and number of semiconductor chips to be arranged. Therefore, the dimension in the X direction of the first die pad 61 on which the first chip 30 and the transformer chip 50 are arranged is larger than the dimension in the X direction of the second die pad 71 on which the second chip 40 is arranged.

The plurality of second leads 72 are arranged to be spaced apart from each other in the Y direction. In the example shown in FIG. 2, a pair of second leads 72 among the plurality of second leads 72 are integrated with the second die pad 71. The pair of second leads 72 are the second leads 72 adjacent in the Y direction to each of the second leads 72 arranged at both ends in the Y direction. A portion of each of the second leads 72 protrudes from the resin-side surface 82 outward of the sealing resin 80.

In one example, the number of second leads 72 is the same as the number of first leads 62. As shown in FIG. 2, in a plan view, the plurality of first leads 62 are arranged in a direction (Y direction) perpendicular to the arrangement direction (X direction) of the first die pad 61 and the second die pad 71. Similarly, the plurality of second leads 72 are arranged in the direction (Y direction) perpendicular to the arrangement direction (X direction) of the first die pad 61 and the second die pad 71. The number of first leads 62 and the number of second leads 72 may be changed arbitrarily.

In the example of FIG. 2, the first die pad 61 is supported by a pair of first leads 62 that are integrated with the first die pad 61. The second die pad 71 is supported by a pair of second leads 72 that are integrated with the second die pad 71. Therefore, each of the die pads 61 and 71 is not provided with a hanging lead exposed from the resin-side surfaces 83 and 84. Therefore, an insulation distance between the first lead frame 60 and the second lead frame 70 may be increased.

The first chip 30 and the transformer chip 50 are arranged on the first die pad 61 so as to be spaced apart from each other in the X direction. The second chip 40 is disposed on the opposite side of the first chip 30 with respect to the transformer chip 50 in the X direction. In this way, the first chip 30, the second chip 40, and the transformer chip 50 are arranged to be spaced apart from each other in the X direction. It can be said that the first chip 30, the second chip 40, and the transformer chip 50 are arranged in the same direction as the arrangement direction of the first die pad 61 and the second die pad 71. The first chip 30, the transformer chip 50, and the second chip 40 are arranged in this order from the first lead 62 to the second lead 72 in the X direction. In other words, it can be said that the transformer chip 50 is arranged between the first chip 30 and the second chip 40 in the X direction.

The first chip 30 includes the primary-side circuit 13 shown in FIG. 1. The first chip 30 is formed in a rectangular plate shape whose thickness direction is the Z direction. The shape of the first chip 30 in a plan view is a rectangular shape in which the X direction is the lateral direction and the Y direction is the longitudinal direction. As shown in FIG. 3, the first chip 30 has a chip front surface 31 and a chip back surface 32 facing opposite to each other in the Z direction. The chip back surface 32 of the first chip 30 is bonded to the first die pad 61 by a conductive bonding material SD. For example, a solder paste or an Ag (silver) paste is used as the conductive bonding material SD.

A plurality of first electrode pads 33, a plurality of second electrode pads 34, and a plurality of third electrode pads 35 are formed on the chip front surface 31 of the first chip 30.

The first electrode pads 33, the second electrode pads 34, and the third electrode pads 35 are electrically connected to the primary-side circuit 13.

The plurality of first electrode pads 33 are arranged on the chip front surface 31 closer to the first lead 62 than the center of the chip front surface 31 in the X direction. The plurality of first electrode pads 33 are arranged to be spaced apart from each other in the Y direction. The plurality of second electrode pads 34 are arranged at an end closer to the transformer chip 50 of both ends of the chip front surface 31 in the X direction. The plurality of second electrode pads 34 are arranged to be spaced apart from each other in the Y direction. The plurality of third electrode pads 35 are arranged in a distributed manner at both ends of the chip front surface 31 in the Y direction.

As shown in FIG. 3, the first chip 30 includes a substrate 36 on which the primary-side circuit 13 is formed. The substrate 36 is, for example, a semiconductor substrate. An example of the semiconductor substrate is a substrate formed of a material containing Si. A wiring layer 37 is formed on the substrate 36. The substrate 36 constitutes the chip back surface 32, and the wiring layer 37 constitutes the chip front surface 31.

The wiring layer 37 includes, for example, a plurality of insulating films stacked in the Z direction and a metal layer buried in the insulating films. The metal layer constitutes a wiring pattern of the first chip 30. The metal layer electrically connects, for example, the primary-side circuit 13 and each of the electrode pads 33 to 35. That is, each of the electrode pads 33 to 35 is electrically connected to the primary-side circuit 13 via the wiring layer 37. The metal layer is formed of a material containing one or more appropriately selected from the group consisting of, for example, Ti (titanium), TiN (titanium nitride), Au (gold), Ag, Cu, Al (aluminum), and W (tungsten).

As shown in FIG. 2, the second chip 40 includes the secondary-side circuit 14 shown in FIG. 1. The second chip 40 is formed in a rectangular plate shape whose thickness direction is the Z direction. The shape of the second chip 40 in a plan view is a rectangular shape in which the X direction is the lateral direction and the Y direction is the longitudinal direction. As shown in FIG. 3, the second chip 40 has a chip front surface 41 and a chip back surface 42 facing opposite to each other in the Z direction. The chip back surface 42 of the second chip 40 is bonded to the second die pad 71 by a conductive bonding material SD.

A plurality of first electrode pads 43, a plurality of second electrode pads 44, and a plurality of third electrode pads 45 are formed on the chip front surface 41 of the second chip 40. The first electrode pads 43, the second electrode pads 44, and the third electrode pads 45 are electrically connected to the secondary-side circuit 14.

The plurality of first electrode pads 43 are formed at an end closer to the transformer chip 50 of both ends of the chip front surface 41 in the X direction. The plurality of first electrode pads 43 are arranged to be spaced apart from each other in the Y direction. The plurality of second electrode pads 44 are formed at an end closer to the second lead 72 of both ends of the chip front surface 41 in the X direction. The plurality of second electrode pads 44 are arranged to be spaced apart from each other in the Y direction. The plurality of third electrode pads 45 are arranged in a distributed manner at both ends of the chip front surface 41 in the Y direction.

As shown in FIG. 3, the second chip 40 includes a substrate 46 on which the secondary-side circuit 14 is formed. The substrate 46 is, for example, a semiconductor substrate. An example of the semiconductor substrate is a substrate formed of a material containing Si. A wiring layer 47 is formed on the substrate 46. The substrate 46 constitutes the chip back surface 42, and the wiring layer 47 constitutes the chip front surface 41.

The wiring layer 47 includes, for example, a plurality of insulating films stacked in the Z direction and a metal layer buried in the insulating films. The metal layer constitutes a wiring pattern of the second chip 40. The metal layer electrically connects, for example, the secondary-side circuit 14 and each of the electrode pads 43 to 45. That is, each of the electrode pads 43 to 45 is electrically connected to the secondary-side circuit 14 via the wiring layer 47. The metal layer is formed of a material containing one or more appropriately selected from the group consisting of, for example, Ti, TiN, Au, Ag, Cu, Al, and W.

In the first embodiment, the transformer chip 50 is a single chip including the transformers 15A and 15B shown in FIG. 1. That is, the transformer chip 50 is a chip dedicated to the transformers 15A and 15B, which is different from the first chip 30 and the second chip 40.

As shown in FIG. 3, the transformer chip 50 is formed in a convex shape when viewed from the Y direction. The transformer chip 50 has a first chip front surface 51, a second chip front surface 52, and a chip back surface 53 facing opposite to these chip front surfaces 51 and 52. The chip back surface 53 of the transformer chip 50 is bonded to the first die pad 61 by a conductive bonding material SD. The second chip front surface 52 is located on the opposite side of the first die pad 61 with respect to the first chip front surface 51 in the Z direction. In other words, the first chip front surface 51 is located to be closer to the first die pad 61 than the second chip front surface 52 in the Z direction.

As shown in FIGS. 2 and 3, a plurality of first electrode pads 54 is formed on the first chip front surface 51 of the transformer chip 50. The plurality of first electrode pads 54 are formed at an end closer to the first chip 30 of both ends of the first chip front surface 51 in the X direction. The plurality of first electrode pads 54 are arranged to be spaced apart from each other in the Y direction. A plurality of second electrode pads 55 are formed on the second chip front surface 52 of the transformer chip 50. The plurality of second electrode pads 55 are arranged to be spaced apart from each other in the X direction and the Y direction.

In order to set the dielectric breakdown voltage of the signal transmission device 10 to a preset dielectric breakdown voltage, it is necessary to separate the first die pad 61 and the second die pad 71 to which the respective lead frames 60 and 70 are closest, from each other. Therefore, in a plan view, a distance between the transformer chip 50 and the second chip 40 in the X direction is larger than a distance between the transformer chip 50 and the first chip 30 in the X direction. On the other hand, since the transformer chip 50 and the first chip 30 are arranged on the first die pad 61, they may be placed to be close to each other. Therefore, it can be said that the transformer chip 50 is arranged to be closer to the first chip 30 than the second chip 40.

A plurality of wires W1 to W4 are connected to each of the first chip 30, the transformer chip 50, and the second chip 40. Each of the wires W1 to W4 is a bonding wire formed by a wire bonding device and is formed of a conductor containing, for example, Au, Al, Cu, or the like.

The first chip 30 is electrically connected to the first lead frame 60 via the wires W1. More specifically, the plurality of first electrode pads 33 and the plurality of third electrode pads 35 of the first chip 30 are individually electrically connected to the plurality of first leads 62 via the wires W1.

The plurality of third electrode pads 35 are individually electrically connected to the pair of first leads 62, which are integrated with the first die pad 61 among the plurality of first leads 62, via the wires W1. As a result, the primary-side circuit 13 and the plurality of first leads 62 (the primary-side terminals 11) are electrically connected to each other. In the example of FIG. 2, the pair of first leads 62 integrated with the first die pad 61 constitute a ground terminal, and the primary-side circuit 13 and the first die pad 61 are electrically connected to each other via the wires W1. Therefore, the first die pad 61 has the same potential as the ground GND1 of the primary-side circuit 13.

The second chip 40 is electrically connected to the second lead frame 70 via the wires W4. More specifically, the plurality of second electrode pads 44 and the plurality of third electrode pads 45 of the second chip 40 are individually electrically connected to the plurality of second leads 72 via the wires W4. The plurality of third electrode pads 45 are individually electrically connected to the pair of second leads 72, which are integrated with the second die pad 71 among the plurality of second leads 72, via the wires W4. As a result, the secondary-side circuit 14 and the plurality of second leads 72 (the secondary-side terminals 12) are electrically connected to each other. In the example of FIG. 2, the pair of second leads 72 integrated with the second die pad 71 constitute a ground terminal, and the secondary-side circuit 14 and the second die pad 71 are electrically connected to each other via the wires W4. Therefore, the second die pad 71 has the same potential as the ground GND2 of the secondary-side circuit 14.

The transformer chip 50 is electrically connected to the first chip 30 via the wires W2. Further, the transformer chip 50 is electrically connected to the second chip 40 via the wires W3. More specifically, the plurality of first electrode pads 54 of the transformer chip 50 are individually electrically connected to the plurality of second electrode pads 34 of the first chip 30 via the wires W2. The plurality of second electrode pads 55 of the transformer chip 50 are individually electrically connected to the plurality of first electrode pads 33 of the second chip 40 via the wires W3.

The first coils 21 (see FIG. 3) of the transformers 15A and 15B are electrically connected to the ground GND1 of the primary-side circuit 13 via the wires W2, the first chip 30, and the like. The second coils 22 (see FIG. 3) of the transformers 15A and 15B are electrically connected to the ground GND2 of the secondary-side circuit 14 via the wires W3, the second chip 40, and the like.

[Configuration of Transformer Chip]

An exemplary configuration of the transformer chip 50 will be described with reference to FIGS. 3 to 11. As shown in FIG. 3, the transformer chip 50 includes a first unit 90 and a second unit 100 which is bonded to the first unit 90. In the following, configurations of the first unit 90 and the second unit 100 will be described, and a configuration of the transformer chip 50, which is a combination of the first unit 90 and the second unit 100, will also be described. The configurations of the first coil 21 and the second coil 22 of the transformer 15B are similar to the configurations of the first coil 21 and the second coil 22 of the transformer 15A. Therefore, in the following, the transformer 15A will be described, and a detailed description of the transformer 15B will be omitted.

(First Unit)

Figure 4:
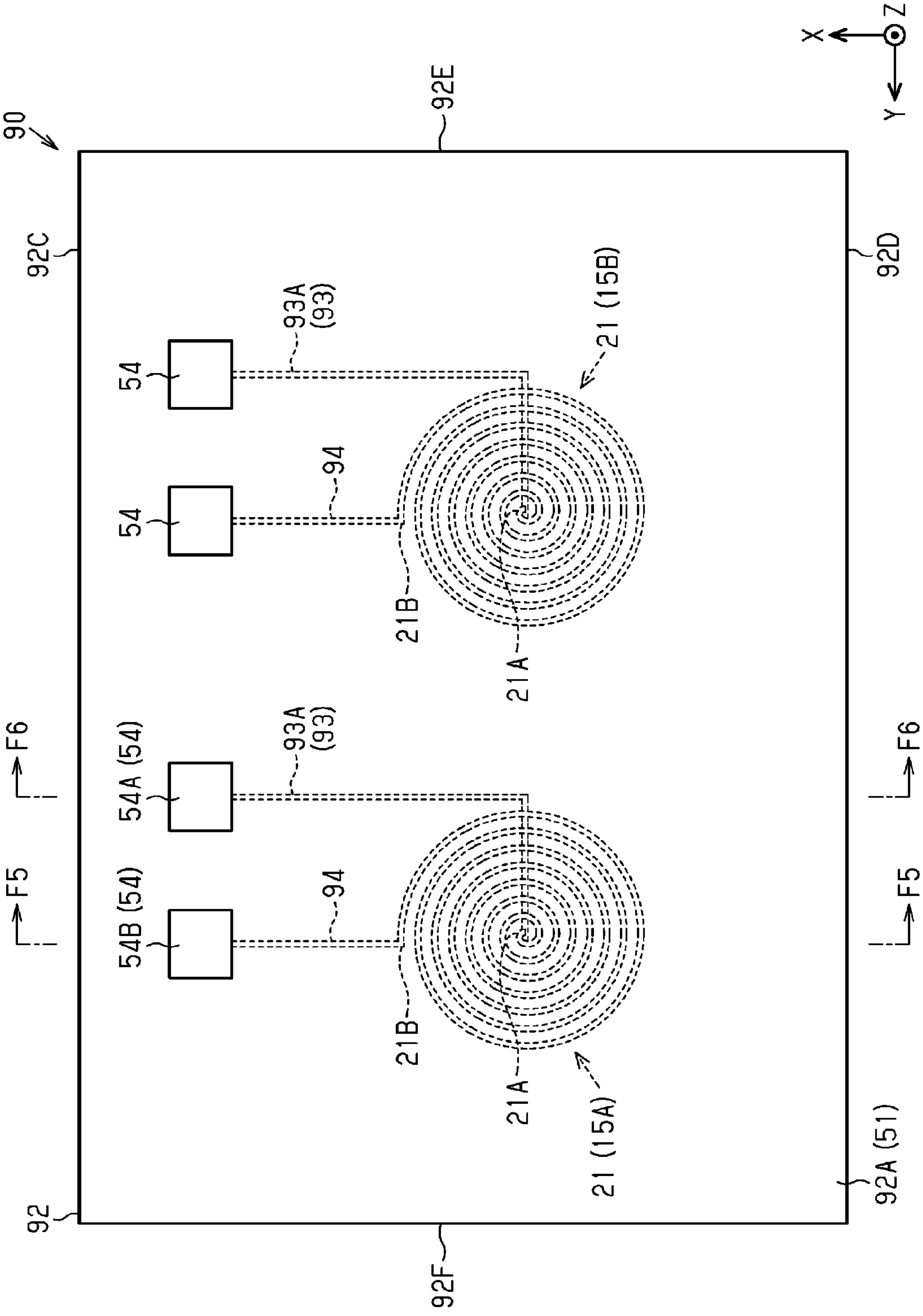
FIG. 4 is a schematic plan view schematically showing a first unit of an insulation chip in the signal transmission device.
Figure 5:
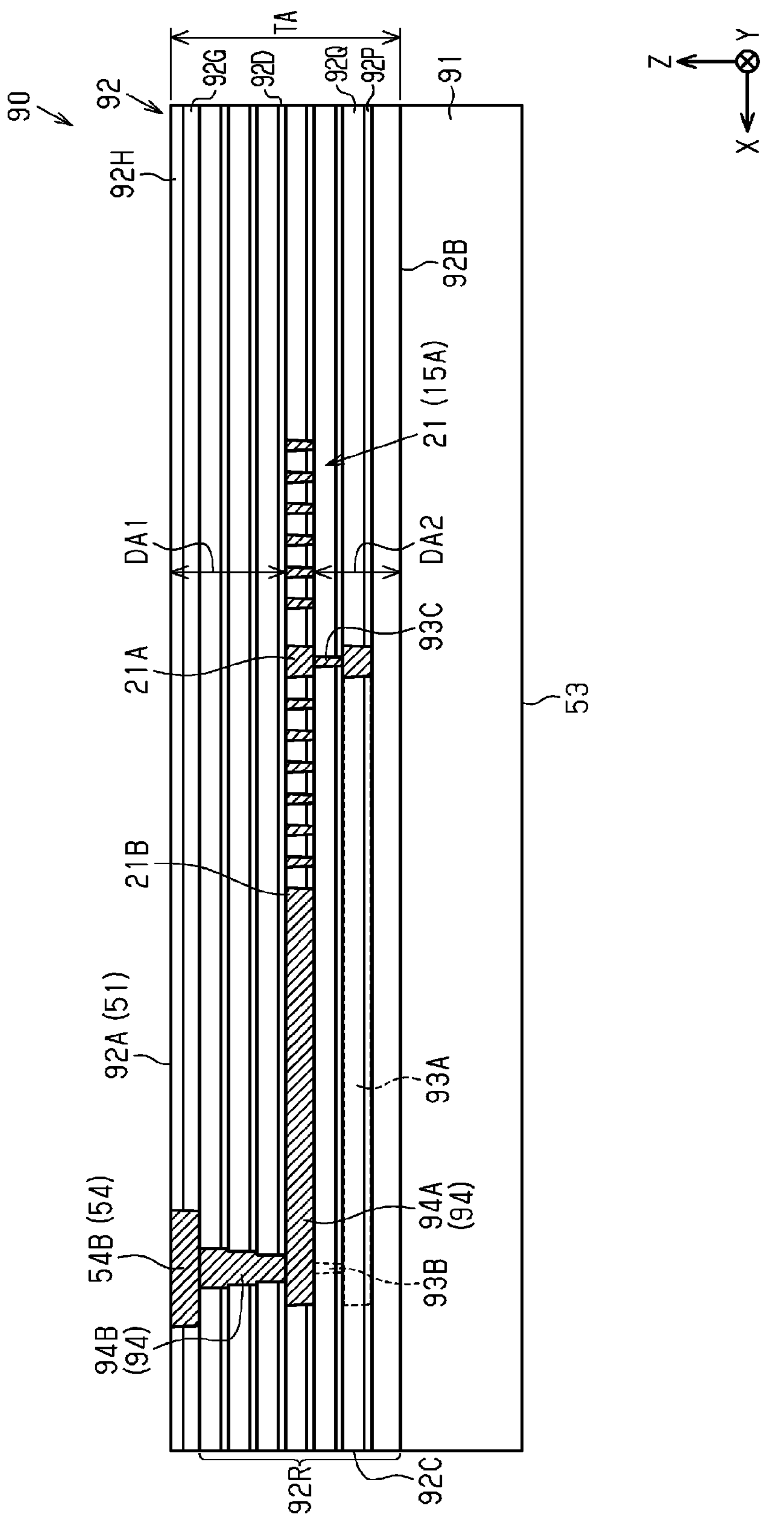
FIG. 5 is a schematic cross-sectional view of the first unit taken along line F5-F5 in FIG. 4.
Figure 6:
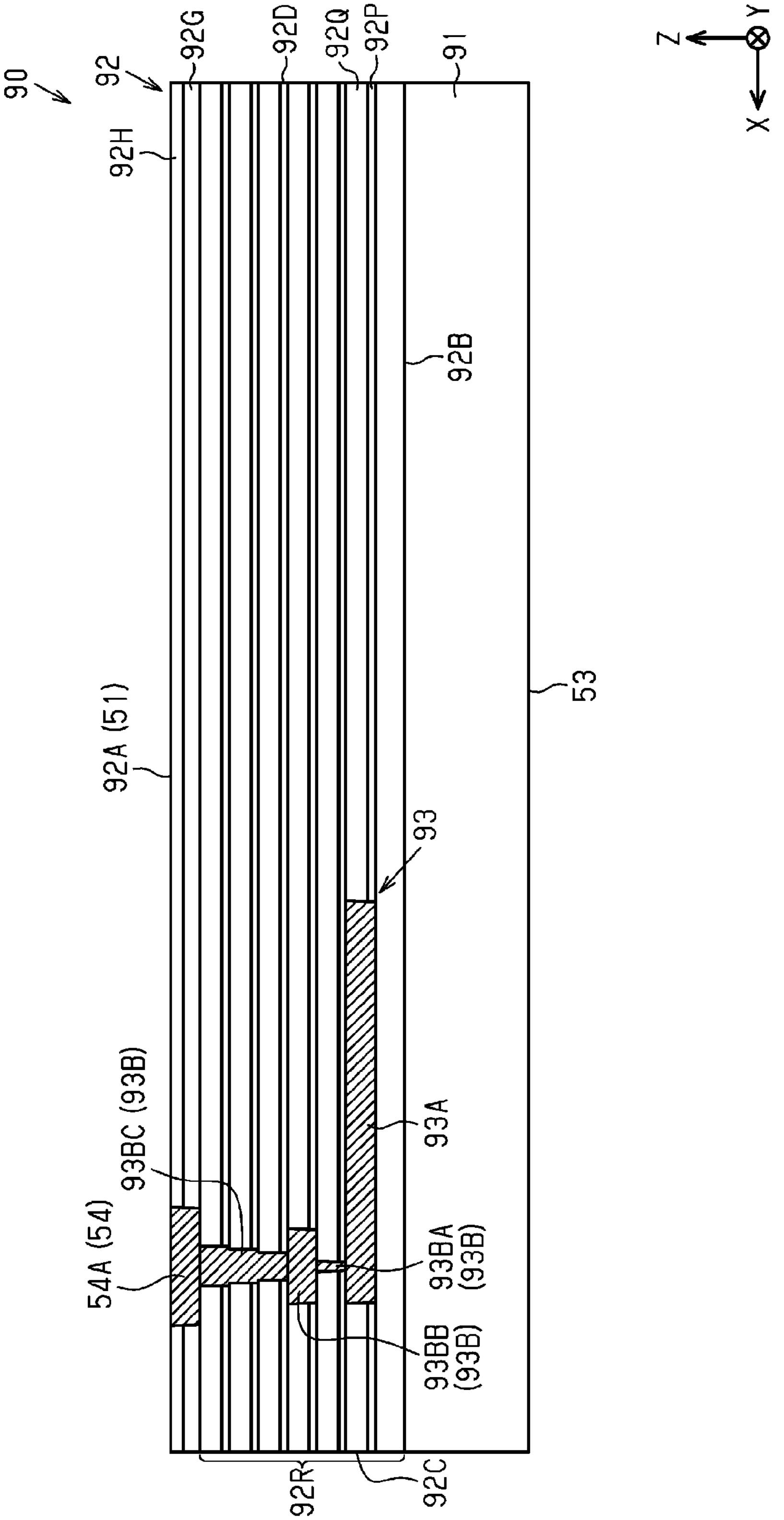
FIG. 6 is a schematic cross-sectional view of the first unit taken along line F6-F6 in FIG. 4.

The configuration of the first unit 90 will be described with reference to FIGS. 3 to 6. FIG. 4 shows a planar structure of the first unit 90 of the transformer chip 50. FIG. 5 shows a cross-sectional structure of the first unit 90 taken along line F5-F5 in FIG. 4, mainly showing a cross-sectional structure of the first coil 21 of the transformer 15A. FIG. 6 shows a cross-sectional structure of the first unit 90 taken along line F6-F6 in FIG. 4, mainly showing cross-sectional structures of the first electrode pad 54 and a first connecting portion 93 which will be described later.

As shown in FIG. 3, the first unit 90 is a unit in the transformer chip 50 that is bonded to the first die pad 61 by the conductive bonding material SD. The first unit 90 includes a first semiconductor substrate 91 and a first element insulating layer 92 formed on the first semiconductor substrate 91.

The first semiconductor substrate 91 constitutes the chip back surface 53 of the transformer chip 50. The first semiconductor substrate 91 is formed in a rectangular plate shape whose thickness direction is the Z direction. The first semiconductor substrate 91 is formed of, for example, a material containing Si. In the first embodiment, the first semiconductor substrate 91 is a Si substrate. A wide band gap semiconductor or a compound semiconductor may be used as the first semiconductor substrate 91. The wide band gap semiconductor is a semiconductor substrate having a band gap of 2.0 eV or more. The wide band gap semiconductor may be SiC (silicon carbide). The compound semiconductor may be a Group III-V compound semiconductor. The compound semiconductor may include at least one selected from the group consisting of AlN (aluminum nitride), InN (indium nitride), GaN (gallium nitride), and GaAs (gallium arsenide).

As shown in FIG. 4, the first element insulating layer 92 is formed in a rectangular shape in which the X direction is the lateral direction and the Y direction is the longitudinal direction in a plan view. The first element insulating layer 92 includes four first element side-surfaces 92C to 92F. The first element side-surfaces 92C and 92D constitute both end surfaces of the first element insulating layer 92 in the X direction. The first element side-surfaces 92E and 92F constitute both end surfaces of the first element insulating layer 92 in the Y direction. In the X direction, the first element side-surface 92C is a side-surface closer to the resin-side surface 81 of the sealing resin 80 in FIG. 2, and the first element side-surface 92D is a side-surface closer to the resin-side surface 82. In the Y direction, the first element side-surface 92E is a side-surface closer to the resin-side surface 83 of the sealing resin 80, and the first element side-surface 92F is a side-surface closer to the resin-side surface 84.

The first unit 90 includes the first coils 21 of the transformers 15A and 15B. More specifically, the first coils 21 of the transformers 15A and 15B are provided in the first element insulating layer 92. These first coils 21 are arranged at the same position in the X direction and spaced apart from each other in the Y direction. The first coil 21 of the transformer 15A is arranged to be closer to the first element side-surface 92F than the first coil 21 of the transformer 15B. Further, these first coils 21 are arranged to be closer to the first element side-surface 92C than the center of the first element insulating layer 92 in the X direction. More specifically, the center of the first coil 21 in the X direction is located to be closer to the first element side-surface 92C than the center of the first element insulating layer 92 in the X direction.

The first unit 90 includes a plurality of electrode pads 54. Each first electrode pad 54 is arranged to be closer to the first element side-surface 92C than the first coil 21 in the X direction. In the example shown in FIG. 4, four first electrode pads 54 are provided. More specifically, two first electrode pads 54 are provided to correspond to the first coil 21 of the transformer 15A, and two first electrode pads 54 are provided to correspond to the first coil 21 of the transformer 15B.

One of the two first electrode pads 54 corresponding to the first coil 21 of the transformer 15A is arranged at the same position as the first coil 21 in the Y direction. The other of the two first electrode pads 54 is arranged to be closer to the first element side-surface 92E than the first coil 21 in the Y direction.

One of the two first electrode pads 54 corresponding to the first coil 21 of the transformer 15B is arranged at the same position as the first coil 21 in the Y direction. The other of the two first electrode pads 54 is arranged to be closer to the first element side-surface 92E than the first coil 21 in the Y direction. The arrangement positions of the first electrode pads 54 in the Y direction may be changed arbitrarily. Further, the numbers of first electrode pads 54 and second electrode pads 55 are not limited to the example shown in FIG. 4, and may be changed arbitrarily.

As shown in FIG. 5, the first element insulating layer 92 includes a plurality of first insulating films 92P and a plurality of second insulating films 92Q. The plurality of first insulating films 92P and the plurality of second insulating films 92Q are alternately stacked one by one in the Z direction. Therefore, it can be said that the Z direction is the thickness direction of the first element insulating layer 92.

Each of the first insulating films 92P is an etching stopper film and is formed of, for example, a material containing at least one selected from the group consisting of SiN (silicon nitride), SiC, and SiCN (nitrogen-doped silicon carbide). Further, the first insulating film 92P may have a function of preventing diffusion of Cu, for example. That is, the first insulating film 92P may be a Cu diffusion prevention film.

Each of the second insulating films 92Q is an interlayer insulating film and is, for example, an oxide film formed of a material containing $SiO_2$ (silicon oxide). The second insulating film 92Q has a thicker thickness than the first insulating film 92P. The first insulating film 92P has a thickness of, for example, 50 nm or more and less than 1,000 nm. The second insulating film 92Q has a thickness of, for example, 500 nm or more and 5,000 nm or less. In the first embodiment, the first insulating film 92P has a thickness of about 300 nm, and the second insulating film 92Q has a thickness of about 2,000 nm. In order to easily understand the drawings, a ratio between the film thickness of the first insulating film 92P and the film thickness of the second insulating film 92Q in the drawings is different from a ratio between an actual film thickness of the first insulating film 92P and an actual film thickness of the second insulating film 92Q.

The first element insulating layer 92 has a first element front surface 92A and a first element back surface 92B facing opposite to each other in the Z direction. The first element front surface 92A faces the same side as the first chip front surface 51 and the second chip front surface 52 (both see FIG. 3) of the transformer chip 50. The first element front surface 92A constitutes the first chip front surface 51, for example. The first element back surface 92B faces the same side as the chip back surface 53 (see FIG. 3) of the transformer chip 50. The first element back surface 92B is in contact with the first semiconductor substrate 91. In one example, the first element back surface 92B is constituted with the second insulating film 92Q.

The first element insulating layer 92 includes a protective layer 92G and a passivation layer 92H which are formed on the first element front surface 92A side. The protective layer 92G is a film that protects an insulator 92R which is a laminate of the plurality of first insulating films 92P and the plurality of second insulating films 92Q. The protective layer 92G is formed on the insulator 92R. The protective layer 92G is formed of a material containing, for example, $SiO_2$. In one example, the protective layer 92G is formed over the entire surface of the insulator 92R in a plan view.

The passivation layer 92H is a surface protection film of the first unit 90. The passivation layer 92H is formed on the protective layer 92G. The passivation layer 92H is formed of a material containing at least one selected from the group consisting of, for example, SiN and $SiO_2$. In one example, the passivation layer 92H is formed of a material containing $SiO_2$. In one example, the passivation layer 92H is formed over the entire surface of the protective layer 92G in a plan view.

The first electrode pad 54 is formed to be flush with the first element front surface 92A of the first element insulating layer 92. In one example, the first electrode pad 54 is provided on the insulator 92R and are covered with the protective layer 92G and the passivation layer 92H. On the other hand, the first electrode pad 54 is formed to be flush with the passivation layer 92H. Therefore, the first electrode pad 54 is provided on the first element insulating layer 92 so as to be exposed from the first element front surface 92A of the first element insulating layer 92.

The first coil 21 is buried in the first element insulating layer 92 at a position spaced apart from the first element front surface 92A of the first element insulating layer 92 in the Z direction. Further, the first coil 21 is arranged at a position spaced apart from the first element back surface 92B in the Z direction. That is, the first coil 21 is not exposed from the first element insulating layer 92. In the example shown in FIG. 5, the first coil 21 is arranged to be closer to the first element back surface 92B than the first element front surface 92A of the first element insulating layer 92 in the Z direction. In other words, a distance DA1 between the first coil 21 and the first element front surface 92A in the Z direction is larger than a distance DA2 between the first coil 21 and the first element back surface 92B in the Z direction. It can also be said that the first coil 21 is arranged to be closer to the first semiconductor substrate 91 than the first element front surface 92A in the Z direction. In one example, the distance DA1 may be three times or less than the distance DA2. In one example, the distance DA1 may be twice or less than the distance DA2. The distances DA1 and DA2 may be changed arbitrarily. In one example, the distance DA1 may be larger than twice the distance DA2.

As shown in FIG. 4, the first coil 21 is formed in a spiral shape in a plan view. The first coil 21 includes a first end portion 21A and a second end portion 21B. The first end portion 21A constitutes an inner end of a winding portion of the first coil 21 in a plan view. The second end portion 21B constitutes an outer end of the winding portion of the first coil 21 in a plan view. The number of turns of the first coil 21 may be arbitrarily changed depending on electrical characteristics of the transformer chip 50.

The first coil 21 is made of a material including one or more appropriately selected from the group consisting of, for example, Ti, TiN, Au, Ag, Cu, Al, and W. In one example, the first coil 21 is formed of a material containing Cu.

The first unit 90 includes a first connecting portion 93 connected to the first end portion 21A of the first coil 21 and a second connecting portion 94 connected to the second end portion 21B of the first coil 21. In the following description, the two first electrode pads 54 corresponding to the transformer 15A shown in FIG. 4 are referred to as a "first electrode pad 54A" and a "first electrode pad 54B."

As shown in FIG. 4, the first connecting portion 93 is connected to the first electrode pad 54A. That is, the first connecting portion 93 electrically connects the first end portion 21A of the first coil 21 and the first electrode pad 54A. The first connecting portion 93 is buried in the first element insulating layer 92. That is, the first coil 21 and the first electrode pad 54A are electrically connected to each other within the first element insulating layer 92.

As shown in FIGS. 4 to 6, the first connecting portion 93 includes a first wiring layer 93A, a first connection wiring 93B, and a via 93C. As shown in FIGS. 5 and 6, the first wiring layer 93A is arranged to be closer to the first element back surface 92B than the first coil 21 in the Z direction. It can be said that the first wiring layer 93A is arranged between the first coil 21 and the first element back surface 92B in the Z direction. As shown in FIG. 4, the first wiring layer 93A includes a first portion extending in the Y direction from the first end portion 21A of the first coil 21 in a plan view, and a second portion extending in the X direction from the first portion toward the first electrode pad 54A. In one example, the first portion and the second portion are integrated. The second portion is arranged outward from the winding portion of the first coil 21 in the X direction.

As shown in FIG. 6, the first connection wiring 93B electrically connects the first wiring layer 93A and the first electrode pad 54A. The first connection wiring 93B is provided at a position overlapping both the first electrode pad 54A and the first wiring layer 93A in a plan view. The first connection wiring 93B is formed as a via extending in the Z direction. In the example shown in FIG. 6, the first connection wiring 93B includes a first via 93BA, an intermediate wiring layer 93BB, and a second via 93BC. The first via 93BA is connected to the first wiring layer 93A. The intermediate wiring layer 93BB is formed on the first via 93BA. The intermediate wiring layer 93BB is connected to the first via 93BA. The second via 93BC is formed on the intermediate wiring layer 93BB. The second via 93BC connects the first electrode pad 54A and the intermediate wiring layer 93BB. A length of the second via 93BC in the Z direction is longer than a length of the first via 93BA in the Z direction.

As shown in FIG. 5, the via 93C electrically connects the first wiring layer 93A and the first end portion 21A of the first coil 21. The via 93C is arranged at a position overlapping both the first end portion 21A of the first coil 21 and the first wiring layer 93A in a plan view. The first wiring layer 93A, the first connection wiring 93B, and the via 93C are made of a material containing one or more appropriately selected from the group consisting of, for example, Ti, TiN, Au, Ag, Cu, Al, and W. In one example, the first wiring layer 93A may be formed of the same material as the first coil 21. In one example, the first connection wiring 93B and the via 93C may be formed of a different material from the first coil 21.

As shown in FIG. 4, the second connecting portion 94 is connected to the first electrode pad 54B. That is, the second connecting portion 94 electrically connects the second end portion 21B of the first coil 21 and the first electrode pad 54B. The second connecting portion 94 is buried in the first element insulating layer 92. That is, the first coil 21 and the first electrode pad 54B are electrically connected to each other within the first element insulating layer 92.

As shown in FIGS. 4 and 5, the second connecting portion 94 includes a second wiring layer 94A and a second connection wiring 94B. The second wiring layer 94A is arranged at the same position as the first coil 21 in the Z direction. That is, the second wiring layer 94A is arranged to be closer to the first element front surface 92A than the first wiring layer 93A. The second wiring layer 94A extends in the X direction from the second end portion 21B of the first coil 21 toward the first electrode pad 54B in a plan view.

The position of the second wiring layer 94A in the Z direction may be changed arbitrarily. In one example, the second wiring layer 94A may be arranged at the same position as the first wiring layer 93A in the Z direction. That is, the second wiring layer 94A may be arranged to be closer to the first element back surface 92B than the first coil 21 in the Z direction.

The second connection wiring 94B electrically connects the second wiring layer 94A and the first electrode pad 54B. The second connection wiring 94B is provided at a position overlapping both the first electrode pad 54B and the second wiring layer 94A in a plan view. The second connection wiring 94B is formed as a via extending in the Z direction. The second wiring layer 94A and the second connection wiring 94B are made of a material containing one or more appropriately selected from the group consisting of, for example, Ti, TiN, Au, Ag, Cu, Al, and W. In one example, the second wiring layer 94A may be formed of the same material as the first coil 21. In one example, the second connection wiring 94B may be formed of a different material from the first coil 21.

Here, in the present disclosure, both the first wiring layer 93A of the first connecting portion 93 and the second wiring layer 94A of the second connecting portion 94 correspond to a "wiring layer of the first unit." Both the first connection wiring 93B of the first connecting portion 93 and the second connection wiring 94B of the second connecting portion 94 correspond to a "connection wiring of the first unit."

(Second Unit)

Figure 7:
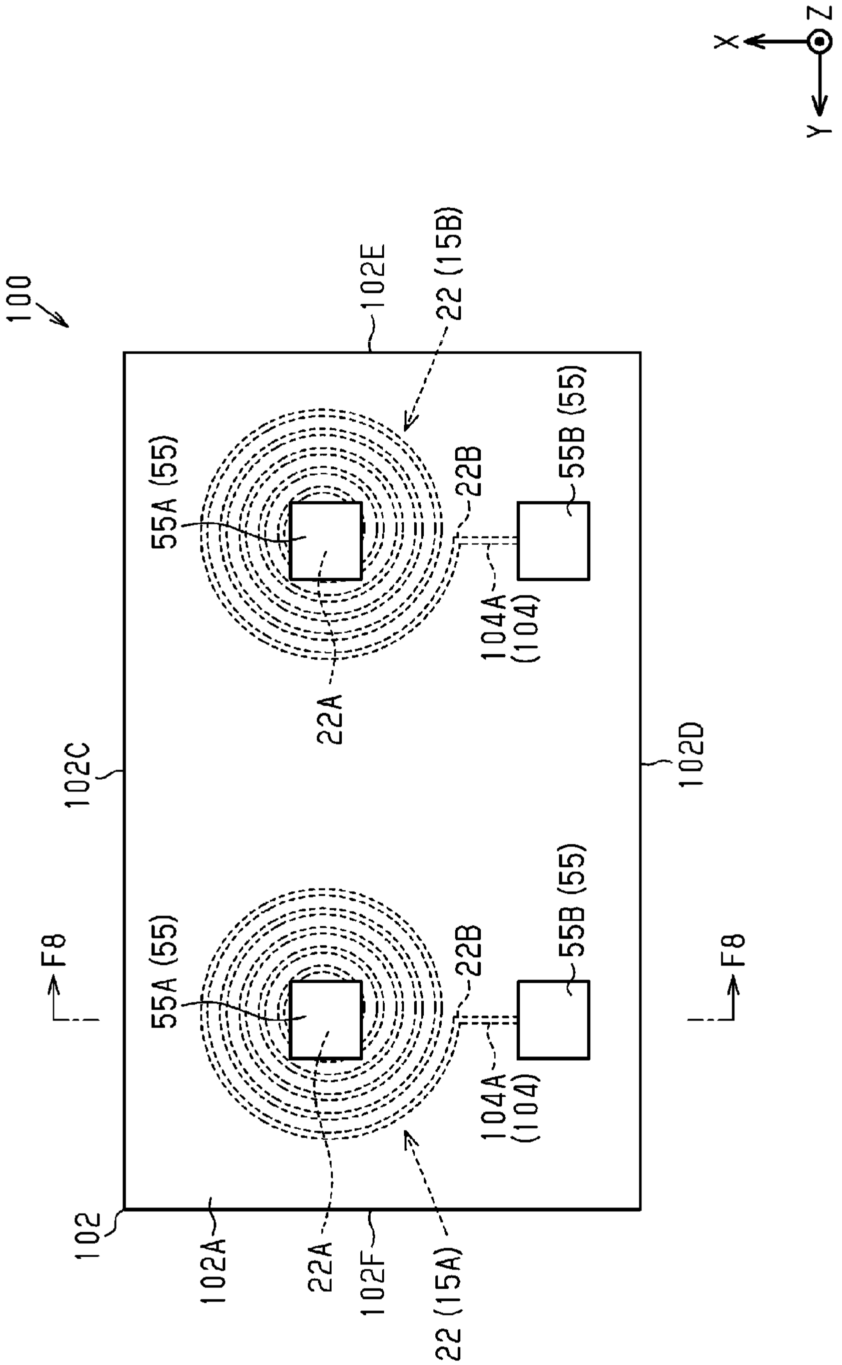
FIG. 7 is a schematic plan view schematically showing a second unit of the insulation chip in the signal transmission device.
Figure 8:
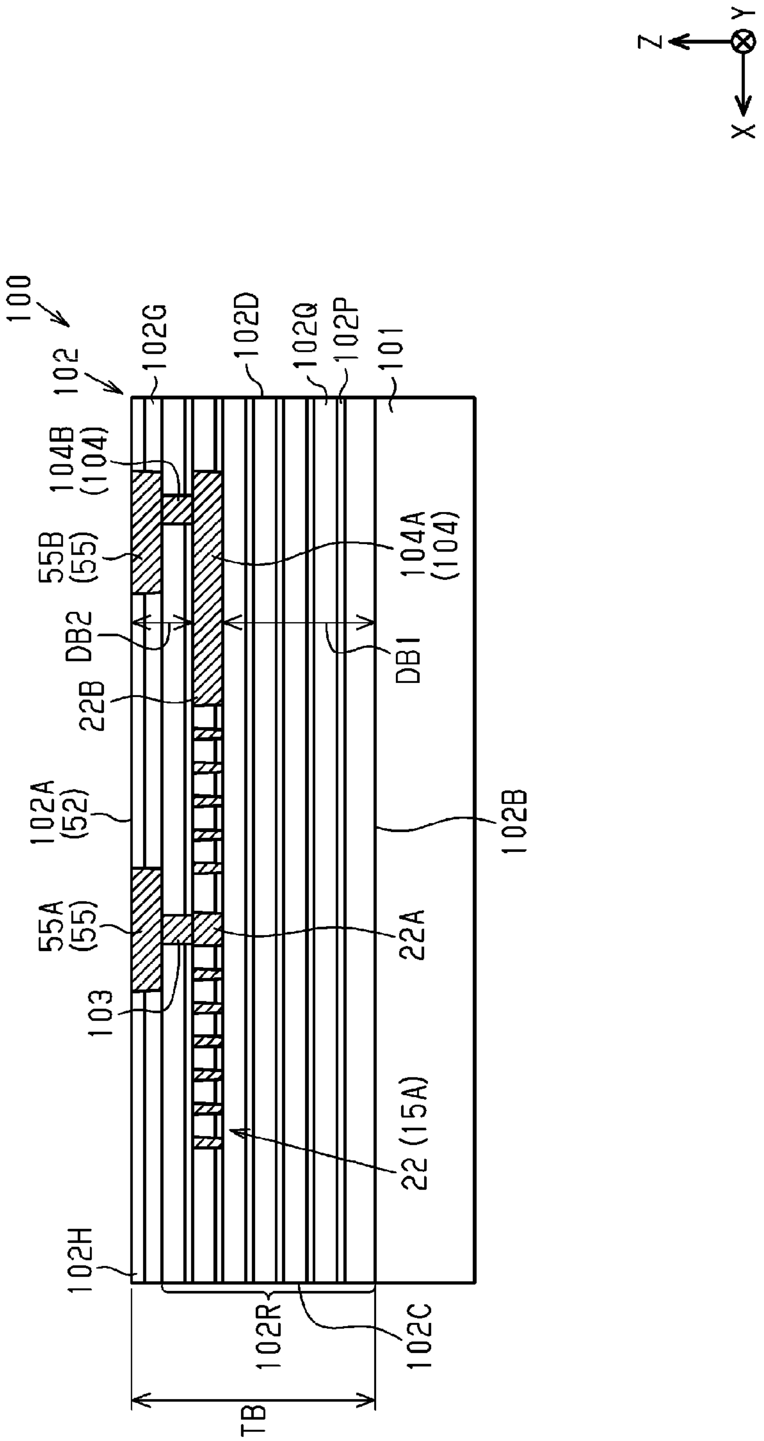
FIG. 8 is a schematic cross-sectional view of the second unit taken along line F8-F8 in FIG. 7.

A configuration of the second unit 100 will be described with reference to FIGS. 3, 7, and 8. FIG. 7 shows a planar structure of the second unit 100 of the transformer chip 50. FIG. 8 shows a cross-sectional structure of the second unit 100 taken along line F8-F8 in FIG. 7, mainly showing a cross-sectional structure of the second coil 22 of the transformer 15A.

As shown in FIG. 3, the second unit 100 is a unit in the transformer chip 50 that is arranged on the opposite side of the first die pad 61 with respect to the first unit 90 in the Z direction. The second unit 100 includes a second semiconductor substrate 101 and a second element insulating layer 102 formed on the second semiconductor substrate 101.

The second semiconductor substrate 101 is formed in a rectangular plate shape whose thickness direction is the Z direction. Like the first semiconductor substrate 91, the second semiconductor substrate 101 is a semiconductor substrate formed of, for example, a material containing Si. In the first embodiment, the second semiconductor substrate 101 is a Si substrate. Further, a wide band gap semiconductor or a compound semiconductor may be used as the second semiconductor substrate 101.

The second element insulating layer 102 is arranged on the opposite side of the first unit 90 with respect to the second semiconductor substrate 101 in the Z direction. The second element insulating layer 102 constitutes the second chip front surface 52.

As shown in FIG. 7, the second element insulating layer 102 is formed in a rectangular shape in which the X direction is the lateral direction and the Y direction is the longitudinal direction in a plan view. The second element insulating layer 102 includes four second element side-surfaces 102C to 102F. The second element side-surfaces 102C and 102D constitute both end surfaces of the second element insulating layer 102 in the X direction. The second element side-surfaces 102E and 102F constitute both end surfaces of the second element insulating layer 102 in the Y direction. In the X direction, the second element side-surface 102C is a side-surface closer to the resin-side surface 81 of the sealing resin 80 in FIG. 2, and the second element side-surface 102D is a side-surface closer to the resin-side surface 82. In the Y direction, the second element side-surface 102E is a side-surface closer to the resin-side surface 83 of the sealing resin 80, and the second element side-surface 102F is a side-surface closer to the resin-side surface 84.

The second unit 100 includes the second coils 22 of the transformers 15A and 15B. More specifically, the second coils 22 of the transformers 15A and 15B are provided in the second element insulating layer 102.

The second coil 22 of the transformer 15A and the second coil 22 of the transformer 15B are arranged at the same position in the X direction and spaced apart from each other in the Y direction. The second coil 22 of the transformer 15A is arranged to be closer to the second element side-surface 102F than the second coil 22 of the transformer 15B. Further, these second coils 22 are arranged to be closer to the second element side-surface 102C than the center of the second element insulating layer 102 in the X direction. More specifically, the center of the second coil 22 in the X direction is located to be closer to the second element side-surface 102C than the center of the second element insulating layer 102 in the X direction.

As shown in FIG. 8, the second element insulating layer 102 includes a plurality of first insulating films 102P and a plurality of second insulating films 102Q. The plurality of first insulating films 102P and the plurality of second insulating films 102Q are alternately stacked one by one in the Z direction. Therefore, it can be said that the Z direction is the thickness direction of the second element insulating layer 102.

Each of the first insulating film 102P is an etching stopper film and is formed of, for example, a material containing at least one selected from the group consisting of SiN, SiC, and SiCN. Further, the first insulating film 102P may have a function of preventing diffusion of Cu, for example. That is, the first insulating film 102P may be a Cu diffusion prevention film.

Each of the second insulating films 102Q is an interlayer insulating film and is, for example, an oxide film formed of a material containing $SiO_2$. The second insulating film 102Q has a thicker thickness than the first insulating film 102P. In one example, the second insulating film 102Q may have the same thickness as the second insulating film 92Q (see FIG. 5) of the first element insulating layer 92. In one example, the first insulating film 102P may have the same thickness as the first insulating film 92P (see FIG. 5) of the first element insulating layer 92. The first insulating film 102P has a thickness of, for example, 50 nm or more and less than 1,000 nm. The second insulating film 102Q has a thickness of, for example, 500 nm or more and 5,000 nm or less. In the first embodiment, the first insulating film 102P has a thickness of about 300 nm, and the second insulating film 102Q has a thickness of about 2,000 nm. Further, in one example, the number of first insulating films 102P may be the same as the number of first insulating films 92P of the first element insulating layer 92. The number of second insulating films 102Q may be the same as the number of second insulating films 92Q of the first element insulating layer 92. As described above, the thickness of an insulator 102R, which is a laminate of the plurality of first insulating films 102P and the plurality of second insulating films 102Q, may be equal to the thickness of the insulator 92R (see FIG. 5). In order to easily understand the drawings, a ratio between the film thickness of the first insulating film 102P and the film thickness of the second insulating film 102Q in the drawings is different from a ratio between an actual film thickness of the first insulating film 102P and an actual film thickness of the second insulating film 102Q.

The second element insulating layer 102 has a second element front surface 102A and a second element back surface 102B facing opposite to each other in the Z direction. The second element front surface 102A constitutes the second chip front surface 52 of the transformer chip 50. The second element back surface 102B faces the same side as the first chip front surface 51 and the chip back surface 53 (both see FIG. 3) of the transformer chip 50. The second element back surface 102B is in contact with the second semiconductor substrate 101. In one example, the second element back surface 102B is constituted with the second insulating film 102Q.

The second element insulating layer 102 includes a protective layer 102G and a passivation layer 102H formed on the second element front surface 102A side. The protective layer 102G is a film that protects the insulator 102R. The protective layer 102G is formed on the insulator 102R. The protective layer 102G is formed of a material containing, for example, $SiO_2$. In one example, the protective layer 102G is formed over the entire surface of the insulator 102R in a plan view.

The passivation layer 102H is a surface protection film of the second unit 100. The passivation layer 102H is formed on the protective layer 102G. The passivation layer 102H is formed of a material containing at least one selected from the group consisting of, for example, SiN and $SiO_2$. The passivation layer 102H is formed of a material containing, for example, $SiO_2$. In one example, the passivation layer 102H is formed over the entire surface of the protective layer 102G in a plan view.

The second coil 22 is buried in the second element insulating layer 102 at a position spaced apart from the second element front surface 102A of the second element insulating layer 102 in the Z direction. Further, the second coil 22 is arranged at a position spaced apart from the second element back surface 102B in the Z direction. That is, the second coil 22 is not exposed from the second element insulating layer 102. In the example shown in FIG. 8, the second coil 22 is arranged to be closer to the second element front surface 102A than the second element back surface 102B of the second element insulating layer 102 in the Z direction. In other words, a distance DB1 between the second coil 22 and the second element back surface 102B in the Z direction is larger than a distance DB2 between the second coil 22 and the second element front surface 102A in the Z direction. In one example, the distance DB1 may be twice or more than the distance DB2. In one example, the distance DB1 may be three times or less than the distance DB2. A relationship between the distance DB1 and the distance DB2 may be changed arbitrarily. In one example, the distance DB1 may be larger than the distance DB2 and less than twice the distance DB2.

As shown in FIG. 7, the second coil 22 is formed in a spiral shape in a plan view. The second coil 22 includes a first end portion 22A and a second end portion 22B. The first end portion 22A constitutes an inner end of a winding portion of the second coil 22 in a plan view. The second end portion 22B constitutes an outer end of the winding portion of the second coil 22 in a plan view. The number of turns of the second coil 22 may be arbitrarily changed according to electrical characteristics of the transformer chip 50. The second coil 22 is made of a material containing one or more appropriately selected from the group consisting of, for example, Ti, TiN, Au, Ag, Cu, Al, and W. In one example, the second coil 22 is formed of a material containing Cu. That is, the second coil 22 may be formed of the same material as the first coil 21 (see FIG. 4). The material constituting the second coil 22 may be changed arbitrarily. In one example, the second coil 22 may be formed of a different material than the first coil 21.

The second unit 100 includes the plurality of second electrode pads 55. Four second electrode pads 55 are provided to correspond to the first electrode pads 54. More specifically, two second electrode pads 55 are provided for the second coil 22 of the transformer 15A, and two second electrode pads 55 are provided for the second coil 22 of the transformer 15B. Hereinafter, the two second electrode pads 55 corresponding to the second coil 22 of the transformer 15A may be referred to as a "second electrode pad 55A" and a "second electrode pad 55B" for the sake of convenience in description.

The second electrode pad 55A is arranged at a position overlapping the second coil 22 in a plan view. More specifically, the second electrode pad 55A is arranged at a position overlapping the first end portion 22A of the second coil 22 in a plan view.

The second electrode pad 55B is arranged at a different position from the second coil 22 in a plan view. More specifically, the second electrode pad 55B is arranged to be closer to the second element side-surface 102D than the second coil 22 in a plan view.

As shown in FIG. 8, each second electrode pad 55 is formed to be flush with the second element front surface 102A of the second element insulating layer 102. In one example, each second electrode pad 55 is provided on the insulator 102R and is covered with the protective layer 102G and the passivation layer 102H. On the other hand, each second electrode pad 55 is formed to be flush with the passivation layer 102H. Therefore, each second electrode pad 55 is provided on the second element insulating layer 102 so as to be exposed from the second element front surface 102A of the second element insulating layer 102.

The second unit 100 includes a first connecting portion 103 and a second connecting portion 104. The first connecting portion 103 and the second connecting portion 104 are provided within the second element insulating layer 102. The first connecting portion 103 and the second connecting portion 104 electrically connect the second coil 22 and the two second electrode pads 55 corresponding to the second coil 22. In this way, the second coil 22 and the two second electrode pads 55 are electrically connected to each other within the second element insulating layer 102.

The first connecting portion 103 electrically connects the first end portion 22A of the second coil 22 and the second electrode pad 55A. A first connecting portion 105 is provided at a position overlapping both the first end portion 22A and the first electrode pad 54A in a plan view. The first connecting portion 105 is a via extending in the Z direction so as to penetrate the second element insulating layer 102 from the first end portion 22A in the Z direction. The first connecting portion 105 is made of a material including one or more appropriately selected from the group of, for example, Ti, TiN, Au, Ag, Cu, Al, and W.

The second connecting portion 104 electrically connects the second end portion 22B of the second coil 22 and the second electrode pad 55B. The second connecting portion 104 includes a wiring layer 104A connected to the second end portion 22B, and a via 104B connecting the wiring layer 104A and the second electrode pad 55B.

The wiring layer 104A is arranged at the same position as the second coil 22 in the Z direction. The wiring layer 104A extends along the X direction from the second end portion 22B of the second coil 22 toward the second electrode pad 55B. The via 104B is provided at a position overlapping both the wiring layer 104A and the second electrode pad 55B in a plan view. The wiring layer 104A and the via 104B are made of a material containing one or more appropriately selected from the group of, for example, Ti, TiN, Au, Ag, Cu, Al, and W. In one example, the wiring layer 104A may be formed of the same material as the second coil 22. In one example, the via 104B may be formed of a different material than the second coil 22.

A position of the wiring layer 104A in the Z direction may be changed arbitrarily. In one example, the wiring layer 104A may be arranged to be closer to the second element front surface 102A than the second coil 22 in the Z direction.

Here, in the present disclosure, the wiring layer 104A of the second connecting portion 104 corresponds to a "wiring layer of the second unit." The via 104B of the second connecting portion 104 corresponds to a "connection wiring of the second unit."

(Transformer Chip)

Figure 9:
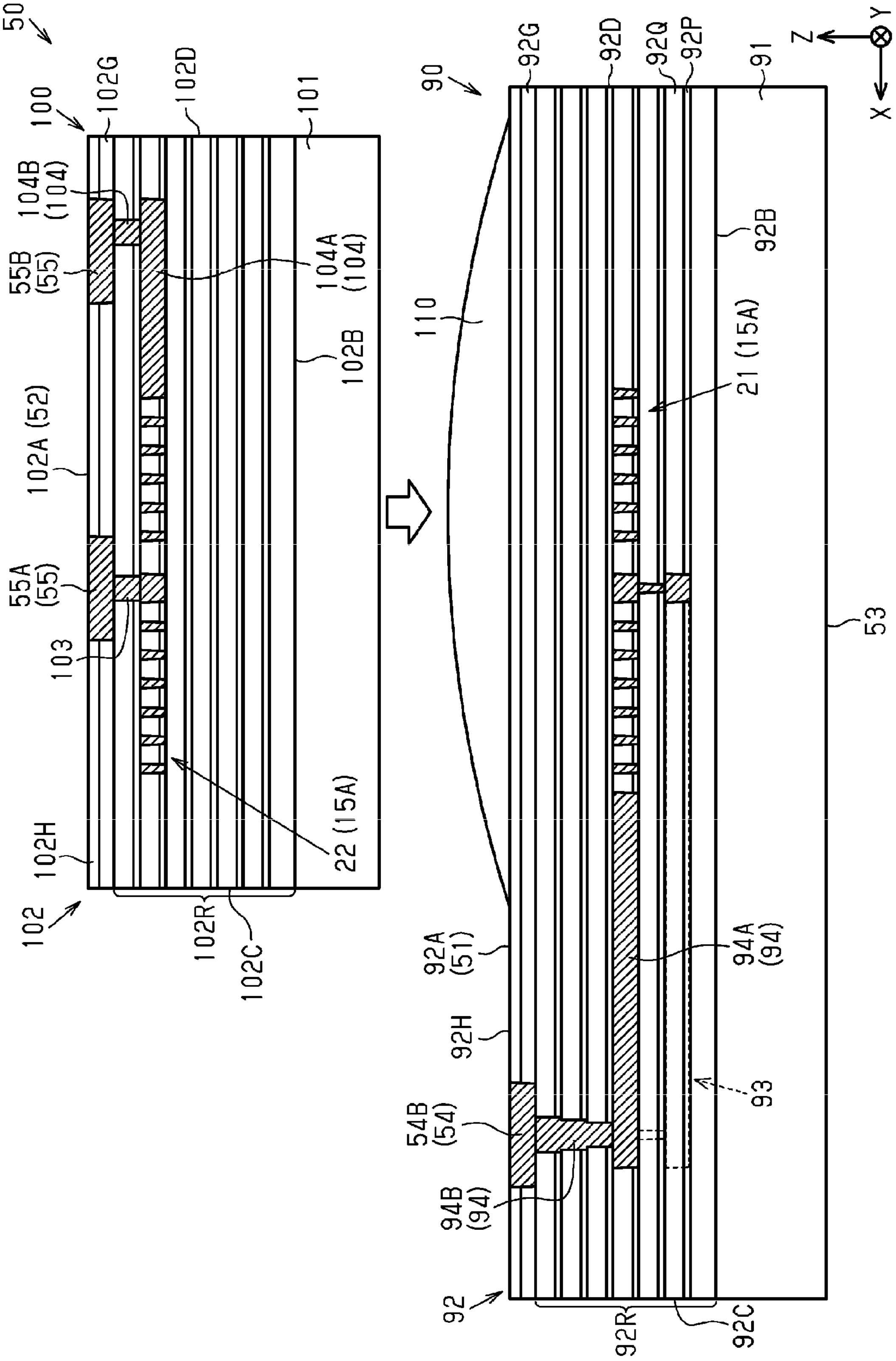
FIG. 9 is a schematic cross-sectional view illustrating a state in which the first unit and the second unit of the insulation chip are separated from each other.
Figure 10:
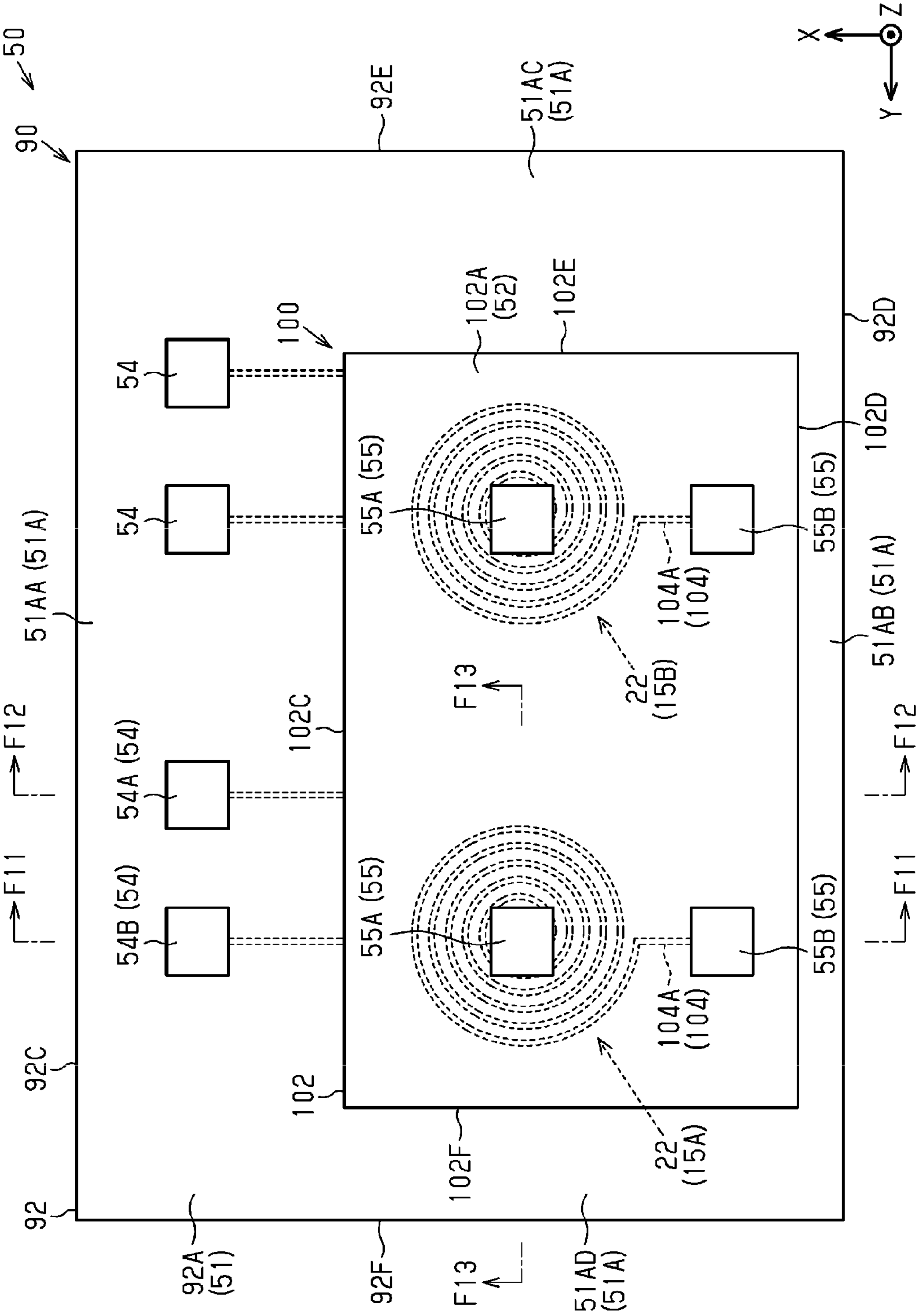
FIG. 10 is a schematic plan view schematically showing the insulation chip.
Figure 11:
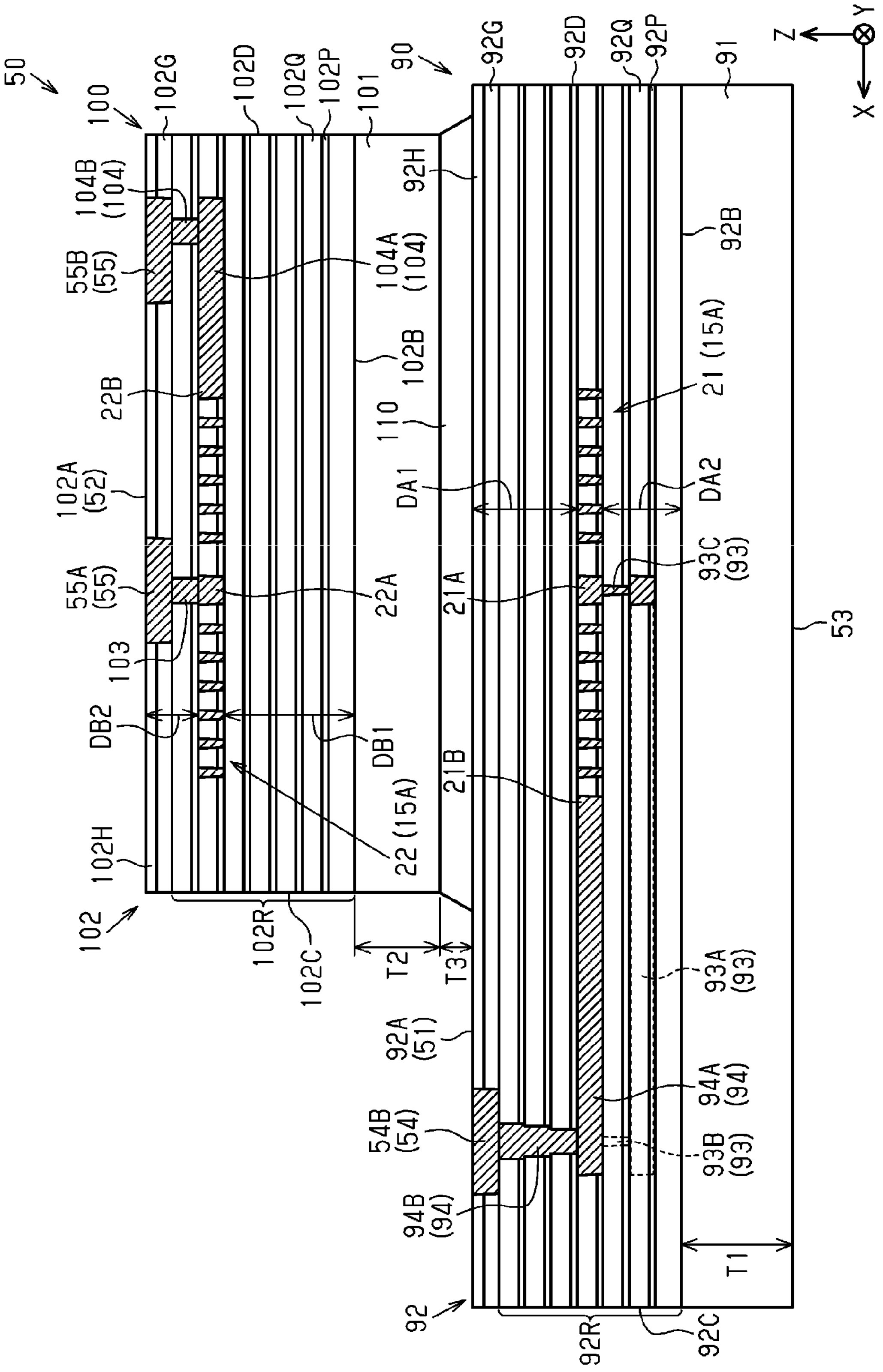
FIG. 11 is a schematic cross-sectional view of the insulation chip taken along line F11-F11 in FIG. 10.
Figure 12:
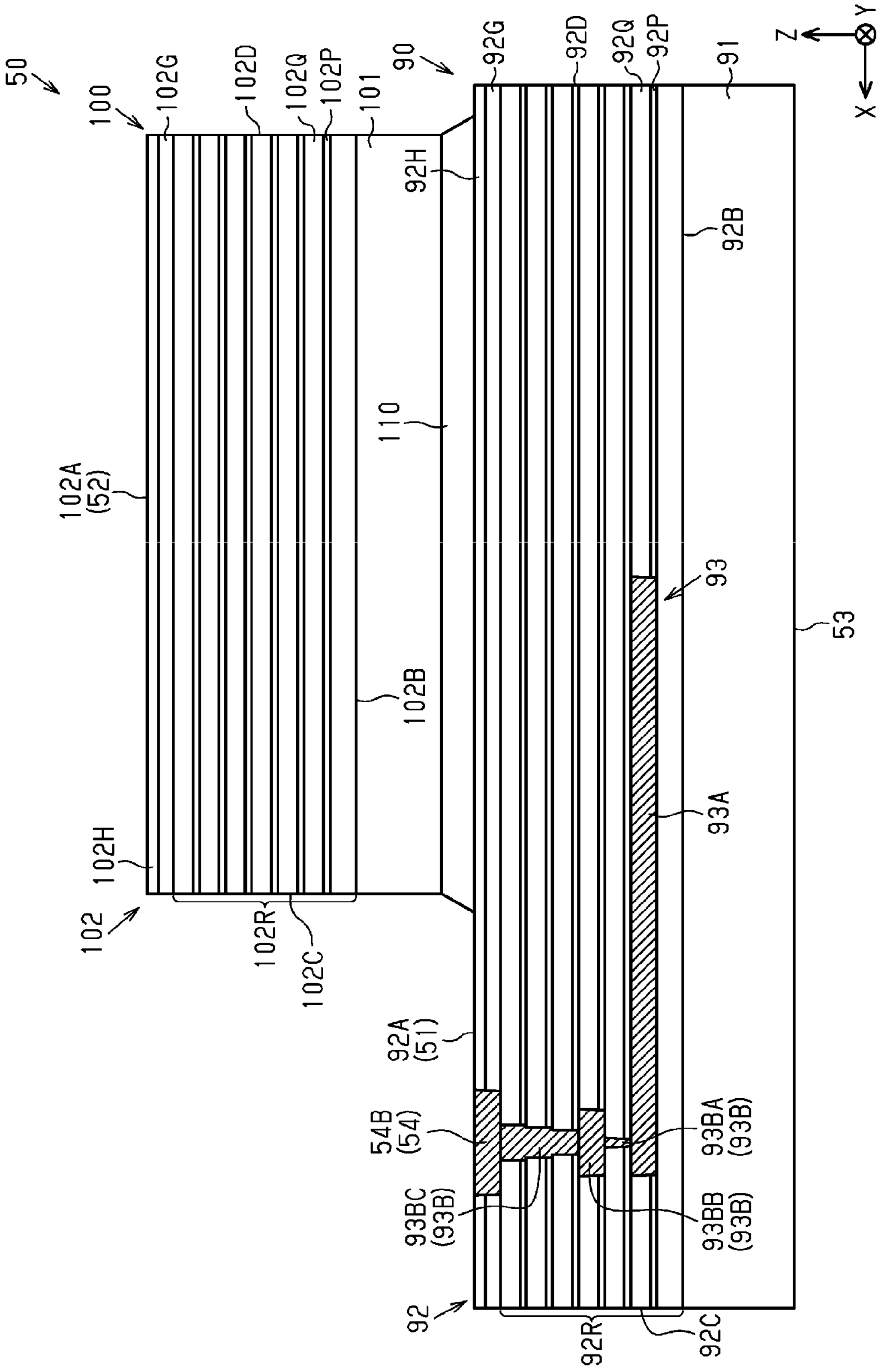
FIG. 12 is a schematic cross-sectional view of the insulation chip taken along line F12-F12 in FIG. 10.
Figure 13:
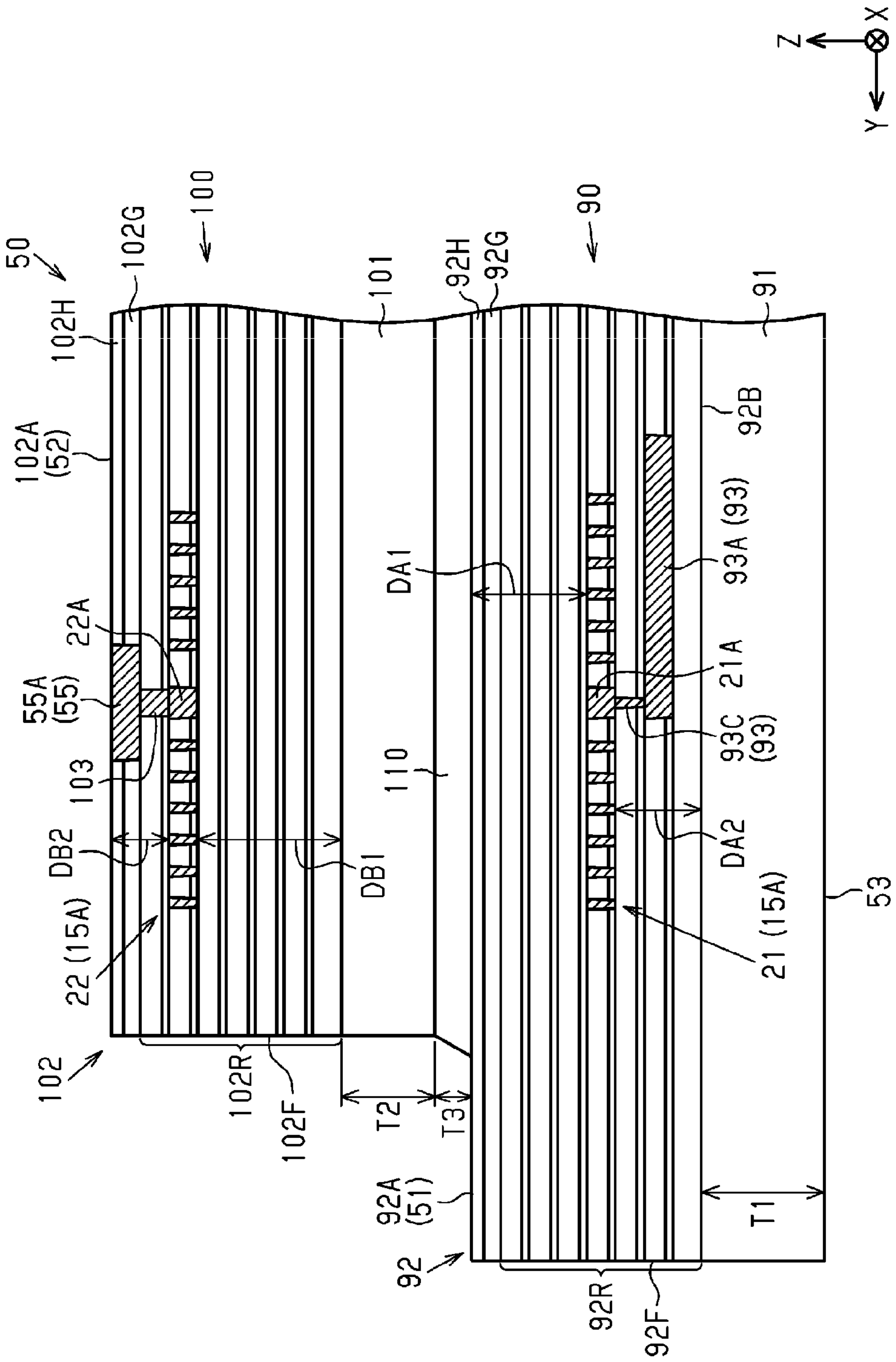
FIG. 13 is a schematic cross-sectional view of the insulation chip taken along line F13-F13 in FIG. 10.

A configuration of the transformer chip 50 will be described with reference to FIGS. 9 to 13. FIG. 9 shows a schematic cross-sectional structure showing a process of bonding the first unit 90 and the second unit 100. FIG. 10 shows a planar structure of the transformer chip 50. FIG. 11 shows a cross-sectional structure of the transformer chip 50 taken along line F11-F11 in FIG. 10, mainly showing cross-sectional structures of the first coil 21 and the second coil 22 of the transformer 15A. FIG. 12 shows a cross-sectional structure of the transformer chip 50 taken along line F12-F12 in FIG. 10, mainly showing cross-sectional structures of the first connecting portions 93 and 103 of the transformer 15A. FIG. 13 shows a cross-sectional structure of the transformer chip 50 taken along line F13-F13 in FIG. 10, mainly showing cross-sectional structures of the first coil 21 and the second coil 22 of the transformer 15A in a direction different from that in FIG. 11.

As shown in FIG. 9, the second unit 100 is arranged such that the second semiconductor substrate 101 faces the first element front surface 92A of the first element insulating layer 92 of the first unit 90. Further, the second element front surface 102A of the second element insulating layer 102 of the second unit 100 is arranged on the opposite side of the first unit 90 with respect to the second semiconductor substrate 101 in the Z direction. Therefore, the second element front surface 102A of the second element insulating layer 102 constitutes the second chip front surface 52 of the transformer chip 50.

An insulating bonding material 110 is applied to a region of the first element front surface 92A of the first element insulating layer 92 where the second unit 100 is arranged. The insulating bonding material 110 includes at least one of an epoxy resin and a bismaleimide resin. In one example, the insulating bonding material 110 may be a bonding material containing an epoxy resin, a phenolic curing agent, and silica. In another example, the insulating bonding material 110 may be a bonding material containing a bismaleimide resin, a fluoropolymer, and a modified silane.

As shown in FIG. 10, in the second unit 100, the second element side-surface 102D is arranged to be closer to the first element side-surface 92D of the first unit 90 in the X direction, and the second element side-surface 102C is arranged to be closer to the first element side-surface 92C of the first unit 90.

As shown in FIG. 11, in a state where the second unit 100 is bonded to the first unit 90 by the insulating bonding material 110 (hereinafter referred to as a "unit bonding state"), the second unit 100 is placed on the insulating bonding material 110. Therefore, the second semiconductor substrate 101 is in contact with the insulating bonding material 110. In other words, the insulating bonding material 110 bonds the second semiconductor substrate 101 and the first element insulating layer 92. In this way, the insulating bonding material 110 is interposed between the second semiconductor substrate 101 and the first element insulating layer 92 in the Z direction. Therefore, the second semiconductor substrate 101 is arranged at a position spaced apart from the first element insulating layer 92 in the Z direction. That is, the second semiconductor substrate 101 is not directly bonded to the first element insulating layer 92.

As shown in FIGS. 10 and 11, the second unit 100 is smaller in size than the first unit 90 in a plan view. More specifically, in a plan view, a dimension in the X direction of the second unit 100 is smaller than that in the X direction of the first unit 90, and a dimension in the Y direction of the second unit 100 is smaller than that in the Y direction of the first unit 90. Therefore, the first element front surface 92A of the first element insulating layer 92 includes a rectangular frame-shaped exposure region 51A surrounding the second unit 100 in a plan view. This exposure region 51A constitutes the first chip front surface 51 of the transformer chip 50. The exposure region 51A includes a first region 51AA between the first element side-surface 92C and the second element side-surface 102C in the X direction, a second region 51AB between the first element side-surface 92D and the second element side-surface 102D in the X direction, a third region 51AC between the first element side-surface 92E and the second element side-surface 102E in the Y direction, and a fourth region 51AD between the first element side-surface 92F and the second element side-surface 102F in the Y direction.

In the example shown in FIG. 10, the second unit 100 is arranged to be closer to the first element side-surface 92D than the first element side-surface 92C in the X direction. More specifically, in a plan view, a distance between the first element side-surface 92D and the second element side-surface 102D in the X direction is smaller than a distance between the first element side-surface 92C and the second element side-surface 102C in the X direction. Therefore, a width (the dimension in the X direction) of the first region 51AA is larger than a width (the dimension in the X direction) of the second region 51AB.

In the example shown in FIG. 10, the second unit 100 is arranged to be closer to the first element side-surface 92F than the first element side-surface 92E in the Y direction. More specifically, in a plan view, a distance between the first element side-surface 92F and the second element side-surface 102F in the Y direction is smaller than a distance between the first element side-surface 92E and the second element side-surface 102E in the Y direction. Therefore, a width (the dimension in the Y direction) of the third region 51AC is larger than a width (the dimension in the Y direction) of the fourth region 51AD. Further, in the example shown in FIG. 10, a width of the first region 51AA is larger than a width of the third region 51AC. A width of the third region 51AC is larger than a width of the second region 51AB. Further, the arrangement position of the second unit 100 with respect to the first unit 90 in a plan view may be changed arbitrarily.

As shown in FIG. 10, the first electrode pad 54 is provided at a different position from the second unit 100 in a plan view. More specifically, the first electrode pad 54 is provided in the exposure region 51A. In a plan view, the first electrode pad 54 is arranged to be closer to the first element side-surface 92C than the second unit 100. That is, the first electrode pad 54 is provided in the first region 51AA.

As shown in FIG. 11, in the unit bonding state, the first coil 21 and the second coil 22 are arranged to face each other in the Z direction. In one example, the distance DA1 between the first coil 21 and the first element front surface 92A in the Z direction is smaller than the distance DB1 between the second coil 22 and the second element front surface 102A in the Z direction. In other words, the distance DB1 is larger than the distance DA1. Further, the distances DA1 and DB1 may be changed arbitrarily. In one example, the distance DA1 may be larger than the distance DB1. Further, in one example, the distance DB1 may be equal to the distance DA1. Here, when a difference between the distance DA1 and the distance DB1 is, for example, within 10% of the distance DA1, it can be said that the distance DA1 is equal to the distance DB1.

The second semiconductor substrate 101 of the second unit 100 and the insulating bonding material 110 are interposed between the first coil 21 and the second coil 22 in the Z direction. Therefore, a distance between the first coil 21 and the second coil 22 in the Z direction is the sum (DA1+DB1+T2+T3) of the distance DA1, the distance DB1, the thickness T2 of the second semiconductor substrate 101, and the thickness T3 of the insulating bonding material 110.

As shown in FIGS. 12 and 13, the first wiring layer 93A of the first connecting portion 93 in the first unit 90 is arranged on the opposite side of the second coil 22 with respect to the first coil 21 in the Z direction. As shown in FIG. 13, the first connecting portion 103 in the second unit 100 is arranged on the opposite side of the first coil 21 with respect to the second coil 22 in the Z direction. Therefore, a distance between the first wiring layer 93A and the first wiring layer 103A in the Z direction is larger than the distance (DA1+DB1+T2+T3) between the first coil 21 and the second coil 22 in the Z direction.

As shown in FIG. 11, the second wiring layer 94A of the second connecting portion 94 in the first unit 90 is arranged at the same position as the first coil 21 in the Z direction. The wiring layer 104A of the second connecting portion 104 in the second unit 100 is arranged at the same position as the second coil 22 in the Z direction. Therefore, a distance between the second wiring layer 94A and the wiring layer 104A in the Z direction is equal to the distance (DA1+DB1+T2+T3) between the first coil 21 and the second coil 22 in the Z direction.

As described above, among the first coil 21, the second coil 22, the first connecting portions 93 and 103, and the second connecting portions 94 and 104, which are related to a breakdown voltage, the shortest distances are the distance (DA1+DB1+T2+T3) between the first coil 21 and the second coil 22 and the distance between the second wiring layer 94A and the wiring layer 104A in the Z direction. In other words, the breakdown voltage of the transformer chip 50 is determined according to the distance (DA1+DB1+T2+T3) between the first coil 21 and the second coil 22 and the distance between the second wiring layer 94A and the wiring layer 104A in the Z direction.

[Semiconductor Substrate]

Next, the first semiconductor substrate 91 of the first unit 90 and the second semiconductor substrate 101 of the second unit 100 will be described with reference to FIG. 11.

As shown in FIG. 11, since the second semiconductor substrate 101 is arranged between the first coil 21 and the second coil 22 in the Z direction, a magnetic flux of a magnetic field formed by the first coil 21 and the second coil 22 passes through the second semiconductor substrate 101. Therefore, a high-resistance semiconductor substrate that can reduce the influence on the magnetic field may be used as the second semiconductor substrate 101.

In one example, a resistivity of the second semiconductor substrate 101 is higher than that of the first semiconductor substrate 91. In one example, the resistivity of the second semiconductor substrate 101 is equal to or more than 100 Ωcm and less than 10,000 Ωcm. Preferably, the resistivity of the second semiconductor substrate 101 is equal to or more than 1,000 Ωcm and less than 10,000 Ωcm. Preferably, the resistivity of the second semiconductor substrate 101 is equal to or more than 5,000 Ωcm and less than 10,000 Ωcm.

Further, the resistivity of the first semiconductor substrate 91 may be changed arbitrarily. In one example, the resistivity of the first semiconductor substrate 91 may be equal to or more than 100 Ωcm and less than 10,000 Ωcm. In this case, the resistivity of the second semiconductor substrate 101 may be equal to the resistivity of the first semiconductor substrate 91. That is, the resistivity of each of the first semiconductor substrate 91 and the second semiconductor substrate 101 may be equal to or more than 100 Ωcm and less than 10,000 Ωcm. Preferably, the resistivity of each of the first semiconductor substrate 91 and the second semiconductor substrate 101 is equal to or more than 1,000 Ωcm and less than 10,000 Ωcm. Preferably, the resistivity of each of the first semiconductor substrate 91 and the second semiconductor substrate 101 is equal to or more 5,000 Ωcm and less than 10,000 Ωcm.

The resistivity of each of the semiconductor substrates may be adjusted according to an impurity concentration. In other words, the lower the impurity concentration of a semiconductor substrate, the higher the resistivity of the semiconductor substrate. Therefore, the impurity concentration of the second semiconductor substrate 101 is lower than that of the first semiconductor substrate 91, for example. In one example, the impurity concentration of the second semiconductor substrate 101 is $1\times10^{13}$ $cm^{-3}$ or more and $1\times10^{14}$ $cm^{-3}$ or less.

Further, the impurity concentration of the first semiconductor substrate 91 may be changed arbitrarily. In one example, the impurity concentration of the first semiconductor substrate 91 may be $1\times10^{13}$ $cm^{-3}$ or more and $1\times10^{14}$ $cm^{-3}$ or less. In this case, the impurity concentration of the second semiconductor substrate 101 may be equal to the impurity concentration of the first semiconductor substrate 91. That is, the impurity concentration of each of the first semiconductor substrate 91 and the second semiconductor substrate 101 may be $1\times10^{13}$ $cm^{-3}$ or more and $1\times10^{14}$ $cm^{-3}$ or less.

Further, in the example shown in FIG. 11, a thickness T2 of the second semiconductor substrate 101 is thinner than a thickness T1 of the first semiconductor substrate 91. The thickness T2 of the second semiconductor substrate 101 is thicker than the thickness TB of the second element insulating layer 102.

Further, the thickness T2 of the second semiconductor substrate 101 may be changed arbitrarily. The thickness T2 of the second semiconductor substrate 101 may be equal to the thickness T1 of the first semiconductor substrate 91. Further, the thickness T2 of the second semiconductor substrate 101 may be thicker than the thickness T1 of the first semiconductor substrate 91.

[Method of Manufacturing Transformer Chip]

Figure 14:
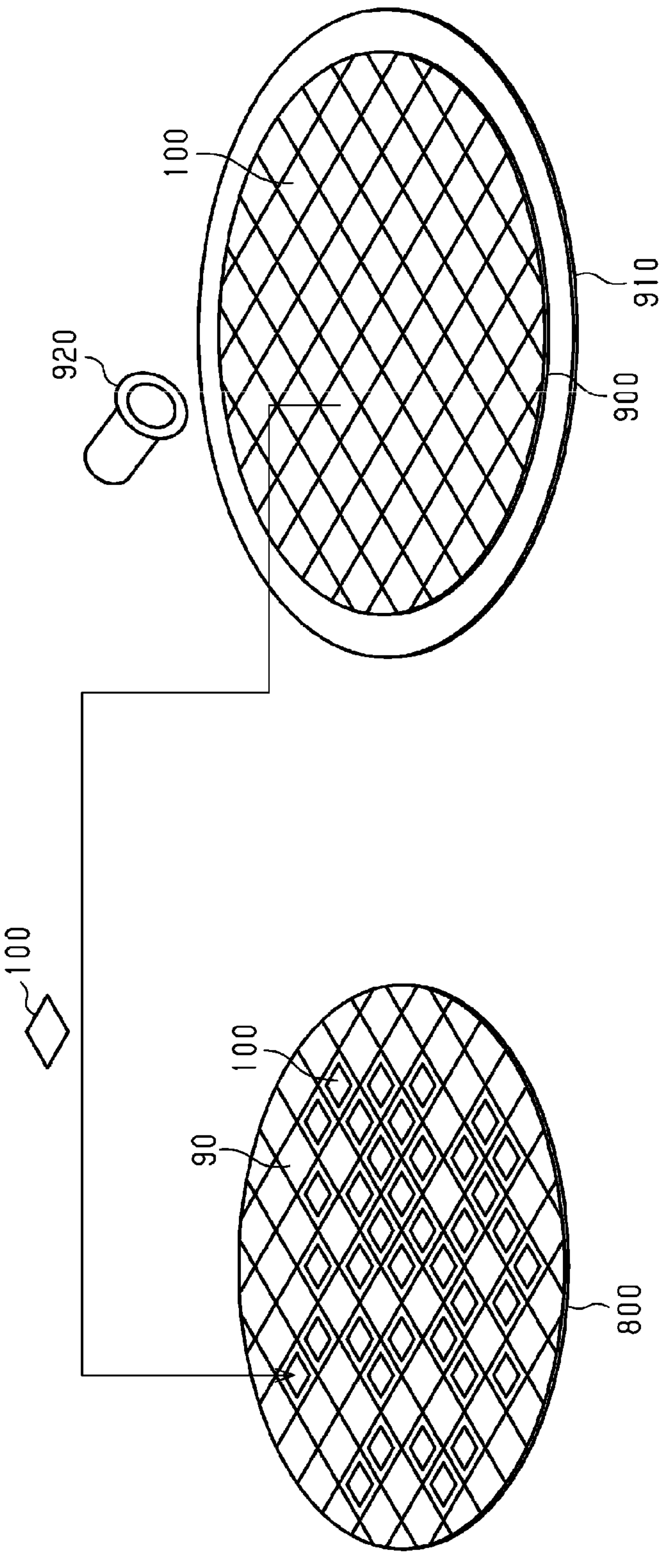
FIG. 14 is a schematic perspective view showing a process of manufacturing the insulation chip.

An example of a method of manufacturing the transformer chip 50 will be described with reference to FIG. 14. FIG. 14 schematically shows an example of a process of manufacturing the transformer chip 50.

As shown in FIG. 14, the method of manufacturing the transformer chip 50 includes an operation of preparing a first semiconductor wafer 800 and a second semiconductor wafer 900. The first semiconductor wafer 800 is a wafer on which a plurality of first units 90 are formed. For example, a Si wafer is used as the first semiconductor wafer 800. The second semiconductor wafer 900 is a wafer on which a plurality of second units 100 are formed. For example, a Si wafer is used as the second semiconductor wafer 900.

Further, the method of manufacturing the transformer chip 50 includes an operation of segmenting the second semiconductor wafer 900. In one example, the second semiconductor wafer 900 is cut by a dicing process. More specifically, the second semiconductor wafer 900 is placed on a dicing tape 910. Subsequently, the second semiconductor wafer 900 is cut by a dicing blade 920. As a result, the plurality of second units 100 are manufactured.

Further, the method of manufacturing the transformer chip 50 includes an operation of bonding the plurality of second units 100 to the first semiconductor wafer 800. In this operation, the second unit 100 is bonded to a region of the first semiconductor wafer 800 where the first unit 90 is formed.

More specifically, the insulating bonding material 110 is applied to a region of the first semiconductor wafer 800 where the first unit 90 is formed. Subsequently, the second unit 100 is placed on the insulating bonding material 110 with the second semiconductor substrate 101 of the second unit 100 and the first element front surface 92A (see FIG. 11) of the first unit 90 facing each other. Subsequently, the insulating bonding material 110 is cured by, for example, a curing process. As the curing process, for example, at least one of a process of curing the insulating bonding material 110 by heating and a process of curing the insulating bonding material 110 by irradiating it with ultraviolet rays may be used. Through the above operations, the second unit 100 is bonded to the first semiconductor wafer 800 by the insulating bonding material 110.

Further, the method of manufacturing the transformer chip 50 includes an operation of segmenting the first semiconductor wafer 800. In one example, the first semiconductor wafer 800 is cut by a dicing process. Through the above operations, the transformer chip 50 is manufactured.

[Actions]

Actions of the first embodiment will be described. A method of manufacturing a plurality of semiconductor chips (the transformer chips 50 in the first embodiment) by forming an element insulating layer on a Si wafer constituting a substrate and then segmenting the Si wafer using a dicing process has been known in the related art. In this method, as the thickness of the element insulating layer on the Si wafer increases, the amount of warpage of the Si wafer increases.

On the other hand, in order to improve the dielectric breakdown voltage of a transformer chip, it is necessary to increase a distance between a first coil and a second coil in the Z direction. However, since it is difficult to increase the thickness of the element insulating layer due to concerns about an increase in the amount of warpage of the Si wafer, it is not possible to increase the distance between the first coil and the second coil. As a result, it is difficult to improve the dielectric breakdown voltage of the transformer chip.

In this regard, in the first embodiment, the transformer chip 50 has a structure in which the first unit 90 including the first element insulating layer 92 and the second unit 100 including the second element insulating layer 102 are bonded to each other. More specifically, in the first unit 90, the first coil 21 is provided on the first semiconductor substrate 91 and the first element insulating layer 92 which are formed by the Si wafer (the first semiconductor wafer 800). In the second unit 100, the second coil 22 is provided on the second semiconductor substrate 101 and the second element insulating layer 102 which are formed by the Si wafer (the second semiconductor wafer 900). Then, since the first element insulating layer 92 and the second element insulating layer 102 are bonded to each other, an element insulating layer between the first coil 21 and the second coil 22 in the Z direction is constructed by pasting together the separately formed first element insulating layer 92 and second element insulating layer 102. Therefore, even if the thickness TA (see FIG. 5) of the first element insulation layer 92 and the thickness TB (see FIG. 8) of the second element insulation layer 102 are not made excessively large, the distance between the first coil 21 and the second coil 22 in the Z direction may be increased. Therefore, it is possible to improve the dielectric breakdown voltage of the transformer chip 50 while suppressing an increase in the amount of warpage of the first semiconductor wafer 800 and the second semiconductor wafer 900.

In addition, the second semiconductor substrate 101 and the insulating bonding material 110 are interposed between the first coil 21 and the second coil 22 in the Z direction. That is, members other than the element insulating layers (the first element insulating layer 92 and the second element insulating layer 102) are interposed between the first coil 21 and the second coil 22 in the Z direction. This makes it possible to further increase the distance between the first coil 21 and the second coil 22 in the Z direction. Further, the second semiconductor substrate 101 is formed of a high-resistance semiconductor substrate so as to reduce the influence on the magnetic field formed by the first coil 21 and the second coil 22. As a result, the dielectric breakdown voltage of the transformer chip 50 may be improved.

[Effects]

According to the first embodiment, the following effects may be obtained.

(1-1) The transformer chip 50 includes the first unit 90, the second unit 100 provided on the first unit 90, the insulating bonding material 110 that bonds the first unit 90 and the second unit 100. The first unit 90 is provided with the first element insulating layer 92 including the first element front surface 92A facing the second unit 100 and the first element back surface 92B opposite to the first element front surface 92A, and the first coil 21 buried in the first element insulating layer 92 at a position spaced apart from the first element front surface 92A in the Z direction. The second unit 100 is provided with the second element insulating layer 102 including the second element front surface 102A and the second element back surface 102B opposite to the second element front surface 102A, the second coil 22 buried in the second element insulating layer 102 at a position spaced apart from the second element front surface 102A in the Z direction, and the second semiconductor substrate 101 in contact with the second element back surface 102B. In the unit bonding state in which the second unit 100 is bonded to the first unit 90 by the insulating bonding material 110, the first coil 21 and the second coil 22 are arranged to face each other in the Z direction. The insulating bonding material 110 bonds the first element insulating layer 92 and the second semiconductor substrate 101.

With this configuration, the element insulating layer between the first coil 21 and the second coil 22 in the Z direction may be formed individually like the first element insulating layer 92 and the second element insulating layer 102. Further, since the first coil 21 and the second coil 22 are provided in the element insulating layer formed by the laminated first element insulating layer 92 and second element insulating layer 102, the distance between the first coil 21 and the second coil 22 in the Z direction may be increased. This makes it possible to improve the dielectric breakdown voltage of the transformer chip 50.

In addition, since the second semiconductor substrate 101 and the insulating bonding material 110 are interposed between the first coil 21 and the second coil 22 in the Z direction, the distance between the first coil 21 and the second coil 22 in the Z direction may be further increased. Therefore, the dielectric breakdown voltage of the transformer chip 50 may be improved.

(1-2) The first unit 90 includes the first semiconductor substrate 91 in contact with the first element back surface 92B of the first element insulating layer 92. The impurity concentration of the second semiconductor substrate 101 is lower than the impurity concentration of the first semiconductor substrate 91.

With this configuration, since the second semiconductor substrate 101 is formed of a semiconductor substrate having a higher resistance than the first semiconductor substrate 91, it is possible to suppress the second semiconductor substrate 101 from affecting the magnetic field formed by the first coil 21 and the second coil 22.

(1-3) The impurity concentration of the second semiconductor substrate 101 is $1\times10^{13}$ $cm^{-3}$ or more and $1\times10^{14}$ $cm^{-3}$ or less. With this configuration, since the second semiconductor substrate 101 is formed of a high-resistance semiconductor substrate, it is possible to suppress the second semiconductor substrate 101 from affecting the magnetic field formed by the first coil 21 and the second coil 22.

(1-4) The resistivity of the second semiconductor substrate 101 is higher than the resistivity of the first semiconductor substrate 91. With this configuration, since the second semiconductor substrate 101 is formed of a semiconductor substrate having a higher resistance than the first semiconductor substrate 91, it is possible to suppress the second semiconductor substrate 101 from affecting the magnetic field formed by the first coil 21 and the second coil 22.

(1-5) The resistivity of the second semiconductor substrate 101 is equal to or more than 100 Ωcm and less than 10,000 Ωcm. With this configuration, since the second semiconductor substrate 101 is formed of a high-resistance semiconductor substrate, it is possible to suppress the second semiconductor substrate 101 from affecting the magnetic field formed by the first coil 21 and the second coil 22.

(1-6) The impurity concentration of the second semiconductor substrate 101 may be equal to that of the first semiconductor substrate 91. In this case, the impurity concentration of each of the first semiconductor substrate 91 and the second semiconductor substrate 101 is $1\times10^{13}$ $cm^{-3}$ or more and $1\times10^{14}$ $cm^{-3}$ or less.

With this configuration, since the second semiconductor substrate 101 is formed of a high-resistance semiconductor substrate, it is possible to suppress the second semiconductor substrate 101 from affecting the magnetic field formed by the first coil 21 and the second coil 22.

(1-7) The resistivity of the second semiconductor substrate 101 may be equal to the resistivity of the first semiconductor substrate 91. In this case, the resistivity of each of the first semiconductor substrate 91 and the second semiconductor substrate 101 is equal to or more than 100 Ωcm and less than 10,000 Ωcm.

With this configuration, since the second semiconductor substrate 101 is formed of a high-resistance semiconductor substrate, it is possible to suppress the second semiconductor substrate 101 from affecting the magnetic field formed by the first coil 21 and the second coil 22.

(1-8) The second unit 100 is formed to be smaller than the first unit 90 in a plan view. The first unit 90 includes the first electrode pad 54 provided on the first element insulating layer 92 to be electrically connected to the first coil 21 and exposed from the first element front surface 92A. The second unit 100 includes the second electrode pad 55 provided on the second element insulating layer 102 to be electrically connected to the second coil 22 and exposed from the second element front surface 102A. In the unit bonding state, the first electrode pad 54 is provided at a different position from the second unit 100 in a plan view.

With this configuration, the first electrode pad 54 is exposed from the first element front surface 92A of the first element insulating layer 92 of the first unit 90. As a result, as compared to a configuration in which the first electrode pad 54 is exposed from the second element front surface 102A of the second element insulating layer 102 of the second unit 100, a length of a conductive path between the first coil 21 and the first electrode pad 54 may be shortened. That is, the length of the conductive path in the Z direction may be shortened. Therefore, a connection wiring between the first electrode pad 54 and the first coil 21 may easily be formed.

Further, the second electrode pad 55 is exposed from the second element front surface 102A of the second element insulating layer 102 of the second unit 100. As a result, as compared to a configuration in which the second electrode pad 55 is exposed from the first element front surface 92A of the first element insulating layer 92 of the first unit 90, the length of the conductive path between the second coil 22 and the second electrode pad 55 may be shortened. Further, there is no need to provide a conductive path between the second coil 22 and the second electrode pad 55 for the first element insulating layer 92. This makes it possible to easily form a connection wiring between the second electrode pad 55 and the second coil 22.

(1-9) The first coil 21 is arranged to be closer to the first element back surface 92B than the first element front surface 92A of the first element insulating layer 92 in the Z direction. With this configuration, the distance between the first coil 21 and the second coil 22 in the Z direction may be increased. Therefore, the dielectric breakdown voltage of the transformer chip 50 may be improved.

(1-10) The second coil 22 is arranged to be closer to the second element back surface 102B than the second element front surface 102A of the second element insulating layer 102 in the Z direction. With this configuration, the distance between the first coil 21 and the second coil 22 in the Z direction may be increased. Therefore, the dielectric breakdown voltage of the transformer chip 50 may be improved.

(1-11) The first unit 90 includes the first wiring layer 93A that is provided within the first element insulating layer 92 and is electrically connected to the first end portion 21A of the first coil 21, and the first connection wiring 93B that is provided within the first element insulating layer 92 and electrically connects the first wiring layer 93A and the first electrode pad 54.

With this configuration, it is possible to electrically connect the first end portion 21A of the first coil 21 and the first electrode pad 54A within the first unit 90 (within the first element insulating layer 92). Therefore, as compared to a configuration in which the first end portion 21A of the first coil 21 and the first electrode pad 54A are electrically connected to each other outside the first unit 90, the length of the conductive path between the first end portion 21A of the first coil 21 and the first electrode pad 54A may be shortened.

(1-12) The first unit 90 includes the second wiring layer 94A that is provided within the first element insulating layer 92 and is electrically connected to the second end portion 21B of the first coil 21, and the second connection wiring 94B that is provided within the first element insulating layer 92 and electrically connects the second wiring layer 94A and the first electrode pad 54B.

With this configuration, it is possible to electrically connect the second end portion 21B of the first coil 21 and the first electrode pad 54B within the first unit 90 (within the first element insulating layer 92). Therefore, as compared to a configuration in which the second end portion 21B of the first coil 21 and the first electrode pad 54B are electrically connected to each other outside the first unit 90, the length of a conductive path between the second end portion 21B of the first coil 21 and the first electrode pad 54B may be shortened.

(1-13) The second unit 100 includes the first connecting portion 103 that is provided within the second element insulating layer 102 and electrically connects the first end portion 22A of the second coil 22 and the second electrode pad 55A.

With this configuration, it is possible to electrically connect the first end portion 22A of the second coil 22 and the second electrode pad 55A within the second unit 100 (within the second element insulating layer 102). Therefore, as compared to a configuration in which the first end portion 22A of the second coil 22 and the second electrode pad 55A are electrically connected to each other outside the second unit 100, the length of a conductive path between the first end portion 22A of the second coil 22 and the second electrode pad 55A may be shortened.

(1-14) The second unit 100 includes the wiring layer 104A that is provided within the second element insulating layer 102 and is electrically connected to the second end portion 22B of the second coil 22, and the via 104B that electrically connects the wiring layer 104A and the second electrode pad 55B.

With this configuration, it is possible to electrically connect the second end portion 22B of the second coil 22 and the second electrode pad 55B within the second unit 100 (within the second element insulating layer 102). Therefore, as compared to a configuration in which the second end portion 22B of the second coil 22 and the second electrode pad 55B are electrically connected to each other outside the second unit 100, the length of a conductive path between the second end portion 22B of the second coil 22 and the second electrode pad 55B may be shortened.

Second Embodiment

A signal transmission device 10 according to a second embodiment will be described with reference to FIGS. 15 to 17. The signal transmission device 10 according to the second embodiment is different from the signal transmission device 10 according to the first embodiment in that a capacitor chip 130 is used instead of the transformer chip 50. In the following description, the same constituent elements as those in the first embodiment are denoted by the same reference numerals, and thus descriptions thereof will be omitted.

Figure 15:
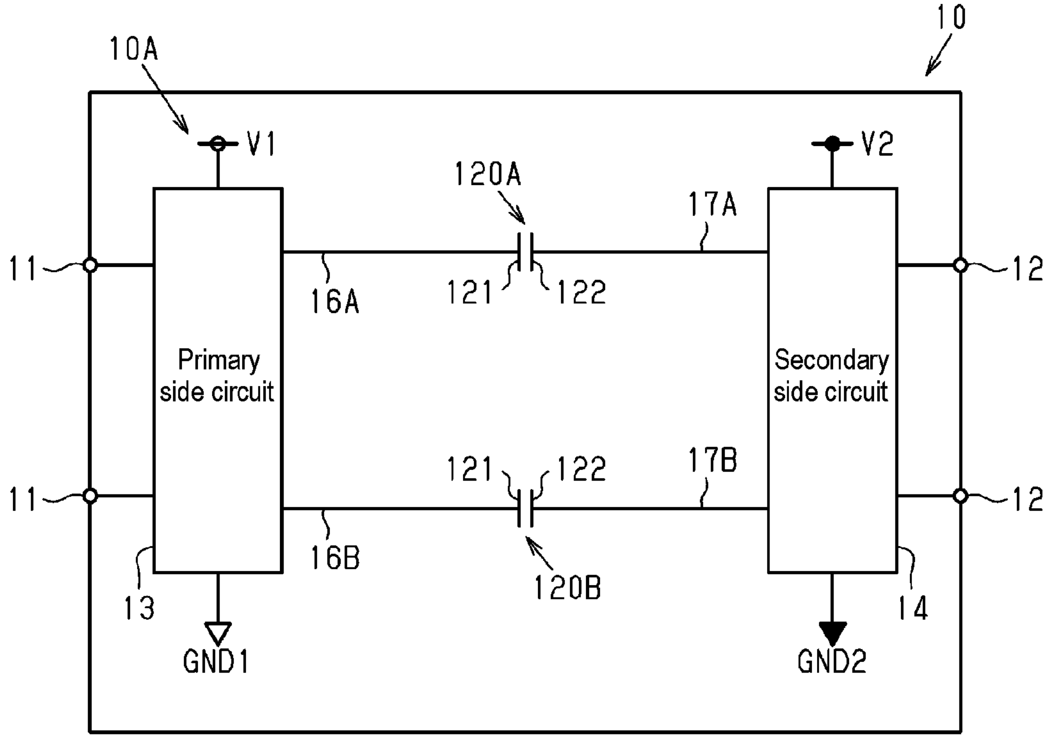
FIG. 15 is a circuit diagram schematically showing a circuit configuration of a signal transmission device according to a second embodiment.

FIG. 15 shows a simplified example of a circuit configuration of the signal transmission device 10 of the first embodiment. FIG. 16 schematically shows a planar structure of the capacitor chip 130. FIG. 17 shows a cross-sectional structure of the capacitor chip 130 taken along line F17-F17 in FIG. 16, mainly showing a cross-sectional structure of a capacitor 120A which will be described later.

As shown in FIG. 15, the signal transmission device 10 includes capacitors 120A and 120B instead of the transformers 15A and 15B. The capacitor 120A transmits a set signal from the primary-side circuit 13 to the secondary-side circuit 14 while electrically insulating the primary-side circuit 13 and the secondary-side circuit 14. The capacitor 120A has a first electrode plate 121 and a second electrode plate 122 that constitute electrodes of the capacitor 120A. The first electrode plate 121 of the capacitor 120A is electrically connected to the primary-side signal line 16A, and the second electrode plate 122 is electrically connected to the secondary-side signal line 17A.

The capacitor 120B transmits a reset signal from the primary-side circuit 13 to the secondary-side circuit 14 while electrically insulating the primary-side circuit 13 and the secondary-side circuit 14. The capacitor 120B has a first electrode plate 121 and a second electrode plate 122. The first electrode plate 121 of the capacitor 120B is electrically connected to the primary-side signal line 16B, and the second electrode plate 122 of the capacitor 120B is electrically connected to the secondary-side signal line 17B. Here, in the second embodiment, the first electrode plate 121 of each of the capacitors 120A and 120B corresponds to a "first insulating element," and the second electrode plate 122 of each of the capacitors 120A and 120B corresponds to a "second insulating element."

The dielectric breakdown voltage of the signal transmission device 10 is, for example, 2,500 Vrms or more and 7,500 Vrms or less. The dielectric breakdown voltage of the signal transmission device 10 of the second embodiment is about 5,000 Vrms, similar to the first embodiment. However, a specific numerical value of the dielectric breakdown voltage of the signal transmission device 10 is not limited thereto and may be changed arbitrarily.

Figure 16:
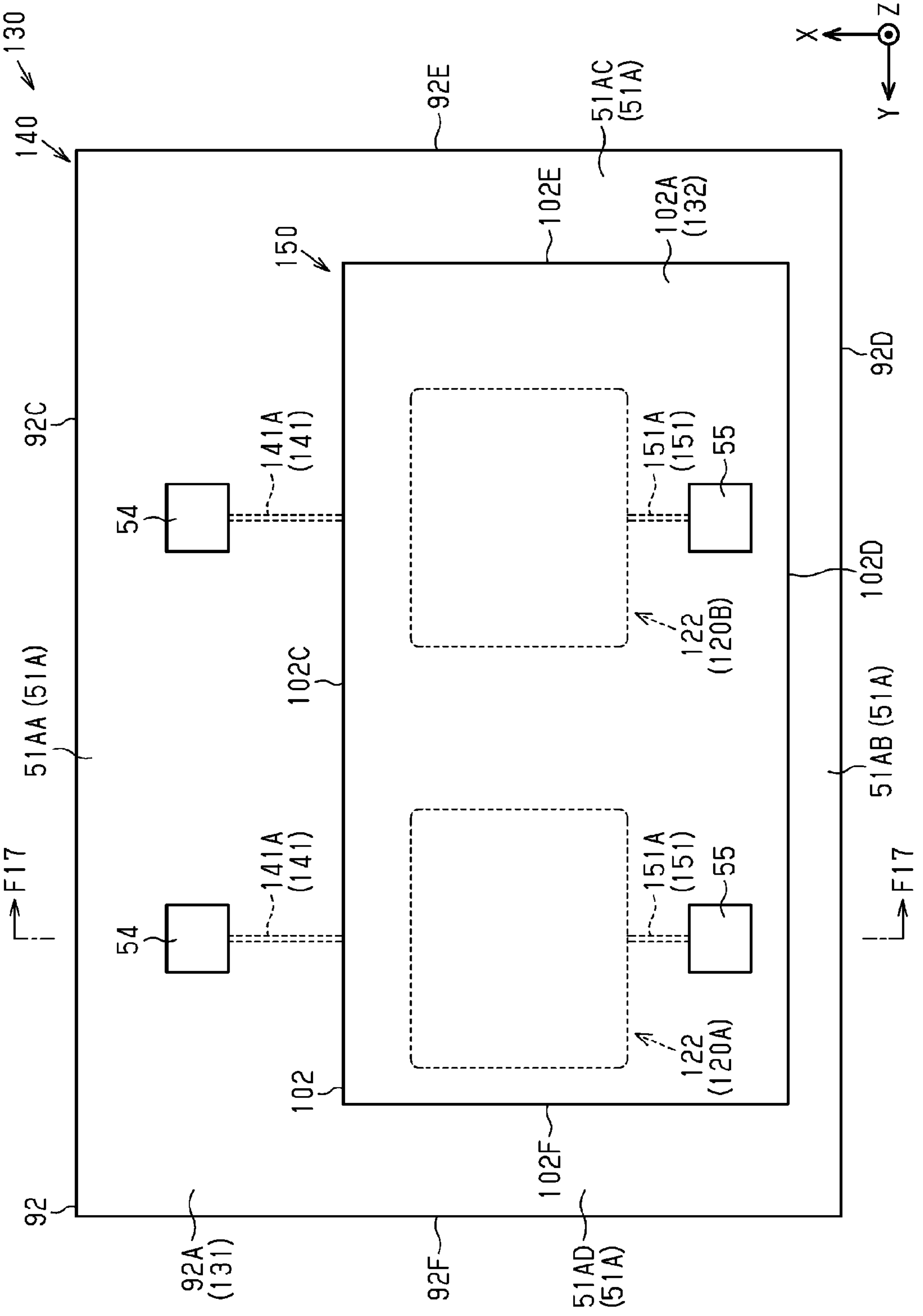
FIG. 16 is a schematic plan view schematically showing an insulation chip in the signal transmission device of FIG. 15.
Figure 17:
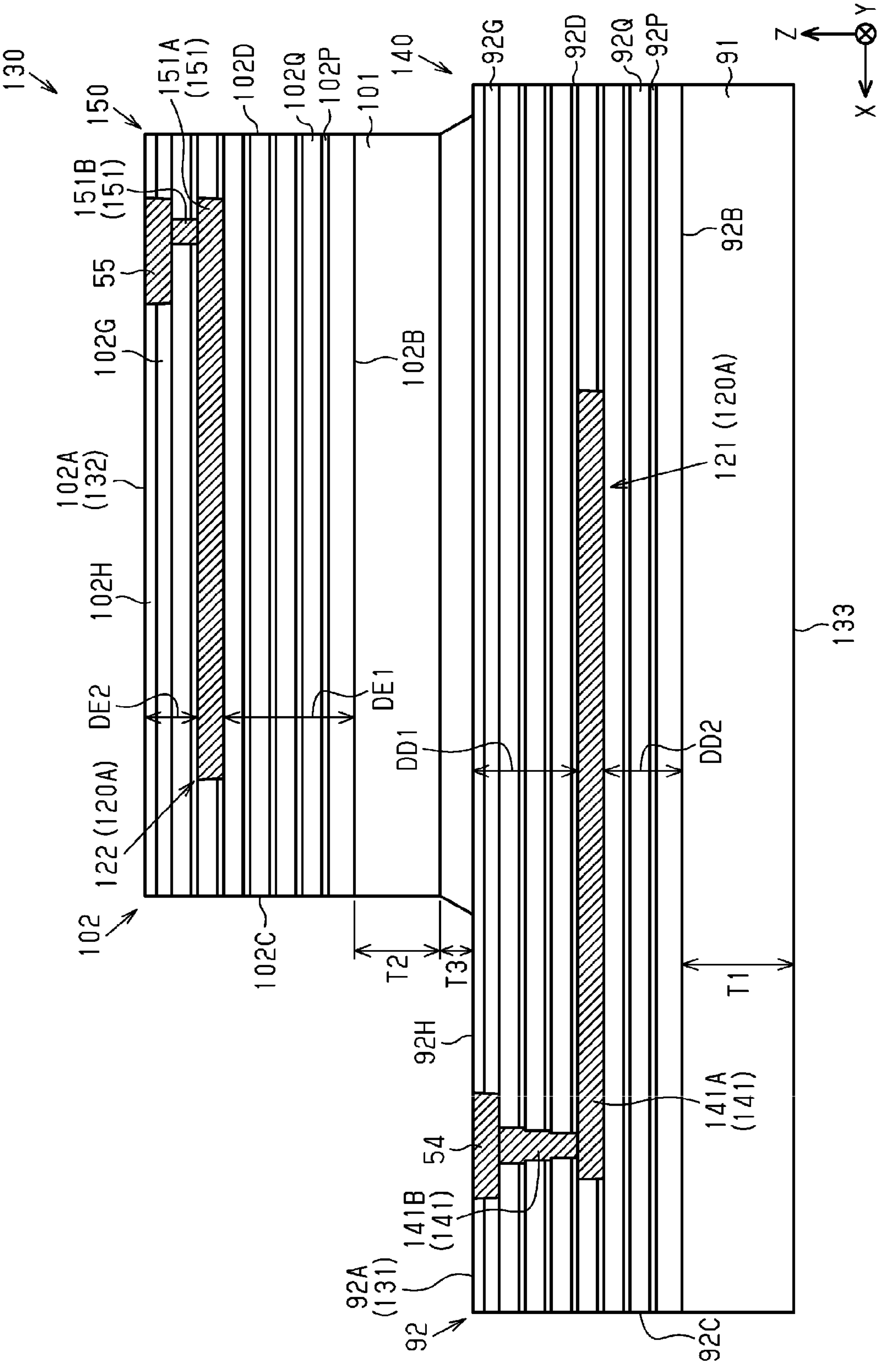
FIG. 17 is a schematic cross-sectional view of the insulation chip taken along line F17-F17 in FIG. 16.

As shown in FIGS. 16 and 17, the signal transmission device 10 of the second embodiment includes the capacitor chip 130 instead of the transformer chip 50 (see FIG. 2). The capacitor 120B has the same configuration as the capacitor 120A, detailed description thereof will be omitted. Here, in the second embodiment, the capacitor chip 130 is an example of an "insulation chip."

The capacitor chip 130 has a configuration in which the transformers 15A and 15B of the transformer chip 50 are replaced with the capacitors 120A and 120B. Therefore, in the capacitor chip 130, the same constituent elements as those in the transformer chip 50 are denoted by the same reference numerals as those in the transformer chip 50, and descriptions thereof will be omitted.

Similarly to the transformer chip 50, the capacitor chip 130 is formed in a convex shape when viewed from the Y direction. The capacitor chip 130 has a first chip front surface 131, a second chip front surface 132, and a chip back surface 133 facing the opposite side of these chip front surfaces 131 and 132. Although not shown, the chip back surface 133 of the capacitor chip 130 is bonded to the first die pad 61 (see FIG. 3) by a conductive bonding material SD. The second chip front surface 132 is located on the opposite side of the first die pad 61 with respect to the first chip front surface 131 in the Z direction. In other words, the first chip front surface 131 is located to be closer to the first die pad 61 than the second chip front surface 132 in the Z direction.

As shown in FIGS. 16 and 17, a plurality of first electrode pads 54 are formed on the first chip front surface 131 of the capacitor chip 130. The plurality of first electrode pads 54 are arranged at an end closer to the first chip 30 (see FIG. 3) of both ends of the first chip front surface 131 in the X direction. The plurality of first electrode pads 54 are arranged to be spaced apart from each other in the Y direction.

A plurality of second electrode pads 55 are formed on the second chip front surface 132 of the capacitor chip 130. The plurality of second electrode pads 55 are arranged to be spaced apart from each other in the X and Y directions.

The capacitor chip 130 includes a first unit 140 and a second unit 150 bonded to the first unit 140. The first unit 140 is formed in a rectangular flat plate shape whose thickness direction is the Z direction. In a plan view, the first unit 140 is formed in a rectangular shape in which the X direction is the lateral direction and the Y direction is the longitudinal direction.

The first unit 140 includes a first electrode pad 54, a first semiconductor substrate 91, a first element insulating layer 92, a first electrode plate 121 of each of the capacitors 120A and 120B, and a connecting portion 141.

As shown in FIG. 16, the first electrode pad 54 is arranged to be closer to the first element side-surface 92C of the first element insulating layer 92 than the second unit 150 in a plan view. The numbers of first electrode pads 54 and second electrode pads 55 are set according to the number of capacitors 120A and 120B. Specifically, the numbers of first electrode pads 54 are the same as the number of capacitors 120A and 120B. In the second embodiment, since the total number of capacitors 120A and 120B is two, the numbers of first electrode pads 54 are each two.

The two first electrode pads 54 are arranged at the same position in the X direction and spaced apart from each other in the Y direction. In the Y direction, each first electrode pad 54 is arranged at the same position as the first electrode plate 121 of each of the capacitors 120A and 120B.

The first electrode plate 121 of each of the capacitors 120A and 120B is an electrode plate formed in a flat plate shape in which the Z direction is the thickness direction. A shape of the first electrode plate 121 in a plan view is, for example, rectangular. These first electrode plates 121 are arranged at the same position in the X direction and spaced apart from each other in the Y direction.

As shown in FIG. 17, the first electrode plate 121 is buried in the first element insulating layer 92. More specifically, the first electrode plate 121 is arranged at a position spaced apart from the first element front surface 92A of the first element insulating layer 92 in the Z direction. The first electrode plate 121 is arranged at a position spaced apart from the first element back surface 92B of the first element insulating layer 92 in the Z direction. Therefore, the first electrode plate 121 is not exposed from the first element insulating layer 92. In this way, the first electrode plate 121 is buried in the first element insulating layer 92. The first electrode plate 121 is made of a material containing one or more appropriately selected from the group consisting of, for example, Ti, TiN, Au, Ag, Cu, Al, and W. In one example, the first electrode plate 121 is formed of a material containing Cu. The shape of the first electrode plate 121 in a plan view may be changed arbitrarily.

The first electrode plate 121 is arranged to be closer to the first element back surface 92B than the first element front surface 92A of the first element insulating layer 92 in the Z direction. That is, a distance DD1 between the first electrode plate 121 and the first element front surface 92A in the Z direction is larger than a distance DD2 between the first electrode plate 121 and the first element back surface 92B in the Z direction. In one example, the distance DD1 may be three times or less than the distance DD2. In one example, the distance DD1 may be twice or less than the distance DD2. The distances DD1 and DD2 may be changed arbitrarily. In one example, the distance DD1 may be larger than twice the distance DD2.

The connecting portion 141 connects the first electrode pad 54 and the first electrode plate 121. The connecting portion 141 includes a wiring layer 141A extending in the X direction and a via 141B extending in the Z direction.

The wiring layer 141A is connected to the first electrode plate 121. The wiring layer 141A is arranged at the same position as the first electrode plate 121 in the Z direction. The wiring layer 141A includes a portion that overlaps the first electrode pad 54 in a plan view. The via 141B is connected to this portion. The via 141B connects the wiring layer 141A and the first electrode pad 54. As a result, the first electrode pad 54 and the first electrode plate 121 are electrically connected to each other. The wiring layer 141A and the via 141B are made of a material containing one or more appropriately selected from the group consisting of, for example, Ti, TiN, Au, Ag, Cu, Al, and W.

The second unit 150 is formed in a rectangular flat plate shape whose thickness direction is the Z direction. In a plan view, the second unit 150 is formed in a rectangular shape in which the X direction is the lateral direction and the Y direction is the longitudinal direction.

The second unit 150 includes a second semiconductor substrate 101, a second element insulating layer 102, a second electrode plate 122 of each of the capacitors 120A and 120B, and a connecting portion 151. As shown in FIG. 16, the second electrode plate 122 of each of the capacitors 120A and 120B is an electrode plate formed in a flat plate shape in which the Z direction is the thickness direction. A shape of the second electrode plate 122 in a plan view is, for example, rectangular. In one example, the shape of the second electrode plate 122 in a plan view is a rectangular shape in which the X direction is the lateral direction and the Y direction is the longitudinal direction. A size of the second electrode plate 122 is the same as that of the first electrode plate 121. That is, dimensions of the second electrode plate 122 in the X, Y, and Z directions are equal to those of the first electrode plate 121 in the X, Y, and Z directions. These second electrode plates 122 are arranged at the same position in the X direction and spaced apart from each other in the Y direction. FIG. 17 shows the second electrode plate 122 of the capacitor 120A and does not show the second electrode plate 122 of the capacitor 120B.

As shown in FIG. 17, the second electrode plate 122 is buried in the second element insulating layer 102. More specifically, the second electrode plate 122 is arranged at a position spaced apart from the second element front surface 102A of the second element insulating layer 102 in the Z direction. The second electrode plate 122 is arranged at a position spaced apart from the second element back surface 102B of the second element insulating layer 102 in the Z direction. Therefore, the second electrode plate 122 is not exposed from the second element insulating layer 102. In this way, the second electrode plate 122 is buried in the second element insulating layer 102. The second electrode plate 122 is made of a material containing one or more appropriately selected from the group consisting of, for example, Ti, TiN, Au, Ag, Cu, Al, and W. In one example, the second electrode plate 122 is formed of a material containing Cu. The shape of the second electrode plate 122 in a plan view may be changed arbitrarily.

The second electrode plate 122 is arranged to be closer to the second element front surface 102A than the second element back surface 102B of the second element insulating layer 102 in the Z direction. That is, a distance DE1 between the second electrode plate 122 and the second element back surface 102B in the Z direction is larger than a distance DE2 between the second electrode plate 122 and the second element front surface 102A in the Z direction. In one example, the distance DE1 may be larger than twice the distance DE2. In one example, the distance DE1 may be three times or less than the distance DE2. In one example, the distance DE1 may be larger than the distance DE2 and twice or less than the distance DE2. Further, the distances DE1 and DE2 may be changed arbitrarily.

The connecting portion 151 connects the second electrode pad 55 and the second electrode plate 122. The connecting portion 151 includes a wiring layer 151A extending in the X direction and a via 151B extending in the Z direction. The wiring layer 151A is connected to the second electrode plate 122. The wiring layer 151A is arranged at the same position as the second electrode plate 122 in the Z direction. The wiring layer 151A includes a portion that overlaps the second electrode pad 55 in a plan view. The via 151B is connected to this portion. The via 151B connects the wiring layer 151A and the second electrode pad 55. As a result, the second electrode pad 55 and the second electrode plate 122 are electrically connected to each other. The wiring layer 151A and the via 151B are made of a material containing one or more appropriately selected from the group consisting of, for example, Ti, TiN, Au, Ag, Cu, Al, and W.

In the second unit 150, the second element side-surface 102D is arranged to be closer to the first element side-surface 92D of the first unit 140 in the X direction, and the second element side-surface 102C is arranged to be closer to the first element side-surface 92C of the first unit 140.

In a state where the second unit 150 is bonded to the first unit 140 (hereinafter referred to as a "unit bonding state"), the second element front surface 102A of the second element insulating layer 102 is in contact with the first element front surface 92A of the first element insulating layer 92. In one example, the second element front surface 102A is in contact with the first element front surface 92A over its entire surface.

As shown in FIGS. 16 and 17, the second unit 150 is smaller than the first unit 140. More specifically, in a plan view, a dimension in the X direction of the second unit 150 is smaller than that in the X direction of the first unit 140, and a dimension in the Y direction of the second unit 150 is smaller than that in the Y direction of the first unit 140. An arrangement form of the second unit 150 with respect to the first unit 140 is similar to that of the second unit 100 with respect to the first unit 90 of the first embodiment shown in FIG. 10. Therefore, as in the first embodiment, the first element front surface 92A of the first element insulating layer 92 includes a rectangular frame-shaped exposure region 51A surrounding the second unit 150 in a plan view.

This exposure region 51A constitutes the first chip front surface 131 of the capacitor chip 130.

As shown in FIG. 16, the first electrode pad 54 and the second electrode pad 55 are provided at different positions from the second unit 150 in a plan view. More specifically, in a plan view, the first electrode pad 54 is arranged to be closer to the first element side-surface 92C than the second unit 150. In a plan view, the second electrode pad 55 is arranged to be closer to the second element side-surface 102 (the first element side-surface 92D) than the second unit 150.

As shown in FIG. 17, in the unit bonding state, the first electrode plate 121 and the second electrode plate 122 are arranged to face each other in the Z direction. In one example, the distance DD1 between the first electrode plate 121 and the first element front surface 92A in the Z direction is smaller than the distance DE1 between the second electrode plate 122 and the second element front surface 102A in the Z direction. In other words, the distance DE1 is larger than the distance DD1. Further, the distances DD1 and DE1 may be changed arbitrarily. In one example, the distance DD1 may be larger than the distance DE1. Further, in one example, the distance DE1 may be equal to the distance DD1. Here, when a difference between the distance DD1 and the distance DE1 is, for example, within 10% of the distance DD1, it can be said that the distance DD1 is equal to the distance DE1.

The second semiconductor substrate 101 of the second unit 100 and the insulating bonding material 110 are interposed between the first electrode plate 121 and the second electrode plate 122 in the Z direction. Therefore, a distance between the first electrode plate 121 and the second electrode plate 122 in the Z direction is the sum (DD1+DE1+T2+T3) of the distance DD1, the distance DE1, the thickness T2 of the second semiconductor substrate 101, and the thickness T3 of the insulating bonding material 110.

The wiring layer 141A of the connecting portion 141 in the first unit 140 is arranged at the same position as the first electrode plate 121 in the Z direction. The wiring layer 151A of the connecting portion 151 in the second unit 150 is arranged at the same position as the second electrode plate 122 in the Z direction. Therefore, a distance between the wiring layer 141A and the wiring layer 151A in the Z direction is equal to the distance (DD1+DE1+T2+T3) between the first electrode plate 121 and the second electrode plate 122 in the Z direction.

As described above, among the first electrode plate 121, the second electrode plate 122, the connecting portion 141, and the connecting portion 151, which are related to a breakdown voltage, the shortest distances are the distance (DD1+DE1+T2+T3) between the first electrode plate 121 and the second electrode plate 122, and the distance between the wiring layer 141A and the wiring layer 151A in the Z direction. That is, the breakdown voltage of the capacitor chip 130 is determined according to the distance (DD1+DE1+T2+T3) between the first electrode plate 121 and the second electrode plate 122, and the distance between the wiring layer 141A and the wiring layer 151A in the Z direction. According to the second embodiment, the same effects as the first embodiment may be obtained.

Third Embodiment

A signal transmission device 10 according to a third embodiment will be described with reference to FIGS. 18 to 27. The signal transmission device 10 according to the third embodiment is different from the signal transmission device 10 according to the first embodiment mainly in the configuration and arrangement form of the transformer chip 50. In the following, the same constituent elements as those in the first embodiment will be denoted by the same reference numerals, and descriptions thereof will be omitted.

[Signal Transmission Device]

Figure 18:
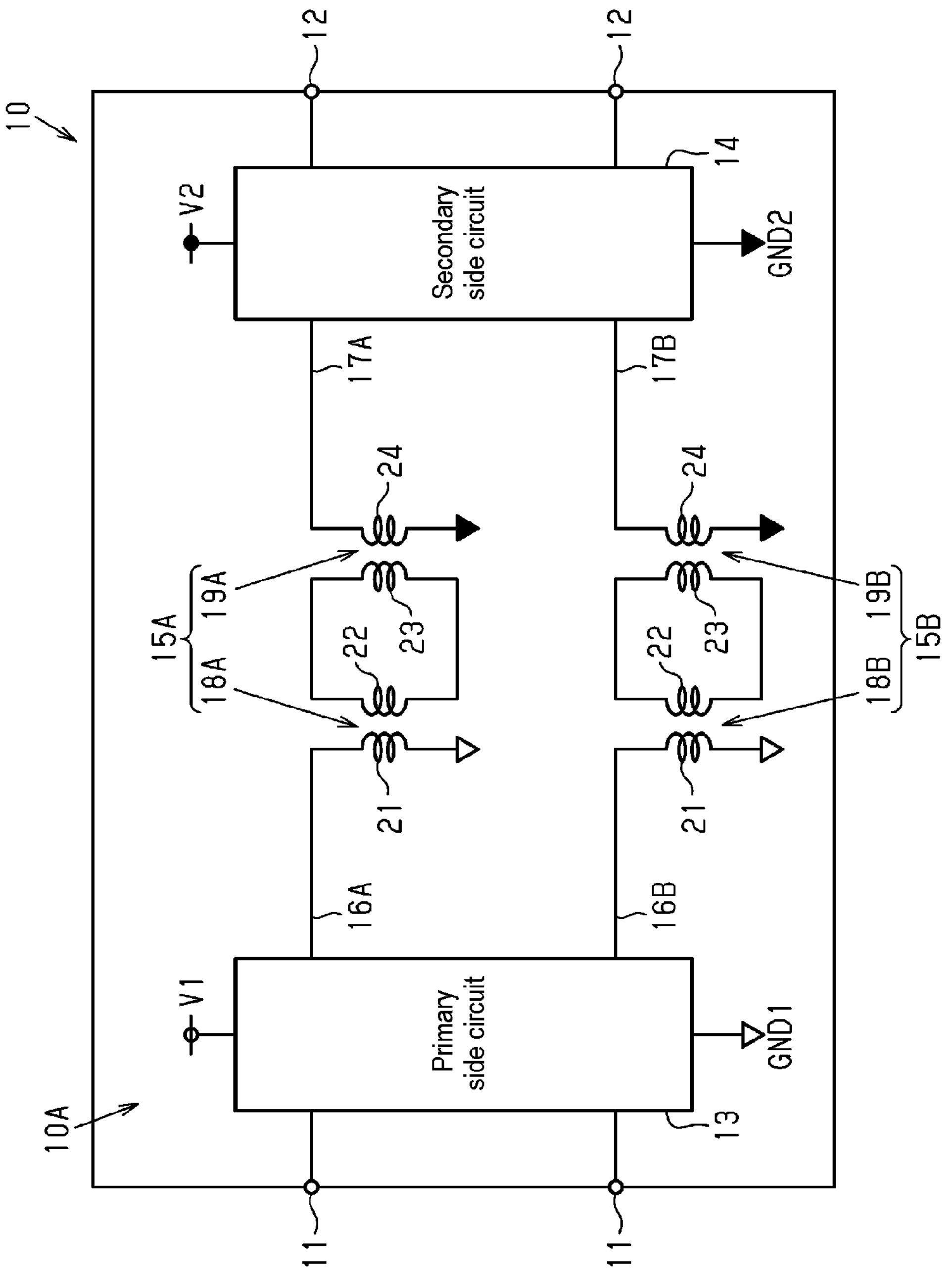
FIG. 18 is a circuit diagram schematically showing a circuit configuration of a signal transmission device according to a third embodiment.
Figure 19:
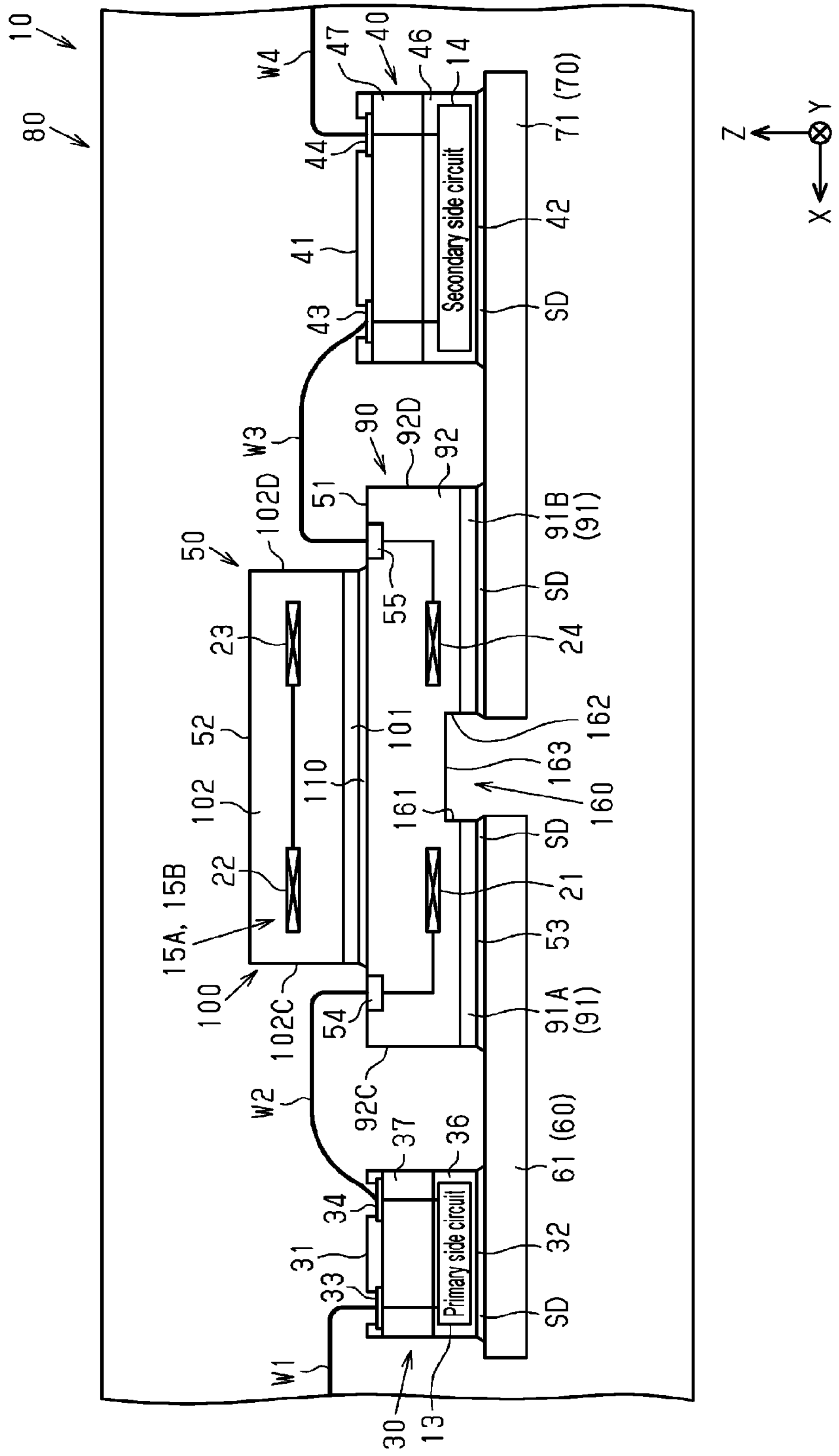
FIG. 19 is a schematic cross-sectional view schematically showing the signal transmission device of FIG. 18.
Figure 20:
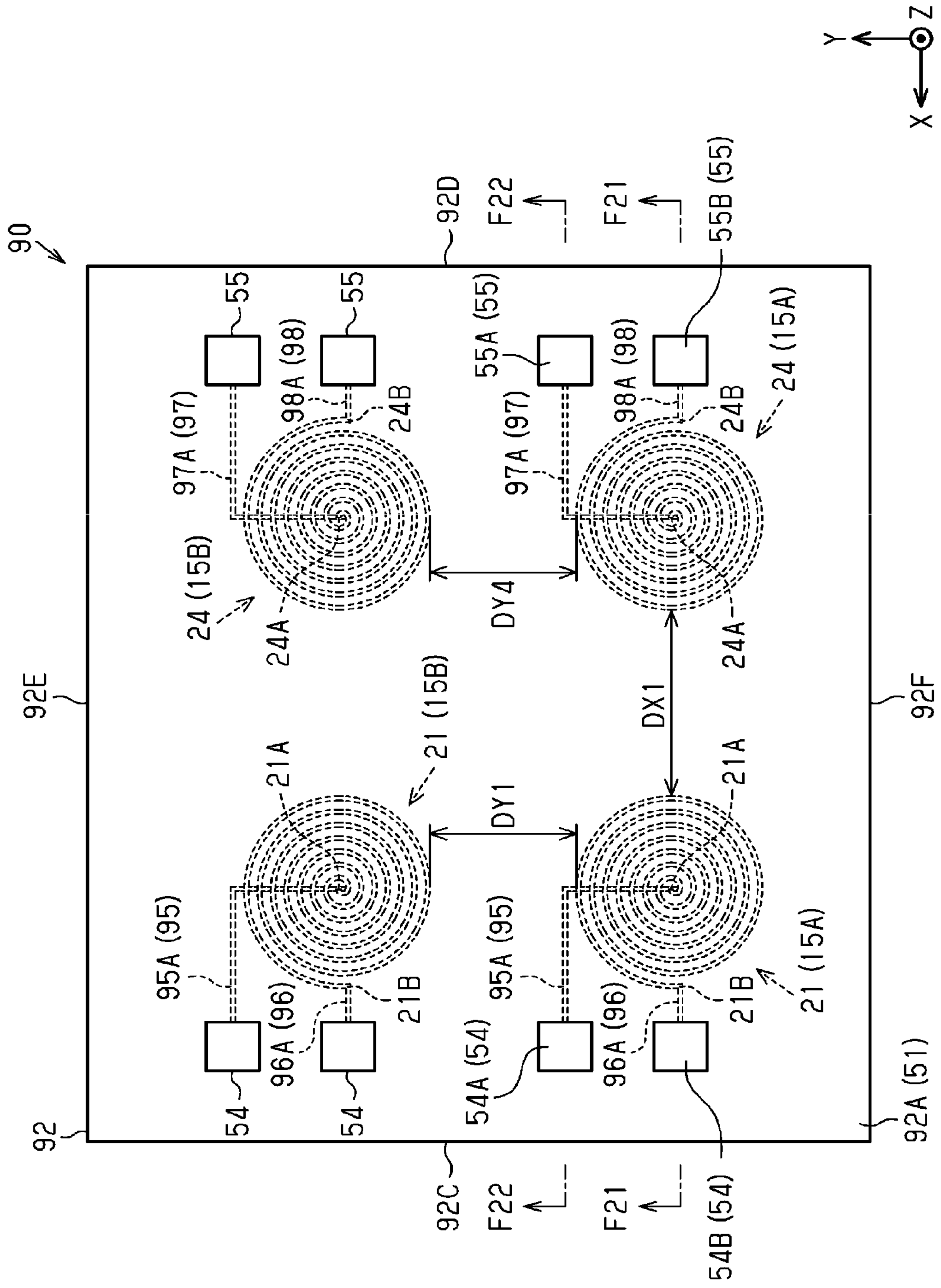
FIG. 20 is a schematic plan view schematically showing a first unit of an insulation chip in the signal transmission device.

A configuration of the signal transmission device 10 according to the third embodiment will be described with reference to FIGS. 18 and 19. FIG. 18 shows a simplified example of a circuit configuration of the signal transmission device 10. FIG. 19 schematically shows an internal configuration of a portion of the signal transmission device 10. FIG. 20 shows an example of a planar structure of the transformer chip 50. In the cross-sectional view of FIG. 19, hatching lines are omitted for easy understanding of the drawings.

As shown in FIG. 18, the transformer 15A in the signal transmission device 10 of the third embodiment includes transformers 18A and 19A connected in series with each other. The transformer 15B includes transformers 18B and 19B connected in series with each other. The transformers 18A and 18B are electrically connected to the primary-side circuit 13. The transformers 18A and 18B include a first coil 21, and a second coil 22 that is electrically insulated from the first coil 21 and is arranged to be magnetically coupled to the first coil 21. The transformers 19A and 19B are electrically connected to the secondary-side circuit 14. The transformers 19A and 19B include a third coil 23, and a fourth coil 24 that is electrically insulated from the third coil 23 and is arranged to be magnetically coupled to the third coil 23.

Here, the first coil 21 of each of the transformers 15A and 15B is an example of a "first insulating element," and the second coil 22 of each of the transformers 15A and 15B is an example of a "second insulating element." Further, the third coil 23 of each of the transformers 15A and 15B is an example of a "third insulating element," and the fourth coil 24 of each of the transformers 15A and 15B is an example of a "fourth insulating element."

The first coil 21 of each of the transformers 15A and 15B is electrically connected to the primary-side circuit 13. In one example, the first end of the first coil 21 of the transformer 15A is electrically connected to the primary-side circuit 13 by the primary signal line 16A, and the second end of the first coil 21 of the transformer 15A is electrically connected to the ground GND1 of the primary-side circuit 13. The first end of the first coil 21 of the transformer 15B is electrically connected to the primary-side circuit 13 by the primary signal line 16B, and the second end of the first coil 21 of the transformer 15B is electrically connected to the ground GND1 of the primary-side circuit 13. Therefore, a potential at the second end of the first coil 21 of each of the transformers 15A and 15B becomes a first reference potential. The first reference potential is, for example, 0 V.

The second coil 22 of each of the transformers 15A and 15B is electrically connected to the third coil 23. In one example, the second coil 22 and the third coil 23 are connected to each other so as to be in an electrically floating state. That is, the first end of the second coil 22 is connected to the first end of the third coil 23, and the second end of the second coil 22 is connected to the second end of the third coil 23. In this way, the second coil 22 and the third coil 23 serve as relay coils that relay the transmission of signals from the first coil 21 to the fourth coil 24.

The fourth coil 24 of each of the transformers 15A and 15B is electrically connected to the secondary-side circuit 14. In one example, the first end of the fourth coil 24 of the transformer 15A is electrically connected to the secondary-side circuit 14 by the secondary signal line 17A, and the second end of the fourth coil 24 of the transformer 15A is electrically connected to the ground GND2 of the secondary-side circuit 14. The first end of the fourth coil 24 of the transformer 15B is electrically connected to the secondary-side circuit 14 by the secondary signal line 17B, and the second end of the fourth coil 24 of the transformer 15B is electrically connected to the ground GND2 of the secondary-side circuit 14. Therefore, a potential at the second end of the fourth coil 24 of each of the transformers 15A and 15B becomes a second reference potential. The ground GND2 of the secondary-side circuit 14 is electrically connected, for example, to a source of a switching element in the switching circuit electrically connected to the secondary-side circuit 14.

As shown in FIG. 19, the transformer chip 50 is a single chip including the transformers 15A and 15B shown in FIG. 18. That is, the transformer chip 50 is a chip dedicated to the transformers 15A and 15B, which is separated from the first chip 30 and the second chip 40.

The transformer chip 50 is formed in a convex shape when viewed from the Y direction. The transformer chip 50 has a first chip front surface 51, a second chip front surface 52, and a chip back surface 53 facing a side opposite the first and second chip front surfaces 51 and 52. The transformer chip 50 is arranged so as to cross the first die pad 61 and the second die pad 71 in the X direction. Therefore, the chip back surface 53 of the transformer chip 50 includes a first region facing the first die pad 61 in the Z direction and a second region facing the second die pad 71 in the Z direction. The first region of the chip back surface 53 is bonded to the first die pad 61 by a conductive bonding material SD, and the second region of the chip back surface 53 is bonded to the second die pad 71 by a conductive bonding material SD. The second chip front surface 52 is located on the opposite side of the first die pad 61 with respect to the first chip front surface 51 in the Z direction. In other words, the first chip front surface 51 is located to be closer to the first die pad 61 than the second chip front surface 52 in the Z direction.

As shown in FIGS. 19 and 20, a plurality of first electrode pads 54 and a plurality of second electrode pads 55 are formed on the first chip front surface 51 of the transformer chip 50. The plurality of first electrode pads 54 are formed at an end closer to the first chip 30 out of both ends of the first chip front surface 51 in the X direction. The plurality of first electrode pads 54 are arranged to be spaced apart from each other in the Y direction. The plurality of second electrode pads 55 are formed at an end closer to the second chip 40 out of both ends of the first chip front surface 51 in the X direction. The plurality of second electrode pads 55 are arranged to be spaced apart from each other in the Y direction.

[Configuration of Transformer Chip]

An example of a configuration of the transformer chip 50 will be described with reference to FIGS. 19 to 27. Similarly to the first embodiment, the transformer chip 50 of the third embodiment includes a first unit 90, and a second unit 100 that is bonded to the first unit 90. Hereinafter, the configuration of the first unit 90 and the configuration of the second unit 100 will be described, and then the configuration of the transformer chip 50, which is a combination of the first unit 90 and the second unit 100, will be described. The first to fourth coils 21 to 24 of the transformer 15B are similar in configuration to the first to fourth coils 21 to 24 of the transformer 15A. Thus, the transformer 15A will be described later, and a detailed description of the transformer 15B will be omitted.

Figure 21:
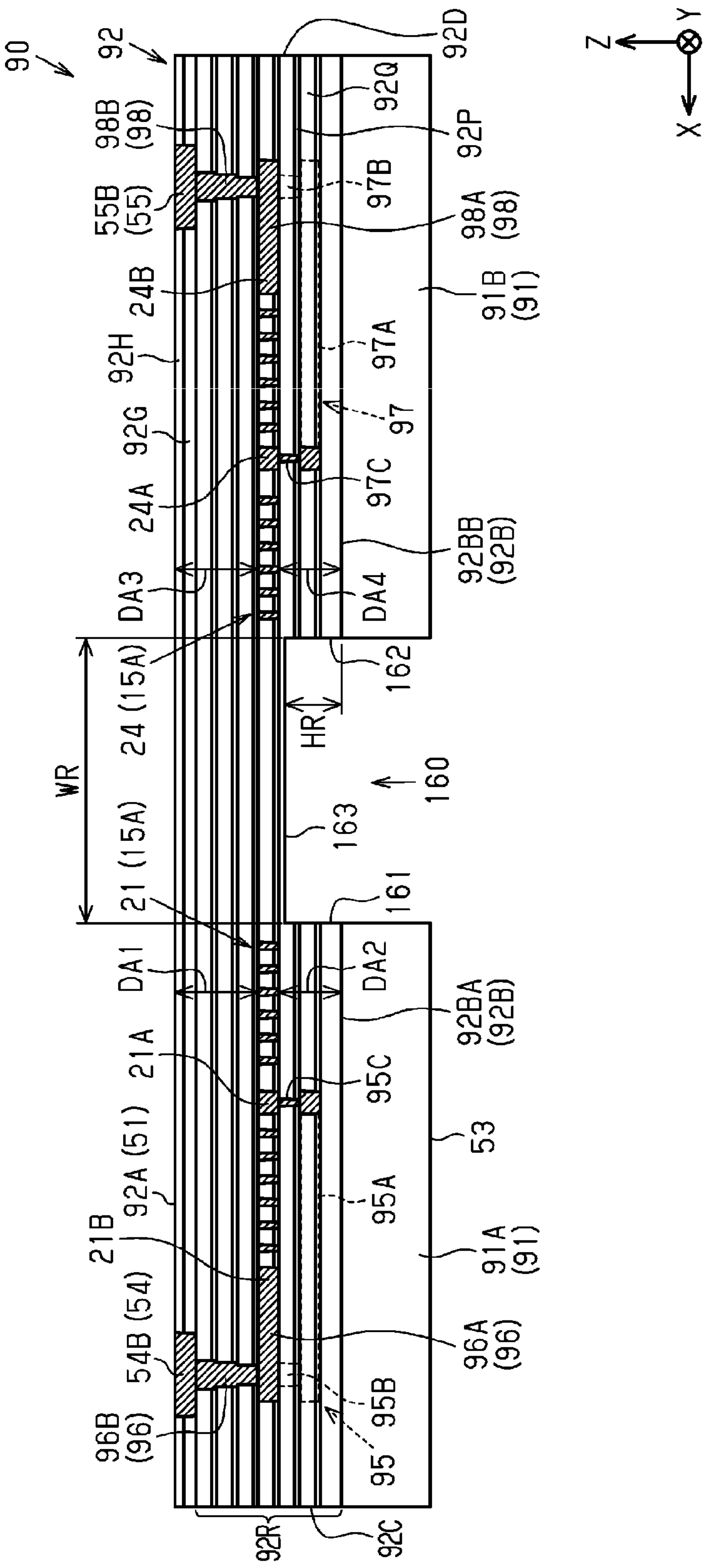
FIG. 21 is a schematic cross-sectional view of the first unit taken along line F21-F21 in FIG. 20.
Figure 22:
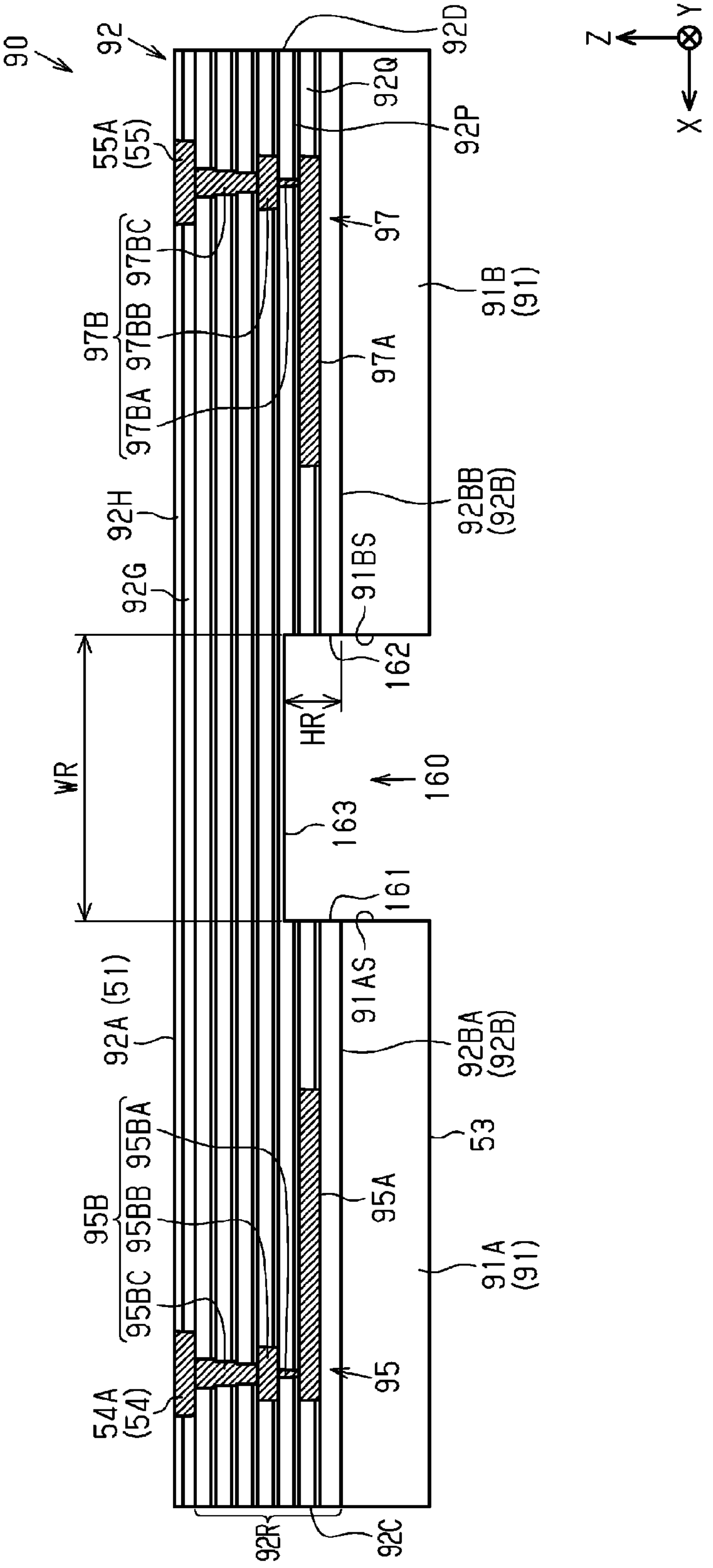
FIG. 22 is a schematic cross-sectional view of the first unit taken along line F22-F22 in FIG. 20.
Figure 24:
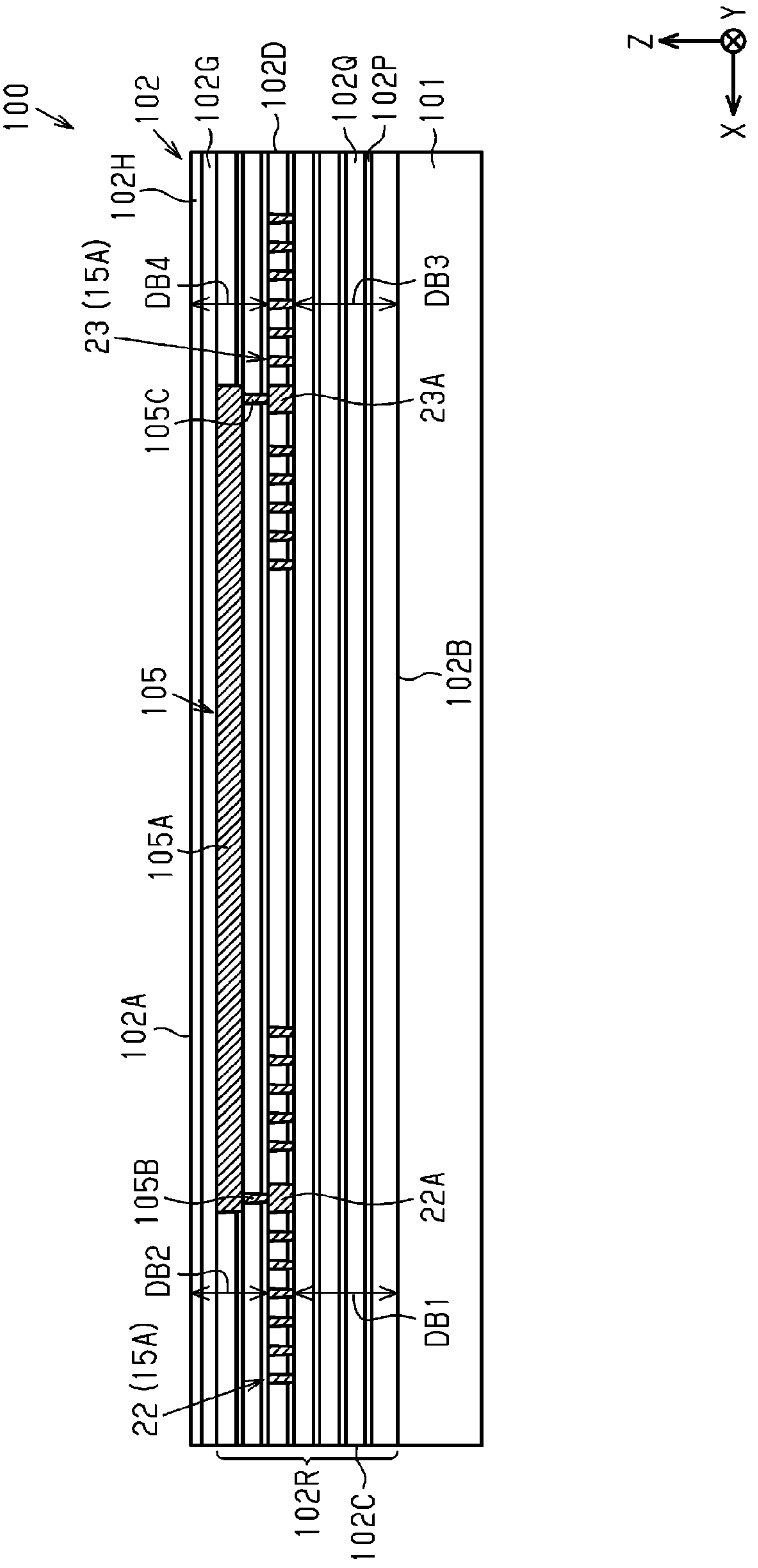
FIG. 24 is a schematic cross-sectional view of the second unit taken along line F24-F24 in FIG. 23.
Figure 25:
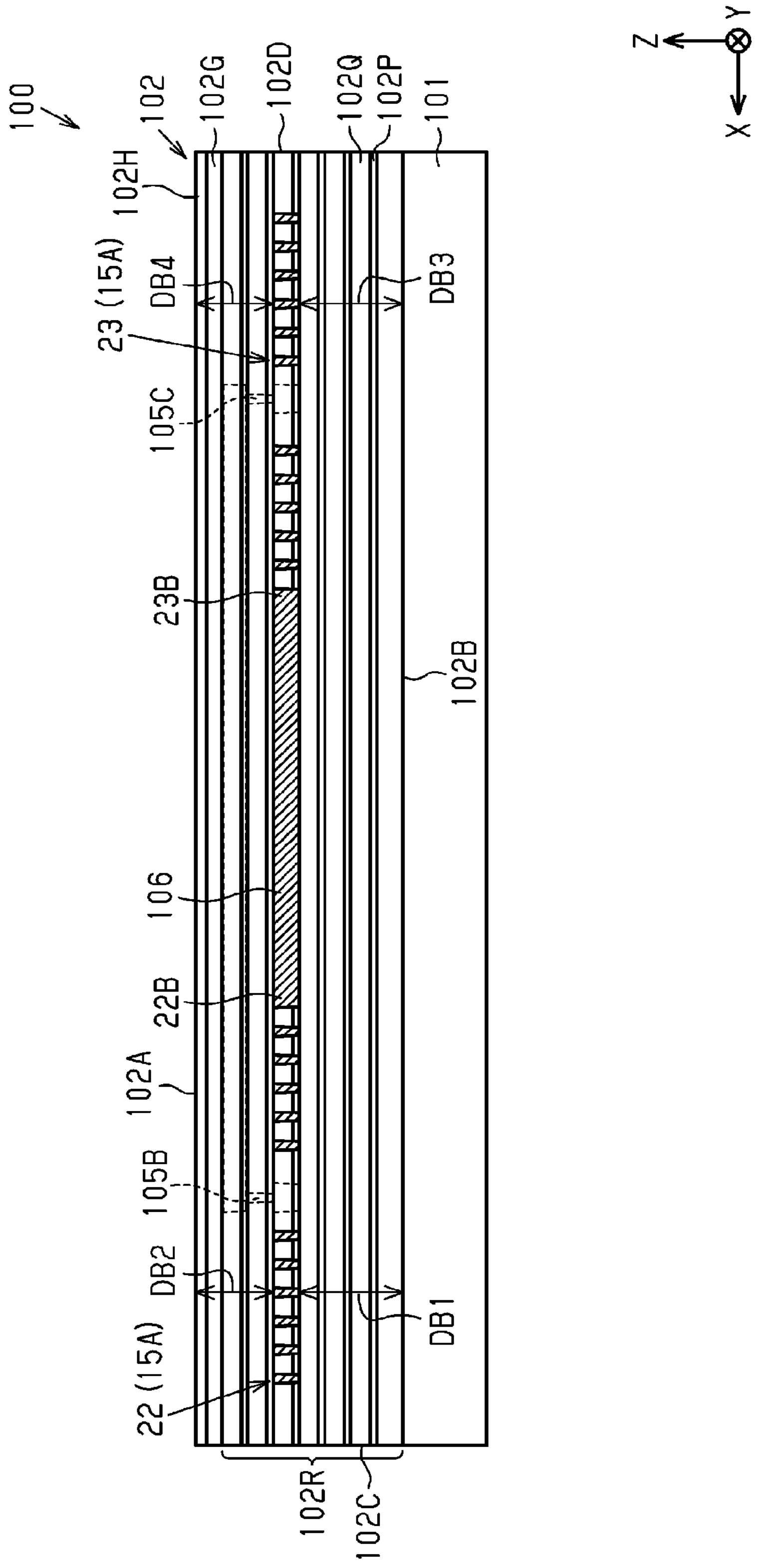
FIG. 25 is a schematic cross-sectional view of the second unit taken along line F25-F25 in FIG. 23.
Figure 27:
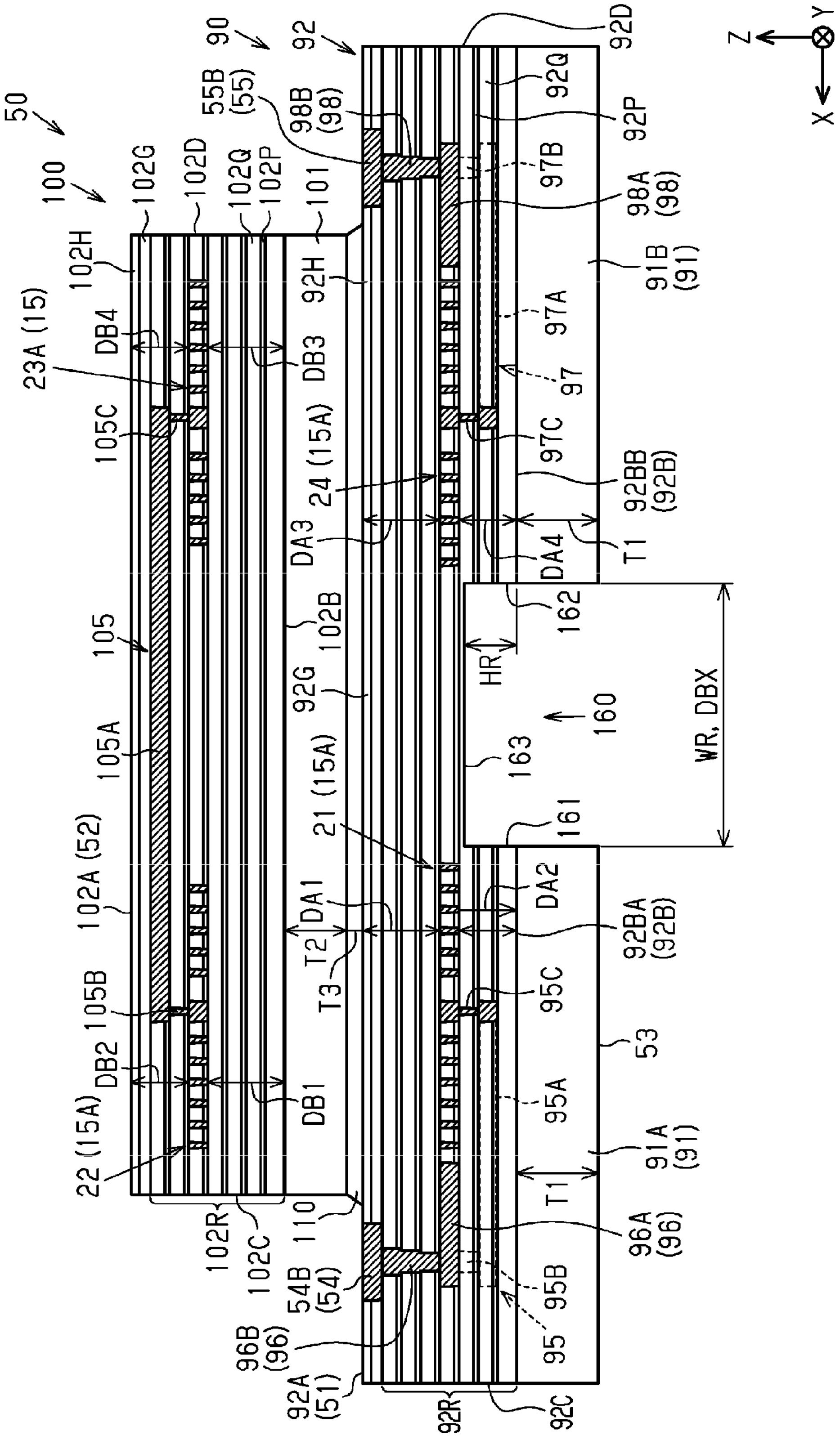
FIG. 27 is a schematic cross-sectional view of the insulation chip taken along line F27-F27 in FIG. 26.

Further, for each of the cross-sectional structure of the first unit 90 in FIGS. 21 and 22, the cross-sectional structure of the second unit 100 in FIGS. 24 and 25, and the cross-sectional structure of the transformer chip 50 in FIG. 27, the dimensions in the Z direction, the dimensions in the X direction, and the dimensions in the Y direction are different from actual ones. To facilitate understanding of the drawings, in each of the cross-sectional structures of FIGS. 21, 22, 24, 25, and 27, the dimension in the Z direction of each constituent element of the transformer chip 50 is shown to be larger than the dimension in the X direction and the dimension in the Y direction. In other words, a ratio of the Z-direction dimension to the X-direction dimension and a ratio of the Z-direction dimension to the Y-direction dimension of each constituent element in each of the cross-sectional structures of FIGS. 21, 22, 24, 25, and 27, are larger than actual ones.

(First Unit)

The configuration of the first unit 90 will be described with reference to FIGS. 19 to 22. FIG. 20 shows a planar structure of the first unit 90 of the transformer chip 50. FIG. 21 shows a cross-sectional structure of the first unit 90 taken along line F21-F21 in FIG. 20, mainly showing cross-sectional structures of the first coil 21 and the fourth coil 24 of the transformer 15A. FIG. 22 shows a cross-sectional structure of the first unit 90 taken along line F22-F22 in FIG. 20, mainly showing cross-sectional structures of the first electrode pad 54, the second electrode pad 55, a first connecting portion 95 and a third connecting portion 97 which will be described later.

As shown in FIG. 19, the first semiconductor substrate 91 of the first unit 90 includes a first substrate 91A and a second substrate 91B arranged to be spaced apart from each other in the X direction, unlike the first embodiment. Each of the first substrate 91A and the second substrate 91B is formed in a rectangular plate shape whose thickness direction is the Z direction. Each of the first substrate 91A and the second substrate 91B is formed of a material containing Si, for example. The constituent materials of the first substrate 91A and the second substrate 91B may be, for example, the same as the first semiconductor substrate 91 of the first embodiment.

In one example, the first substrate 91A and the second substrate 91B have the same thickness. In one example, the dimension in the X direction and the dimension in the Y direction of the first substrate 91A are equal to the dimension in the X direction and the dimension in the Y direction of the second substrate 91B. The sizes of the first substrate 91A and the second substrate 91B may be individually changed arbitrarily.

As shown in FIG. 20, the first unit 90 includes the first coil 21 and the fourth coil 24 of each of the transformers 15A and 15B. More specifically, the first coil 21 and the fourth coil 24 of each of the transformers 15A and 15B are provided in the first element insulating layer 92.

The first coil 21 of the transformer 15A and the first coil 21 of the transformer 15B are arranged at the same position in the X direction and spaced apart from each other in the Y direction. The first coil 21 of the transformer 15A is arranged to be closer to the first element side-surface 92F than the first coil 21 of the transformer 15B. Further, these first coils 21 are arranged to be closer to the first element side-surface 92C than the center of the first element insulating layer 92 in the X direction.

The fourth coil 24 of the transformer 15A and the fourth coil 24 of the transformer 15B are arranged at the same position in the X direction and spaced apart from each other in the Y direction. The fourth coil 24 of the transformer 15A is arranged to be closer to the first element side-surface 92F than the fourth coil 24 of the transformer 15B. Further, these fourth coils 24 are arranged to be closer to the first element side-surface 92D than the center of the first element insulating layer 92 in the X direction. The fourth coil 24 of the transformer 15A is arranged at the same position in the Y direction as the first coil 21 of the transformer 15A. The fourth coil 24 of the transformer 15B is arranged at the same position in the Y direction as the first coil 21 of the transformer 15B. Therefore, the first coil 21 and the fourth coil 24 are arranged to be spaced apart from each other in the X direction. In one example, in a plan view, a distance DX1 between the first coil 21 and the fourth coil 24 in the X direction is larger than a distance DY1 between the first coil 21 of the transformer 15A and the first coil 21 of the transformer 15B in the Y direction. Further, the distance DX1 is larger than a distance DY4 between the fourth coil 24 of the transformer 15A and the fourth coil 24 of the transformer 15B in the Y direction. The distances DX1, DY1, and DY4 may be individually changed arbitrarily. Further, the X direction corresponds to a “first direction.”

The first electrode pad 54 is arranged to be closer to the first element side-surface 92C than the first coil 21 in the X direction. In the example shown in FIG. 20, four first electrode pads 54 are provided. More specifically, two first electrode pads 54 are provided to correspond to the first coils 21 of the transformer 15A, and two first electrode pads 54 are provided to correspond to the first coils 21 of the transformer 15B.

One of the two first electrode pads 54 corresponding to the first coil 21 of the transformer 15A is arranged at the same position as the first coil 21 of the transformer 15A in the Y direction. The other of the two first electrode pads 54 is arranged to be closer to the first element side-surface 92E than the first coil 21 of the transformer 15A in the Y direction.

One of the two first electrode pads 54 corresponding to the first coil 21 of the transformer 15B is arranged at the same position as the first coil 21 of the transformer 15B in the Y direction. The other of the two first electrode pads 54 is arranged to be closer to the first element side-surface 92E than the first coil 21 of the transformer 15B in the Y direction. The arrangement position of the first electrode pads 54 in the Y direction may be changed arbitrarily.

The second electrode pad 55 is arranged to be closer to the first element side-surface 92D than the fourth coil 24 in the X direction. In the example shown in FIG. 20, four second electrode pads 55 are provided. More specifically, two second electrode pads 55 are provided to correspond to the fourth coil 24 of the transformer 15A, and two second electrode pads 55 are provided to correspond to the fourth coil 24 of the transformer 15B. These four second electrode pads 55 are arranged at the same positions as the first electrode pad 54 in the Z direction.

One of the two second electrode pads 55 corresponding to the fourth coil 24 of the transformer 15A is arranged at the same position as the fourth coil 24 of the transformer 15A in the Y direction. The other of the two second electrode pads 55 is arranged to be closer to the first element side-surface 92E than the fourth coil 24 of the transformer 15A in the Y direction.

One of the two second electrode pads 55 corresponding to the fourth coil 24 of the transformer 15B is arranged at the same position as the fourth coil 24 of the transformer 15B in the Y direction. The other of the two second electrode pads 55 is arranged to be closer to the first element side-surface 92E than the fourth coil 24 of the transformer 15B in the Y direction. The arrangement position of the second electrode pads 55 in the Y direction may be changed arbitrarily. Further, the numbers of first electrode pads 54 and second electrode pads 55 are not limited to the example shown in FIG. 20, and may be changed arbitrarily.

As shown in FIG. 21, the first electrode pad 54 and the second electrode pad 55 are formed to be flush with the first element front surface 92A of the first element insulating layer 92. In one example, the first electrode pad 54 and the second electrode pad 55 are provided on an insulator 92R and is covered with a protective layer 92G and a passivation layer 92H. On the other hand, the first electrode pad 54 and the second electrode pad 55 are formed to be flush with the passivation layer 92H. The first electrode pad 54 and the second electrode pad 55 are provided on the first element insulating layer 92 so as to be exposed from the first element front surface 92A of the first element insulating layer 92.

The first coil 21 is buried in the first element insulating layer 92 at a position spaced apart from the first element front surface 92A of the first element insulating layer 92 in the Z direction. Further, the first coil 21 is arranged at a position spaced apart from the first element back surface 92B in the Z direction. That is, the first coil 21 is not exposed from the first element insulating layer 92. In the example shown in FIG. 21, the first coil 21 is arranged to be closer to the first element back surface 92B than the first element front surface 92A of the first element insulating layer 92 in the Z direction. In other words, the distance DA1 between the first coil 21 and the first element front surface 92A in the Z direction is larger than the distance DA2 between the first coil 21 and the first element back surface 92B in the Z direction. It can also be said that the first coil 21 is arranged to be closer to the first substrate 91A than the first element front surface 92A in the Z direction. In one example, the distance DA1 may be three times or less than the distance DA2. In one example, the distance DA1 may be twice or less than the distance DA2. The distances DA1 and DA2 may be changed arbitrarily. In one example, the distance DA1 may be larger than twice the distance DA2.

The fourth coil 24 is buried in the first element insulating layer 92 at a position spaced apart from the first element front surface 92A of the first element insulating layer 92 in the Z direction. Further, the fourth coil 24 is arranged at a position spaced apart from the first element back surface 92B in the Z direction. That is, the fourth coil 24 is not exposed from the first element insulating layer 92. In the example shown in FIG. 21, the fourth coil 24 is arranged to be closer to the first element back surface 92B than the first element front surface 92A of the first element insulating layer 92 in the Z direction. In other words, a distance DA3 between the fourth coil 24 and the first element front surface 92A in the Z direction is larger than a distance DA4 between the fourth coil 24 and the first element back surface 92B in the Z direction. It can also be said that the fourth coil 24 is arranged to be closer to the second substrate 91B than the first element front surface 92A in the Z direction. In one example, the distance DA3 may be three times or less than the distance DA4. In one example, the distance DA3 may be twice or less than the distance DA4. The distances DA3 and DA4 may be changed arbitrarily. In one example, the distance DA3 may be larger than twice the distance DA4. As described above, the fourth coil 24 is arranged at the same position as the first coil 21 in the Z direction. The fourth coil 24 may be arranged at a different position from the first coil 21 in the Z direction by changing the distances DA3 and DA4.

The first unit 90 includes the first connecting portion 95 connected to the first end portion 21A of the first coil 21 and a second connecting portion 96 connected to the second end portion 21B of the first coil 21. In the following description, the two first electrode pads 54 corresponding to the first coil 21 of the transformer 15A shown in FIG. 20 are referred to as a "first electrode pad 54A" and a "first electrode pad 54B."

As shown in FIG. 20, the first connecting portion 95 is connected to the first electrode pad 54A. That is, the first connecting portion 95 electrically connects the first end portion 21A of the first coil 21 and the first electrode pad 54A. The first connecting portion 95 is buried in the first element insulating layer 92. That is, the first coil 21 and the first electrode pad 54A are electrically connected to each other within the first element insulating layer 92.

As shown in FIGS. 20 to 22, the first connecting portion 95 includes a first wiring layer 95A, a first connection wiring 95B, and a via 95C. As shown in FIGS. 21 and 22, the first wiring layer 95A is arranged to be closer to the first element back surface 92B than the first coil 21 in the Z direction. It can also be said that the first wiring layer 95A is arranged between the first coil 21 and the first element back surface 92B in the Z direction. As shown in FIG. 20, the first wiring layer 95A includes a first portion extending in the Y direction from the first end portion 21A of the first coil 21 in a plan view, and a second portion extending in the X direction from the first portion toward the first electrode pad 54A. In one example, the first portion and the second portion are integrated. The second portion is arranged outward from the winding portion of the first coil 21 in the X direction.

As shown in FIG. 22, the first connection wiring 95B electrically connects the first wiring layer 95A and the first electrode pad 54A. The first connection wiring 95B is provided at a position overlapping both the first electrode pad 54A and the first wiring layer 95A in a plan view. The first connection wiring 95B is formed as a via extending in the Z direction. In the example shown in FIG. 22, the first connection wiring 95B includes a first via 95BA, an intermediate wiring layer 95BB, and a second via 95BC. The first via 95BA is connected to the first wiring layer 95A. The intermediate wiring layer 95BB is formed on the first via 95BA. The intermediate wiring layer 95BB is connected to the first via 95BA. The second via 95BC is formed on the intermediate wiring layer 95BB. The second via 95BC connects the first electrode pad 54A and the intermediate wiring layer 95BB. A length of the second via 95BC in the Z direction is longer than a length of the first via 95BA in the Z direction.

As shown in FIG. 21, the via 95C electrically connects the first wiring layer 95A and the first end portion 21A of the first coil 21. The via 95C is arranged at a position overlapping both the first end portion 21A of the first coil 21 and the first wiring layer 95A in a plan view. The first wiring layer 95A, the first connection wiring 95B, and the via 95C are made of a material containing one or more appropriately selected from the group of, for example, Ti, TiN, Au, Ag, Cu, Al, and W. In one example, the first wiring layer 95A may be formed of the same material as the first coil 21. In one example, the first connection wiring 95B and the via 95C may be formed of a different material from the first coil 21.

As shown in FIG. 21, the second connecting portion 96 is connected to the first electrode pad 54B. That is, the second connecting portion 96 electrically connects the second end portion 21B of the first coil 21 and the first electrode pad 54B. The second connecting portion 96 is buried in the first element insulating layer 92. That is, the first coil 21 and the first electrode pad 54B are electrically connected to each other within the first element insulating layer 92.

As shown in FIGS. 20 and 21, the second connecting portion 96 includes a second wiring layer 96A and a second connection wiring 96B. The second wiring layer 96A is arranged at the same position as the first coil 21 in the Z direction. That is, the second wiring layer 96A is arranged to be closer to the first element front surface 92A than the first wiring layer 95A. The second wiring layer 96A extends in the X direction from the second end portion 21B of the first coil 21 toward the first electrode pad 54B in a plan view.

The second connection wiring 96B electrically connects the second wiring layer 96A and the first electrode pad 54B. The second connection wiring 96B is provided at a position overlapping both the first electrode pad 54B and the second wiring layer 96A in a plan view. The second connection wiring 96B is formed as a via extending in the Z direction. The second wiring layer 96A and the second connection wiring 96B are made of a material containing one or more appropriately selected from the group of, for example, Ti, TiN, Au, Ag, Cu, Al, and W. In one example, the second wiring layer 96A may be formed of the same material as the first coil 21. In one example, the second connection wiring 96B may be formed of a different material from the first coil 21.

As shown in FIGS. 20 to 22, the first unit 90 includes a third connecting portion 97 connected to the first end portion 24A of the fourth coil 24, and a fourth connecting portion 98 connected to the second end portion 24B of the fourth coil 24. In the following description, two second electrode pads 55 corresponding to the fourth coil 24 of the transformer 15A shown in FIG. 20 are referred to as a "second electrode pad 55A" and a "second electrode pad 55B."

As shown in FIGS. 20 and 22, the third connecting portion 97 is connected to the second electrode pad 55A. That is, the third connecting portion 97 electrically connects the first end portion 24A of the fourth coil 24 and the second electrode pad 55A. The third connecting portion 97 is buried in the first element insulating layer 92. That is, the fourth coil 24 and the second electrode pad 55A are electrically connected to each other within the first element insulating layer 92.

As shown in FIGS. 20 to 22, the third connecting portion 97 includes a third wiring layer 97A, a third connection wiring 97B, and a via 97C. As shown in FIGS. 21 and 22, the third wiring layer 97A is arranged to be closer to the first element back surface 92B than the fourth coil 24 in the Z direction. It can also be said that the third wiring layer 97A is arranged between the fourth coil 24 and the first element back surface 92B in the Z direction. As shown in FIG. 20, the third wiring layer 97A includes a first portion extending in the Y direction from the first end portion 24A of the fourth coil 24 in a plan view, and a second portion extending in the X direction from the first portion toward the second electrode pad 55A. In one example, the first portion and the second portion are integrated. The second portion is arranged outward from the winding portion of the fourth coil 24 in the X direction.

As shown in FIG. 22, the third connection wiring 97B electrically connects the third wiring layer 97A and the second electrode pad 55A. The third connection wiring 97B is provided at a position overlapping both the second electrode pad 55A and the third wiring layer 97A in a plan view. The third connection wiring 97B is formed as a via extending in the Z direction. In the example shown in FIG. 22, the third connection wiring 97B includes a first via 97BA, an intermediate wiring layer 97BB, and a second via 97BC. The first via 97BA is connected to the third wiring layer 97A.

The intermediate wiring layer 97BB is formed on the first via 97BA. The intermediate wiring layer 97BB is connected to the first via 97BA. The second via 97BC is formed on the intermediate wiring layer 97BB. The second via 97BC connects the second electrode pad 55A and the intermediate wiring layer 97BB. A length of the second via 97BC in the Z direction is longer than a length of the first via 97BA in the Z direction.

As shown in FIG. 21, the via 97C electrically connects the third wiring layer 97A and the first end portion 24A of the fourth coil 24. The via 97C is arranged at a position overlapping both the first end portion 24A of the fourth coil 24 and the third wiring layer 97A in a plan view. The third wiring layer 97A, the third connection wiring 97B, and the via 97C are made of a material containing one or more appropriately selected from the group of, for example, Ti, TiN, Au, Ag, Cu, Al, and W. In one example, the third wiring layer 97A may be formed of the same material as the fourth coil 24. In one example, the third connection wiring 97B and the via 97C may be formed of a different material from the fourth coil 24.

As shown in FIG. 21, the fourth connecting portion 98 is connected to the second electrode pad 55B. That is, the fourth connecting portion 98 electrically connects the second end portion 24B of the fourth coil 24 and the second electrode pad 55B. The fourth connecting portion 98 is buried in the first element insulating layer 92. That is, the fourth coil 24 and the second electrode pad 55B are electrically connected to each other within the first element insulating layer 92.

As shown in FIGS. 20 and 21, the fourth connecting portion 98 includes a fourth wiring layer 98A and a fourth connection wiring 98B. The fourth wiring layer 98A is arranged at the same position as the fourth coil 24 in the Z direction. That is, the fourth wiring layer 98A is arranged to be closer to the first element front surface 92A than the third wiring layer 97A. The fourth wiring layer 98A extends in the X direction from the second end portion 24B of the fourth coil 24 toward the second electrode pad 55B in a plan view.

The fourth connection wiring 98B electrically connects the fourth wiring layer 98A and the second electrode pad 55B. The fourth connection wiring 98B is provided at a position overlapping both the second electrode pad 55B and the fourth wiring layer 98A in a plan view. The fourth connection wiring 98B is formed as a via extending in the Z direction. The fourth wiring layer 98A and the fourth connection wiring 98B are made of a material containing one or more appropriately selected from the group of, for example, Ti, TiN, Au, Ag, Cu, Al, and W. In one example, the fourth wiring layer 98A may be formed of the same material as the fourth coil 24. In one example, the fourth connection wiring 98B may be formed of a different material from the fourth coil 24.

As shown in FIGS. 21 and 22, the first element insulating layer 92 has a concave portion 160 recessed from the first element back surface 92B toward the first element front surface 92A. The concave portion 160 extends along the Y direction in a plan view. In one example, the concave portion 160 is formed to extend from the first element side-surface 92E to the first element side-surface 92F (both see FIG. 20) of the first element insulating layer 92. That is, the concave portion 160 is formed over the entire first element insulating layer 92 in the Y direction.

The concave portion 160 is formed in a portion of the first element insulating layer 92 between the first substrate 91A and the second substrate 91B that are separated from each other in the X direction. Therefore, it can be said that the first substrate 91A and the second substrate 91B are arranged in a distributed manner on both sides of the concave portion 160 in the X direction.

When viewed from the Y direction, the concave portion 160 is formed, for example, in a rectangular concave shape. The concave portion 160 has a first side-surface 161 and a second side-surface 162 that are arranged to face each other in the X direction, and a bottom surface 163 that connects the first side-surface 161 and the second side-surface 162 in the Y direction. The shape of the concave portion 160 viewed from the Y direction may be changed arbitrarily.

As shown in FIG. 22, the first side-surface 161 is located to be closer to the first element side-surface 92C than the second side-surface 162. In one example, the first side-surface 161 is formed to be flush with the substrate side surface 91AS of the first substrate 91A. In the example of FIG. 22, the first side-surface 161 extends along the Z direction when viewed from the Y direction.

The second side-surface 162 is located to be closer to the first element side-surface 92D than the first side-surface 161. In one example, the second side-surface 162 is formed to be flush with the substrate side surface 91BS of the second substrate 91B. In the example of FIG. 22, the second side-surface 162 extends along the Z direction when viewed from the Y direction.

The bottom surface 163 is located to be closer to the first element back surface 92B than the first element front surface 92A of the first element insulating layer 92 in the Z direction. In other words, the first element insulating layer 92 is not divided into two element insulating layers by the concave portion 160. Here, since the first element front surface 92A forms a bonding surface with the second unit 100, it can be said that the bottom surface 163 of the concave portion 160 is formed to be closer to the first semiconductor substrate 91 than the bonding surface between the first unit 90 and the second unit 100 in the Z direction. In one example, as shown in FIG. 21, the bottom surface 163 is formed to be closer to the first element back surface 92B than the first coil 21 and the fourth coil 24 in the Z direction.

The position of the bottom surface 163 in the Z direction may be changed arbitrarily. In one example, the bottom surface 163 may be formed to be closer to the first element front surface 92A than the first coil 21 and the fourth coil 24 in the Z direction.

The first element back surface 92B is divided into two element back surfaces 92BA and 92BB by the concave portion 160. The element back surface 92BA and the element back surface 92BB are arranged to be spaced apart from each other in the X direction. The element back surface 92BA constitutes a portion of the first element back surface 92B that is closer to the first element side-surface 92C than the concave portion 160. The element back surface 92BB constitutes a portion of the first element back surface 92B that is closer to the first element side-surface 92D than the concave portion 160.

The first substrate 91A is formed on the element back surface 92BA. In one example, the first substrate 91A is in contact with the entire element back surface 92BA. The second substrate 91B is formed on the element back surface 92BB. In one example, the second substrate 91B is in contact with the entire element back surface 92BB.

(Second Unit)

Figure 23:
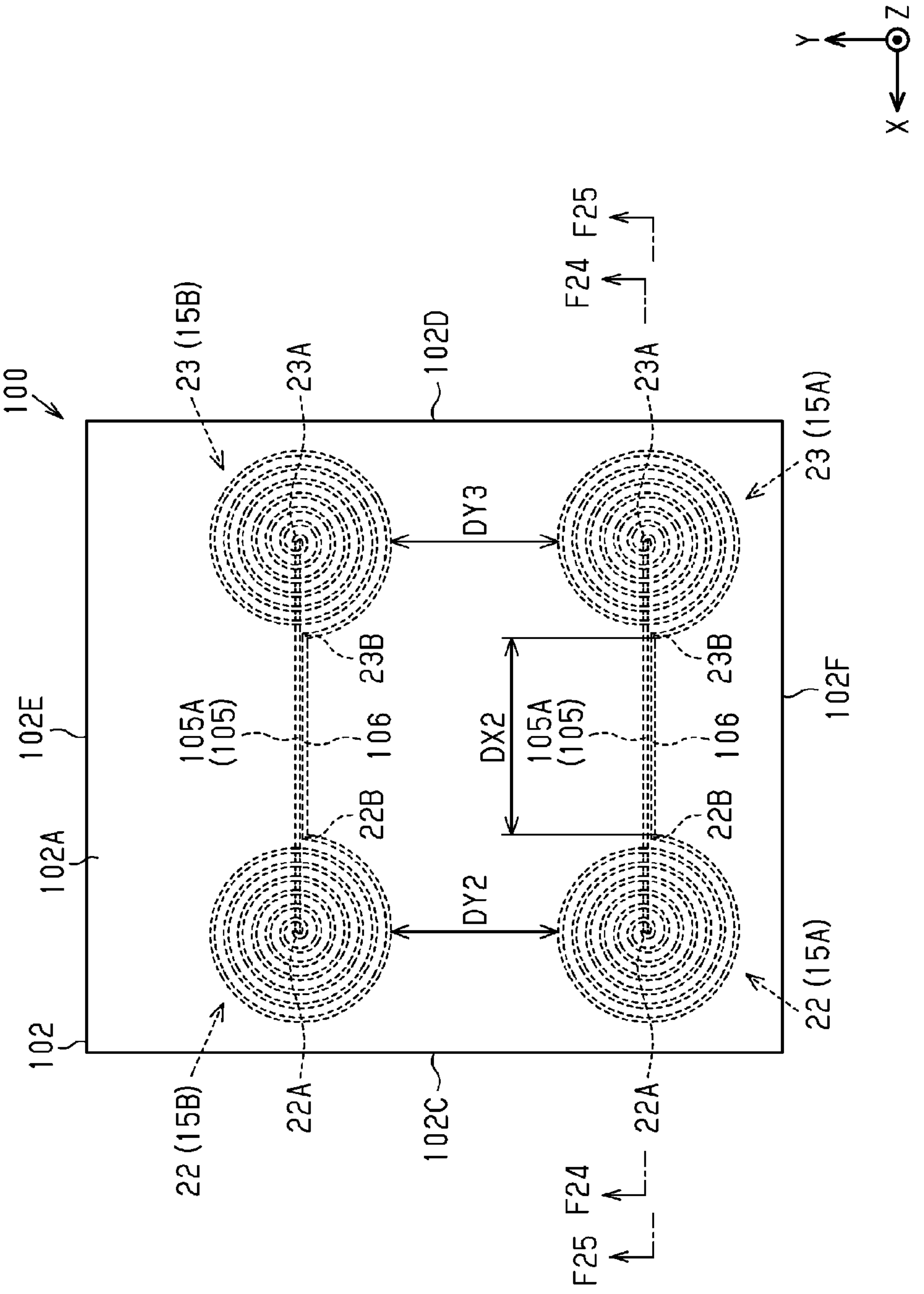
FIG. 23 is a schematic plan view schematically showing a second unit of the insulation chip in the signal transmission device.

A configuration of the second unit 100 will be described with reference to FIGS. 19 and 23 to 25. FIG. 23 shows a planar structure of the second unit 100 of the transformer chip 50. FIG. 24 shows a cross-sectional structure of the second unit 100 taken along line F24-F24 in FIG. 23, mainly showing cross-sectional structures of the second coil 22 and the third coil 23 of the transformer 15A, and a first connecting portion 105 which will be described later. FIG. 25 shows a cross-sectional structure of the second unit 100 taken along line F25-F25 in FIG. 23, mainly showing cross-sectional structures of the second coil 22 and the third coil 23 of the transformer 15A, and a second connecting portion 106 which will be described later.

As shown in FIG. 19, the second unit 100 includes a second semiconductor substrate 101, a second element insulating layer 102, and a second coil 22 and a third coil 23 of each of the transformers 15A and 15B. Configurations of the second semiconductor substrate 101 and the second element insulating layer 102 are similar to those in the first embodiment. The second coil 22 and the third coil 23 of each of the transformers 15A and 15B are provided within the second element insulating layer 102. In one example, the second semiconductor substrate 101 includes the same impurity concentration and resistivity as those in the first embodiment. In one example, the thickness T2 of the second semiconductor substrate 101 is the same as in the first embodiment.

As shown in FIG. 23, the second coil 22 of the transformer 15A and the second coil 22 of the transformer 15B are arranged at the same positions in the X direction and spaced apart from each other in the Y direction. The second coil 22 of the transformer 15A is arranged to be closer to the second element side-surface 102F than the second coil 22 of the transformer 15B. Further, these second coils 22 are arranged to be closer to the second element side-surface 102C than the center of the second element insulating layer 102 in the X direction.

The third coil 23 of the transformer 15A and the third coil 23 of the transformer 15B are arranged at the same positions in the X direction and spaced apart from each other in the Y direction. The third coil 23 of the transformer 15A is arranged to be closer to the second element side-surface 102F than the third coil 23 of the transformer 15B. Further, these third coils 23 are arranged to be closer to the second element side-surface 102D than the center of the second element insulating layer 102 in the X direction. The third coil 23 of the transformer 15A is arranged at the same position in the Y direction as the second coil 22 of the transformer 15A. The third coil 23 of the transformer 15B is arranged at the same position in the Y direction as the second coil 22 of the transformer 15B. In one example, in a plan view, a distance DX2 between the second coil 22 and the third coil 23 in the X direction is larger than a distance DY2 between the second coil 22 of the transformer 15A and the second coil 22 of the transformer 15B in the Y direction. Further, the distance DX2 is larger than a distance DY3 between the third coil 23 of the transformer 15A and the third coil 23 of the transformer 15B in the Y direction. The distances DX2, DY2, and DY3 may be individually changed arbitrarily.

As shown in FIG. 24, the second coil 22 is buried in the second element insulating layer 102 at a position spaced apart from the second element front surface 102A of the second element insulating layer 102 in the Z direction. Further, the second coil 22 is arranged at a position spaced apart from the second element back surface 102B in the Z direction. That is, the second coil 22 is not exposed from the second element insulating layer 102. In the example shown in FIG. 24, the second coil 22 is arranged to be closer to the second element front surface 102A than the second element back surface 102B of the second element insulating layer 102 in the Z direction. In other words, the distance DB1 between the second coil 22 and the second element back surface 102B in the Z direction is larger than the distance DB2 between the second coil 22 and the second element front surface 102A in the Z direction. In one example, the distance DB1 may be three times or less than the distance DB2. In one example, the distance DB1 may be twice or less than the distance DB2. A relationship between the distance DB1 and the distance DB2 may be changed arbitrarily. In one example, the distance DB1 may be larger than twice the distance DB2.

The third coil 23 is buried in the second element insulating layer 102 at a position spaced apart from the second element front surface 102A of the second element insulating layer 102 in the Z direction. Further, the third coil 23 is arranged at a position spaced apart from the second element back surface 102B in the Z direction. That is, the third coil 23 is not exposed from the second element insulating layer 102. In the example shown in FIG. 24, the third coil 23 is arranged to be closer to the second element front surface 102A than the second element back surface 102B of the second element insulating layer 102 in the Z direction. In other words, a distance DB3 between the third coil 23 and the second element back surface 102B in the Z direction is larger than a distance DB4 between the third coil 23 and the second element front surface 102A in the Z direction. In one example, the distance DB3 may be three times or less than the distance DB4. In one example, the distance DB3 may be twice or less than the distance DB4. A relationship between the distance DB3 and the distance DB4 may be changed arbitrarily. In one example, the distance DB3 may be larger than twice the distance DB4. In this way, the third coil 23 is arranged at the same position as the second coil 22 in the Z direction. The third coil 23 may be arranged at a different position from the second coil 22 in the Z direction by changing the distances DB3 and DB4.

As shown in FIG. 23, the third coil 23 is formed in a spiral shape in a plan view. The third coil 23 includes a first end portion 23A and a second end portion 23B. The first end portion 23A constitutes an inner end of a winding portion of the third coil 23 in a plan view. The second end portion 23B constitutes an outer end of the winding portion of the third coil 23 in a plan view. The number of turns of the third coil 23 is, for example, the same as the number of turns of the second coil 22. The number of turns of the third coil 23 may be arbitrarily changed according to electrical characteristics of the transformer chip 50.

The third coil 23 is made of a material including one or more appropriately selected from the group of, for example, Ti, TiN, Au, Ag, Cu, Al, and W. In one example, the third coil 23 is formed of a material containing Cu. That is, the third coil 23 may be formed of the same material as the second coil 22. The material constituting the third coil 23 may be changed arbitrarily.

As shown in FIGS. 24 and 25, the second unit 100 includes a first connecting portion 105 that connects the first end portion 22A of the second coil 22 and the first end portion 23A of the third coil 23, and a second connecting portion 106 that connects the second end portion 22B of the second coil 22 and the second end portion 23B of the third coil 23.

The first connecting portion 105 and the second connecting portion 106 are provided within the second element insulating layer 102. That is, the second coil 22 and the third coil 23 are electrically connected to each other within the second element insulating layer 102 by the first connecting portion 105 and the second connecting portion 106. In this way, in the third embodiment, the second coil 22, the third coil 23, the first connecting portion 105, and the second connecting portion 106 are in an electrically floating state.

As shown in FIGS. 23 and 24, the first connecting portion 105 includes a wiring layer 105A, a via 105B, and a via 105C. The wiring layer 105A is arranged to be closer to the second element front surface 102A than the second coil 22 and the third coil 23 in the Z direction. It can also be said that the wiring layer 105A is arranged between the second coil 22 and the third coil 23, and the second element front surface 102A in the Z direction. As shown in FIG. 23, the wiring layer 105A extends in the X direction in a plan view. Further, the wiring layer 105A extends so as to cross both the winding portion of the second coil 22 and the winding portion of the third coil 23 in a plan view.

The via 105B electrically connects the wiring layer 105A and the first end portion 22A of the second coil 22. The via 105B is provided at a position overlapping both the first end portion 22A and the wiring layer 105A in a plan view.

The via 105C electrically connects the wiring layer 105A and the first end portion 23A of the third coil 23. The via 105C is provided at a position overlapping both the first end portion 23A and the wiring layer 105A in a plan view. The wiring layer 105A, the via 105B, and the via 105C are made of a material containing one or more appropriately selected from the group of, for example, Ti, TiN, Au, Ag, Cu, Al, and W. In one example, the wiring layer 105A may be formed of the same material as the second coil 22 and the third coil 23. In one example, the via 105B and the via 105C may be formed of a different material from the second coil 22 and the third coil 23.

As shown in FIG. 23, the second connecting portion 106 connects the second end portion 22B of the second coil 22 and the second end portion 23B of the third coil 23. In a plan view, the second connecting portion 106 extends in the X direction. As shown in FIG. 25, the second connecting portion 106 is arranged at the same position as the second coil 22 and the third coil 23 in the Z direction.

The second connecting portion 106 is made of a material including one or more appropriately selected from the group of, for example, Ti, TiN, Au, Ag, Cu, Al, and W. In one example, the second connecting portion 106 may be formed of the same material as the second coil 22 and the third coil 23. In one example, the second connecting portion 106 may be formed of a different material from the second coil 22 and the third coil 23.

(Transformer Chip)

Figure 26:
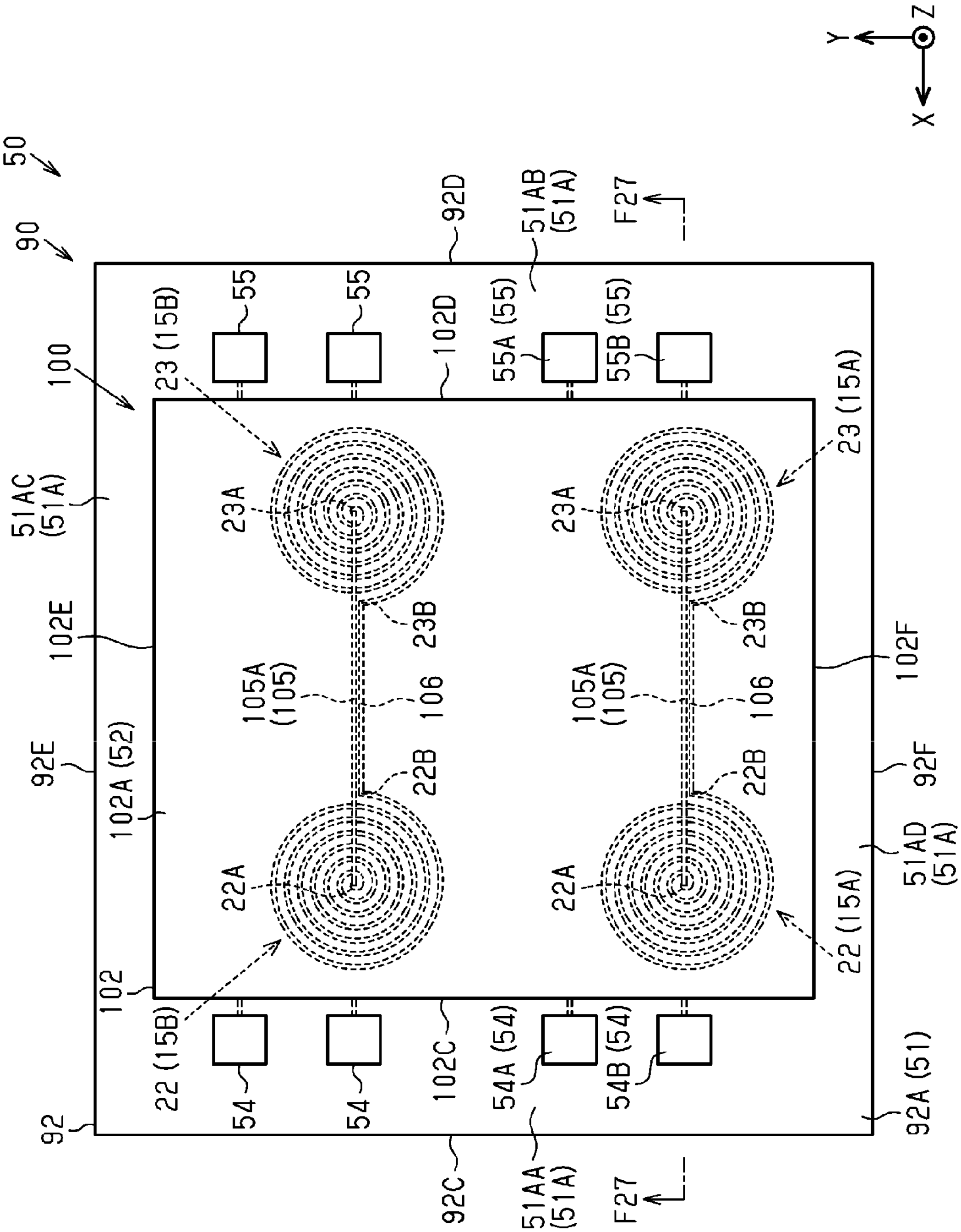
FIG. 26 is a schematic plan view schematically showing the insulation chip.

A configuration of the transformer chip 50 will be described with reference to FIGS. 26 and 27. FIG. 26 shows a planar structure of the transformer chip 50. FIG. 27 shows a cross-sectional structure of the transformer chip 50 taken along line F27-F27 in FIG. 26, mainly showing cross-sectional structures of the first to fourth coils 21 to 24 of the transformer 15A.

As shown in FIGS. 26 and 27, the second unit 100 is smaller in size than the first unit 90 in a plan view. More specifically, in a plan view, the dimension in the X direction of the second unit 100 is smaller than the dimension in the X direction of the first unit 90, and the dimension in the Y direction of the second unit 100 is smaller than the dimension in the Y direction of the first unit 90. And, in a plan view, the second unit 100 is arranged at the center of the first unit 90 in the X direction and the Y direction. Therefore, as shown in FIG. 26, the first element front surface 92A of the first element insulating layer 92 includes a rectangular frame-shaped exposure region 51A surrounding the second unit 100 in a plan view. This exposure region 51A constitutes the first chip front surface 51 of the transformer chip 50.

The exposure region 51A includes a first region 51AA between the first element side-surface 92C and the second element side-surface 102C in the X direction, a second region 51AB between the first element side-surface 92D and the second element side-surface 102D in the X direction, a third region 51AC between the first element side-surface 92E and the second element side-surface 102E in the Y direction, and a fourth region 51AD between the first element side-surface 92F and the second element side-surface 102F in the Y direction. In the example shown in FIG. 26, a width (the dimension in the X direction) of the first region 51AA is larger than a width (the dimension in the Y direction) of the third region 51AC and a width (the dimension in the Y direction) of the fourth region 51AD. A width (the dimension in the X direction) of the second region 51AB is larger than a width of the third region 51AC and a width of the fourth region 51AD. The width of the first region 51AA is equal to the width of the second region 51AB. Here, when a difference between the width of the first region 51AA and the width of the second region 51AB is, for example, within 10% of the width of the first region 51AA, it can be said that the width of the first region 51AA is equal to the width of the second region 51AB. The widths of the first to fourth regions 51AA to 51AD may be individually changed arbitrarily.

In a plan view, the first electrode pad 54 and the second electrode pad 55 are provided at different positions from the second unit 100. More specifically, in a plan view, the first electrode pad 54 is arranged to be closer to the first element side-surface 92C than the second unit 100. That is, the first electrode pad 54 is provided in the first region 51AA of the exposure region 51A. In a plan view, the second electrode pad 55 is arranged to be closer to the first element side-surface 92D than the second unit 100. That is, the second electrode pad 55 is provided in the second region 51AB of the exposure region 51A.

As shown in FIG. 27, the second unit 100 is arranged such that the second semiconductor substrate 101 of the second element insulating layer 102 faces the first element front surface 92A of the first element insulating layer 92 of the first unit 90. In a state where the second unit 100 is bonded to the first unit 90 by the insulating bonding material 110 (hereinafter referred to as a “unit bonding state”), the second unit 100 is placed on the insulating bonding material 110. Therefore, the second semiconductor substrate 101 is in contact with the insulating bonding material 110. In other words, the insulating bonding material 110 bonds the second semiconductor substrate 101 and the first element insulating layer 92. In this way, the insulating bonding material 110 is interposed between the second semiconductor substrate 101 and the first element insulating layer 92 in the Z direction. Therefore, the second semiconductor substrate 101 is arranged at a position spaced apart from the first element insulating layer 92 in the Z direction. That is, the second semiconductor substrate 101 is not directly bonded to the first element insulating layer 92.

In the unit bonding state, the first coil 21 and the second coil 22 are arranged to face each other in the Z direction. In one example, the distance DA1 between the first coil 21 and the first element front surface 92A in the Z direction is equal to the distance DB1 between the second coil 22 and the second element back surface 102B in the Z direction. Here, when a difference between the distance DA1 and the distance DB1 is, for example, within 10% of the distance DA1, it can be said that the distance DA1 is equal to the distance DB1. The distances DA1 and DB1 may be changed arbitrarily. In one example, the distance DA1 may be larger than the distance DB1. Further, in one example, the distance DB1 may be larger than the distance DA1.

In the unit bonding state, the third coil 23 and the fourth coil 24 are arranged to face each other in the Z direction. In one example, the distance DB3 between the third coil 23 and the second element back surface 102B in the Z direction is equal to the distance DA3 between the fourth coil 24 and the first element front surface 92A in the Z direction. Here, when a difference between the distance DA3 and the distance DB3 is, for example, within 10% of the distance DA3, it can be said that the distance DA3 is equal to the distance DB3. The distances DA3 and DB3 may be changed arbitrarily. In one example, the distance DA3 may be larger than the distance DB3. Further, in one example, the distance DB3 may be larger than the distance DA3.

The second semiconductor substrate 101 of the second unit 100 and the insulating bonding material 110 are interposed between the first coil 21 and the second coil 22 in the Z direction. Therefore, a distance between the first coil 21 and the second coil 22 in the Z direction is the sum (DA1+DB1+T2+T3) of the distance DA1, the distance DB1, the thickness T2 of the second semiconductor substrate 101, and the thickness T3 of the insulating bonding material 110.

Similarly, the second semiconductor substrate 101 and the insulating bonding material 110 are interposed between the fourth coil 24 and the third coil 23 in the Z direction. Therefore, a distance between the fourth coil 24 and the third coil 23 in the Z direction is the sum (DA3+DB3+T2+T3) of the distance DA3, the distance DB3, the thickness T2 of the second semiconductor substrate 101, and the thickness T3 of the insulating bonding material 110.

As shown in FIG. 27, the first wiring layer 95A of the first connecting portion 95 in the first unit 90 is arranged on the opposite side of the second coil 22 with respect to the first coil 21 in the Z direction. Further, the third wiring layer 97A of the third connecting portion 97 in the first unit 90 is arranged on the opposite side of the third coil 23 with respect to the fourth coil 24 in the Z direction. The wiring layer 105A of the first connecting portion 105 in the second unit 100 is arranged on the opposite side of the first coil 21 (the fourth coil 24) with respect to the second coil 22 (the third coil 23) in the Z direction. Therefore, a distance between the first wiring layer 95A and the wiring layer 105A in the Z direction and a distance between the third wiring layer 97A and the wiring layer 105A in the Z direction are larger than the distance (DA1+DB1+T2+T3) between the first coil 21 and the second coil 22 in the Z direction and the distance (DA3+DB3+T2+T3) between the fourth coil 24 and the third coil 23 in the Z direction, respectively.

The second wiring layer 96A of the second connecting portion 96 in the first unit 90 is arranged at the same position as the first coil 21 in the Z direction. Further, the fourth wiring layer 98A of the fourth connecting portion 98 in the first unit 90 is arranged at the same position as the fourth coil 24 in the Z direction. The second connecting portion 106 (see FIG. 25) in the second unit 100 is arranged at the same position as the second coil 22 in the Z direction. Therefore, a distance between the second wiring layer 96A and the second connecting portion 106 in the Z direction is equal to each of the distance (DA1+DB1+T2+T3) between the first coil 21 and the second coil 22 in the Z direction, and the distance (DA3+DB3+T2+T3) between the fourth coil 24 and the third coil 23 in the Z direction.

As described above, among the first to fourth coils 21 to 24, the first connecting portions 95 and 105, the second connecting portions 96 and 106, the third connecting portion 97, and the fourth connecting portion 98, which are related to a breakdown voltage, the shortest distances are the distance (DA1+DB1+T2+T3) between the first coil 21 and the second coil 22, the distance (DA3+DB3+T2+T3) between the fourth coil 24 and the third coil 23, and the distance between the second wiring layer 94A and the wiring layer 104A in the Z direction. In other words, the breakdown voltage of the transformer chip 50 is determined according to the distance (DA1+DB1+T2+T3) between the first coil 21 and the second coil 22, the distance (DA3+DB3+T2+T3) between the fourth coil 24 and the third coil 23, and the distance between the second wiring layer 94A and the wiring layer 104A in the Z direction.

In the unit bonding state, the first substrate 91A formed on the first element back surface 92B of the first element insulating layer 92 of the first unit 90 is placed at a position overlapping the first coil 21 and the second coil 22 of the second unit 100 in a plan view. In the unit bonding state, the second substrate 91B formed on the first element back surface 92B of the first element insulating layer 92 is arranged at a position overlapping the fourth coil 24 and the third coil 23 of the second unit 100 in a plan view.

A distance DBX between the first substrate 91A and the second substrate 91B in the X direction is equal to or larger than the distance between the first coil 21 and the second coil 22 in the Z direction. Further, the distance DBX is equal to or larger than the distance between the third coil 23 and the fourth coil 24 in the Z direction.

A width WR of the concave portion 160 is equal to or larger than the distance between the first coil 21 and the second coil 22 in the Z direction. The width WR of the concave portion 160 is equal to or larger than the distance between the third coil 23 and the fourth coil 24 in the Z direction. Further, the width WR of the concave portion 160 may be equal to the distance DBX, for example. Here, the width WR of the concave portion 160 may be defined as the dimension of the concave portion 160 in the X direction, that is, a distance between the first side-surface 161 and the second side-surface 162 of the concave portion 160 in the Z direction. Further, a depth HR of the concave portion 160 is smaller than the width WR of the concave portion 160. Further, the depth HR of the concave portion 160 is smaller than the thickness T1 of the first semiconductor substrate 91.

In the signal transmission device 10 shown in FIG. 20, the concave portion 160 is filled with the sealing resin 80. That is, the first side-surface 161, the second side-surface 162, and the bottom surface 163 of the concave portion 160 are in contact with the sealing resin 80.

[Effects]

According to the signal transmission device 10 of the third embodiment, in addition to the effects (1-2) to (1-7) of the first embodiment, the following effects may be obtained.

(3-1) The transformer chip 50 includes the first unit 90, the second unit 100 bonded to the first unit 90, and the insulating bonding material 110 that bonds the first unit 90 and the second unit 100. The first unit 90 is provided with: the first semiconductor substrate 91, the first element insulating layer 92 including the first element front surface 92A facing the second unit 100 and the first element back surface 92B opposite to the first element front surface 92A, the first element back surface 92B being in contact with the first semiconductor substrate 91; and the first coil 21 and the fourth coil 24 that are buried in the first element insulating layer 92 at a position spaced apart from the first element front surface 92A in the Z direction, are arranged to be spaced apart from each other in the X direction, and are electrically insulated from each other. The second unit 100 is provided with: the second element insulating layer 102 including the second element front surface 102A and the second element back surface 102B opposite to the second element front surface 102A, the second coil 22 and the third coil 23 that are buried in the second element insulating layer 102 at a position spaced apart from the second element front surface 102A in the Z direction, are arranged to be spaced apart from each other in the X direction, and are electrically connected to each other; and the second semiconductor substrate 101 that is in contact with the second element back surface 102B. In the unit bonding state in which the second unit 100 is bonded to the first unit 90 by the insulating bonding material 110, the first coil 21 and the second coil 22 are arranged to face each other in the Z direction, and the third coil 23 and the fourth coil 24 are arranged to face each other in the Z direction. The insulating bonding material 110 bonds the first element insulating layer 92 and the second semiconductor substrate 101.

With this configuration, since the first coil 21 and the second coil 22 are arranged to face each other, the third coil 23 and the fourth coil 24 are arranged to face each other, and the second coil 22 and the third coil 23 are electrically connected to each other, the dielectric breakdown voltage of the transformer chip 50 may be improved as compared to the configuration of a transformer chip in which the first coil 21 and the second coil 22 are arranged to face each other.

In addition, each of the element insulating layer between the first coil 21 and the second coil 22 in the Z direction and the element insulating layer between the third coil 23 and the fourth coil 24 in the Z direction may be formed individually in the Z direction like the first element insulating layer 92 and the second element insulating layer 102. Further, since the first to fourth coils 21 to 24 are respectively provided in the element insulating layers formed by the laminated first element insulating layer 92 and second element insulating layer 102, the distance between the first coil 21 and the second coil 22 the Z direction and the distance between the fourth coil 24 and the third coil 23 in the Z direction may be increased. Therefore, the dielectric breakdown voltage of the transformer chip 50 may be improved.

In addition, since the second semiconductor substrate 101 and the insulating bonding material 110 are interposed between the first coil 21 and the second coil 22 in the Z direction and between the third coil 23 and the fourth coil 24 in the Z direction, the distance between the first coil 21 and the second coil 22 in the Z direction and the distance between the third coil 23 and the fourth coil 24 in the Z direction may be further increased. Therefore, the dielectric breakdown voltage of the transformer chip 50 may be improved.

In addition, since the first substrate 91A and the second substrate 91B of the first semiconductor substrate 91 are arranged to be spaced apart from each other in the X direction, it is possible to suppress the dielectric breakdown voltage between the first coil 21 and the first semiconductor substrate 91 and the dielectric breakdown voltage between the fourth coil 24 and the first semiconductor substrate 91 from being decreased due to the first semiconductor substrate 91.

(3-2) The first element insulating layer 92 has the concave portion 160 recessed from the first element back surface 92B toward the first element front surface 92A. In the X direction, the first substrate 91A and the second substrate 91B are arranged in a distributed manner on both sides of the concave portion 160. The bottom surface 163 of the concave portion 160 is formed to be closer to the first semiconductor substrate 91 than the bonding surface between the first unit 90 and the second unit 100 in the Z direction.

With this configuration, since the bottom surface 163 of the concave portion 160 is constituted by the first element insulating layer 92, it is possible to suppress a decrease in the dielectric breakdown voltage between the first coil 21 and the fourth coil 24 in the X direction. In addition, as compared to a configuration in which the concave portion 160 is formed to be closer to the second semiconductor substrate 101 than the bonding surface between the first unit 90 and the second unit 100, it is possible to suppress a decrease in bonding strength between the first unit 90 and the second unit 100.

(3-3) The bottom surface 163 of the concave portion 160 is formed to be closer to the first element back surface 92B than the first coil 21 and the fourth coil 24 in the Z direction. With this configuration, since the first element insulating layer 92 is interposed between the first coil 21 and the fourth coil 24 in the X direction, for example, as compared to a configuration in which the sealing resin 80 is interposed between the first coil 21 and the fourth coil 24 in the X direction, it is possible to suppress a decrease in the dielectric breakdown voltage between the first coil 21 and the fourth coil 24 in the X direction.

(3-4) The width WR of the concave portion 160 is equal to or larger than the distance between the first coil 21 and the second coil 22 in the Z direction. With this configuration, the distance in the X direction between the first substrate 91A and the second substrate 91B, which are arranged in a distributed manner on both sides of the concave portion 160 in the X direction, is equal to or larger than the distance between the first coil 21 and the second coil 22 in the Z direction. Therefore, it is possible to suppress the dielectric breakdown voltage of the transformer chip 50 from being decreased due to the dielectric breakdown voltage between the first substrate 91A and the second substrate 91B.

(3-5) The distance between the first coil 21 and the fourth coil 24 in the X direction is equal to or larger than the distance between the first coil 21 and the second coil 22 in the Z direction. With this configuration, it is possible to suppress the dielectric breakdown voltage of the transformer chip 50 from being decreased due to the dielectric breakdown voltage between the first coil 21 and the fourth coil 24 in the X direction.

(3-6) The first unit 90 includes the first electrode pad 54 that is provided on the first element insulating layer 92 to be electrically connected to the first coil 21 and exposed from the first element front surface 92A, and the second electrode pad 55 that is provided on the first element insulating layer 92 to be electrically connected to the fourth coil 24 and exposed from the first element front surface 92A.

With this configuration, as compared to a configuration in which the first electrode pad 54 and the second electrode pad 55 are provided in the second unit 100, the length of the conductive path between the first coil 21 and the first electrode pad 54 and the length of the conductive path between the fourth coil 24 and the second electrode pad 55 may be shortened. In addition, since each of the first electrode pad 54 and the second electrode pad 55 is provided on the first element insulating layer 92, the first electrode pad 54 and the second electrode pad 55 may be formed more easily than, for example, as compared to a configuration in which the first electrode pad 54 and the second electrode pad 55 are provided so as to penetrate through the semiconductor substrate.

(3-7) The second unit 100 is formed to be smaller than the first unit 90 in a plan view. In the unit bonding state, both the first electrode pad 54 and the second electrode pad 55 are provided at different positions from the second unit 100 in a plan view.

With this configuration, since the second unit 100 is formed to be smaller than the first unit 90 in a plan view, even if the second unit 100 does not have a shape to expose the first electrode pad 54 and the second electrode pad 55, the first electrode pad 54 and the second electrode pad 55 are arranged at different positions from the second unit 100. Therefore, the shape of the second unit 100 may be made into a simple shape such as a rectangular shape. Therefore, the manufacturing cost of the second unit 100 may be reduced.

(3-8) The second coil 22 and the third coil 23 are electrically connected to each other within the second element insulating layer 102. With this configuration, as compared to a configuration in which the second coil 22 and the third coil 23 are electrically connected to each other outside the second element insulating layer 102, the conductive path between the second coil 22 and the third coil 23 may be shortened.

(3-9) The signal transmission device 10 includes the first die pad 61 and the second die pad 71 arranged to be spaced apart from the first die pad 61. The transformer chip 50 is arranged on both the first die pad 61 and the second die pad 71 so as to cross the first die pad 61 and the second die pad 71.

With this configuration, it is possible to suppress a decrease in the dielectric breakdown voltage between the first substrate 91A and the second substrate 91B, and the first die pad 61 and the second die pad 71. Therefore, it is possible to suppress a decrease in the dielectric breakdown voltage of the signal transmission device 10.

(3-10) The first coil 21 and the fourth coil 24 are arranged to be closer to the first element back surface 92B than the first element front surface 92A of the first element insulating layer 92 in the Z direction. With this configuration, the distance between the first coil 21 and the second coil 22 in the Z direction and the distance between the fourth coil 24 and the third coil 23 in the Z direction may be increased. Therefore, the dielectric breakdown voltage of the transformer chip 50 may be improved.

(3-11) The second coil 22 and the third coil 23 are arranged to be closer to the second element front surface 102A than the second element back surface 102B of the second element insulating layer 102 in the Z direction. With this configuration, the distance between the first coil 21 and the second coil 22 in the Z direction and the distance between the fourth coil 24 and the third coil 23 in the Z direction may be increased. Therefore, the dielectric breakdown voltage of the transformer chip 50 may be improved.

<Modifications>

Each of the above-described embodiments may be modified as follows, for example. Each of the above-described embodiments and each of the following modifications may be combined with each other to the extent that they are not technically contradictory. Further, in the following modifications, parts common to each of the above-described embodiments are denoted by the same reference numerals as in each of the above-described embodiments, and descriptions thereof will be omitted.

[Modifications of Insulation Chip]

In the first embodiment, the first coil 21 may be arranged to be closer to the first element front surface 92A than the first element back surface 92B of the first element insulating layer 92 in the Z direction. Further, the first coil 21 may be arranged at the center of the first element insulating layer 92 in the Z direction.

In the first embodiment, the second coil 22 may be arranged to be closer to the second element back surface 102B than the second element front surface 102A of the second element insulating layer 102 in the Z direction. Further, the second coil 22 may be arranged at the center of the second element insulating layer 102 in the Z direction.

In the first embodiment, the first coil 21 and the first electrode pad 54 may be electrically connected to each other outside the transformer chip 50.

In the first embodiment, the size of the second unit 100 may be changed arbitrarily. In one example, the dimension of the second unit 100 in the Y direction may be equal to the dimension of the first unit 90 in the Y direction.

In the second embodiment, the first electrode plate 121 may be arranged to be closer to the first element front surface 92A than the first element back surface 92B of the first element insulating layer 92 in the Z direction. Further, the first electrode plate 121 may be arranged at the center of the first element insulating layer 92 in the Z direction.

In the second embodiment, the second electrode plate 122 may be arranged to be closer to the second element back surface 102B than the second element front surface 102A of the second element insulating layer 102 in the Z direction. Further, the second electrode plate 122 may be arranged at the center of the second element insulating layer 102 in the Z direction.

In the second embodiment, the first electrode plate 121 and the first electrode pad 54 may be electrically connected to each other outside the capacitor chip 130.

In the second embodiment, the size of the second unit 150 may be changed arbitrarily. In one example, the dimension of the second unit 150 in the Y direction may be equal to the dimension of the first unit 140 in the Y direction.

In the third embodiment, the first coil 21 may be arranged to be closer to the first element front surface 92A than the first element back surface 92B of the first element insulating layer 92 in the Z direction. Further, the first coil 21 may be arranged at the center of the first element insulating layer 92 in the Z direction.

In the third embodiment, the fourth coil 24 may be arranged to be closer to the first element front surface 92A than the first element back surface 92B of the first element insulating layer 92 in the Z direction. Further, the fourth coil 24 may be arranged at the center of the first element insulating layer 92 in the Z direction.

In the third embodiment, the second coil 22 may be arranged to be closer to the second element back surface 102B than the second element front surface 102A of the second element insulating layer 102 in the Z direction. Further, the second coil 22 may be arranged at the center of the second element insulating layer 102 in the Z direction.

In the third embodiment, the third coil 23 may be arranged to be closer to the second element back surface 102B than the second element front surface 102A of the second element insulating layer 102 in the Z direction. Further, the third coil 23 may be arranged at the center of the second element insulating layer 102 in the Z direction.

In the third embodiment, the first coil 21 and the first electrode pad 54 may be electrically connected to each other outside the transformer chip 50. Further, in the third embodiment, the fourth coil 24 and the second electrode pad 55 may be electrically connected to each other outside the transformer chip 50.

In the third embodiment, the second coil 22 and the third coil 23 may be electrically connected to each other outside the second unit 100. Further, the second coil 22 and the third coil 23 may be electrically connected to each other outside the transformer chip 50.

In the third embodiment, the first to fourth coils 21 to 24 are used as the first to fourth insulating elements, but the present disclosure is not limited thereto. Instead of the first to fourth coils 21 to 24, the first to fourth electrode plates may be used as the first to fourth insulating elements. In this case, in the third embodiment, instead of the transformer chip 50, a capacitor chip is used as the insulation chip. The configurations of the first to fourth electrode plates may be the same as, for example, the configurations of the first electrode plate 121 and the second electrode plate 122 of the second embodiment.

In the third embodiment, the position of the bottom surface 163 of the concave portion 160, that is, the depth HR of the concave portion 160, may be changed arbitrarily. In one example, the concave portion 160 may reach the bonding surface between the first unit 90 and the second unit 100. Accordingly, the first element insulating layer 92 includes a first insulating layer and a second insulating layer as two insulating layers divided in the X direction. In this case, the second semiconductor substrate 101 is exposed in the Z direction by the concave portion 160.

The first insulating layer is provided on the first substrate 91A and includes the first coil 21. The second insulating layer is provided on the second substrate 91B and includes the fourth coil 24. The first connecting portion 95 and the second connecting portion 96 may be provided in the first insulating layer. The third connecting portion 97 and the fourth connecting portion 98 may be provided in the second insulating layer. Further, in this case, the insulating bonding material 110 is applied to each of the first element front surface 92A of the first insulating layer and the first element front surface 92A of the second insulating layer. Therefore, the insulating bonding material 110 is not applied to a portion of the second semiconductor substrate 101 that faces the concave portion 160.

In each embodiment, the first unit 90 may include an insulating substrate formed of a material containing glass or ceramic such as alumina instead of the first semiconductor substrate 91.

In each embodiment, the second unit 100 may include an insulating substrate formed of a material containing glass or ceramic such as alumina instead of the second semiconductor substrate 101.

In each embodiment, the size of the second unit 100 may be changed arbitrarily. In one example, the dimension of the second unit 100 in the Y direction may be equal to the dimension of the first unit 90 in the Y direction.

In each embodiment, at least one of the protective layer 92G and the passivation layer 92H may be omitted from the first element insulating layer 92. When both the protective layer 92G and the passivation layer 92H are omitted from the first element insulating layer 92, the first element front surface 92A of the first element insulating layer 92 is constituted by the second insulating film 92Q. Therefore, in the unit bonding state, the second insulating film 92Q is bonded to the second element front surface 102A of the second element insulating layer 102 of the second unit 100.

In each embodiment, at least one of the protective layer 102G or the passivation layer 102H may be omitted from the second element insulating layer 102. When both the protective layer 102G and the passivation layer 102H are omitted from the second element insulating layer 102, the second element front surface 102A of the second element insulating layer 102 is constituted by the second insulating film 102Q. Therefore, in the unit bonding state, the second insulating film 102Q is bonded to the first element front surface 92A of the first element insulating layer 92 of the first unit 90. Here, when both the protective layer 92G and the passivation layer 92H are omitted from the first element insulating layer 92 of the first unit 90, the second insulating film 102Q of the second element insulating layer 102 and the second insulating film 92Q of the first element insulating layer 92 are bonded to each other in the unit bonding state.

Figure 28:
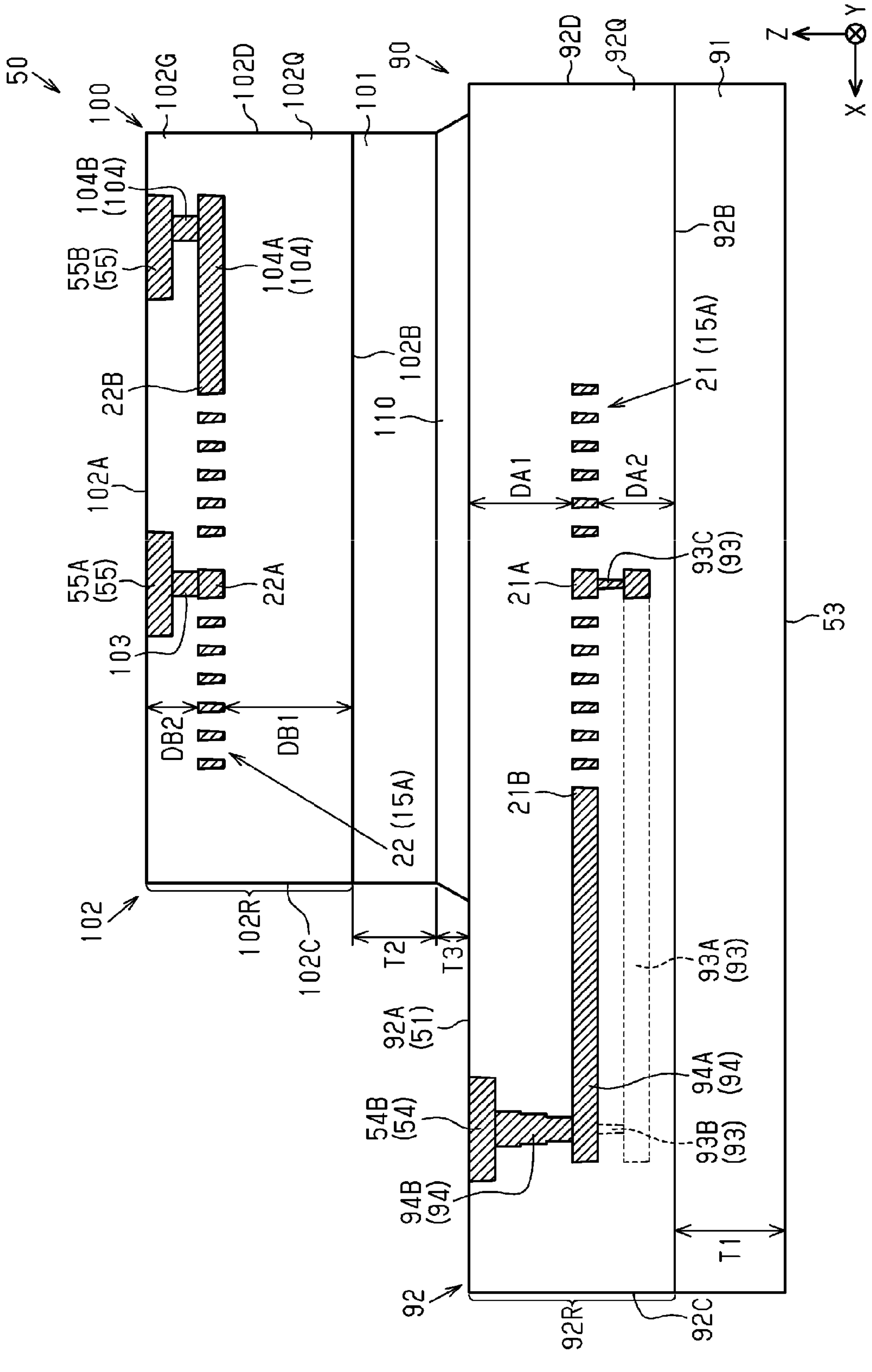
FIG. 28 is a schematic cross-sectional view showing an insulation chip according to a modification.

In each embodiment, the configuration of the first element insulating layer 92 may be changed arbitrarily. In one example, as shown in FIG. 28, the first element insulating layer 92 may be formed of a laminate of the plurality of second insulating films 92Q. That is, the first insulating film 92P may be omitted from the first element insulating layer 92. In the example shown in FIG. 28, the protective layer 92G and the passivation layer 92H are also omitted. Therefore, the first element insulating layer 92 is formed with the first insulating film 92P.

In each embodiment, the configuration of the second element insulating layer 102 may be changed arbitrarily. In one example, as shown in FIG. 28, the second element insulating layer 102 may be formed with a laminate of the plurality of second insulating films 102Q. That is, the first insulating film 102P may be omitted from the second element insulating layer 102. In the example shown in FIG. 28, the protective layer 102G and the passivation layer 92H are also omitted.

[Modifications of Signal Transmission Device]

In the first embodiment, the arrangement configuration of the transformer chip 50 may be changed arbitrarily. In one example, the transformer chip 50 may be arranged on the second die pad 71. In this case, both the transformer chip 50 and the second chip 40 are arranged on the second die pad 71.

In the second embodiment, the arrangement configuration of the capacitor chip 130 may be changed arbitrarily. In one example, the capacitor chip 130 may be arranged on the second die pad 71. In this case, both the capacitor chip 130 and the second chip 40 are arranged on the second die pad 71.

Figure 29:
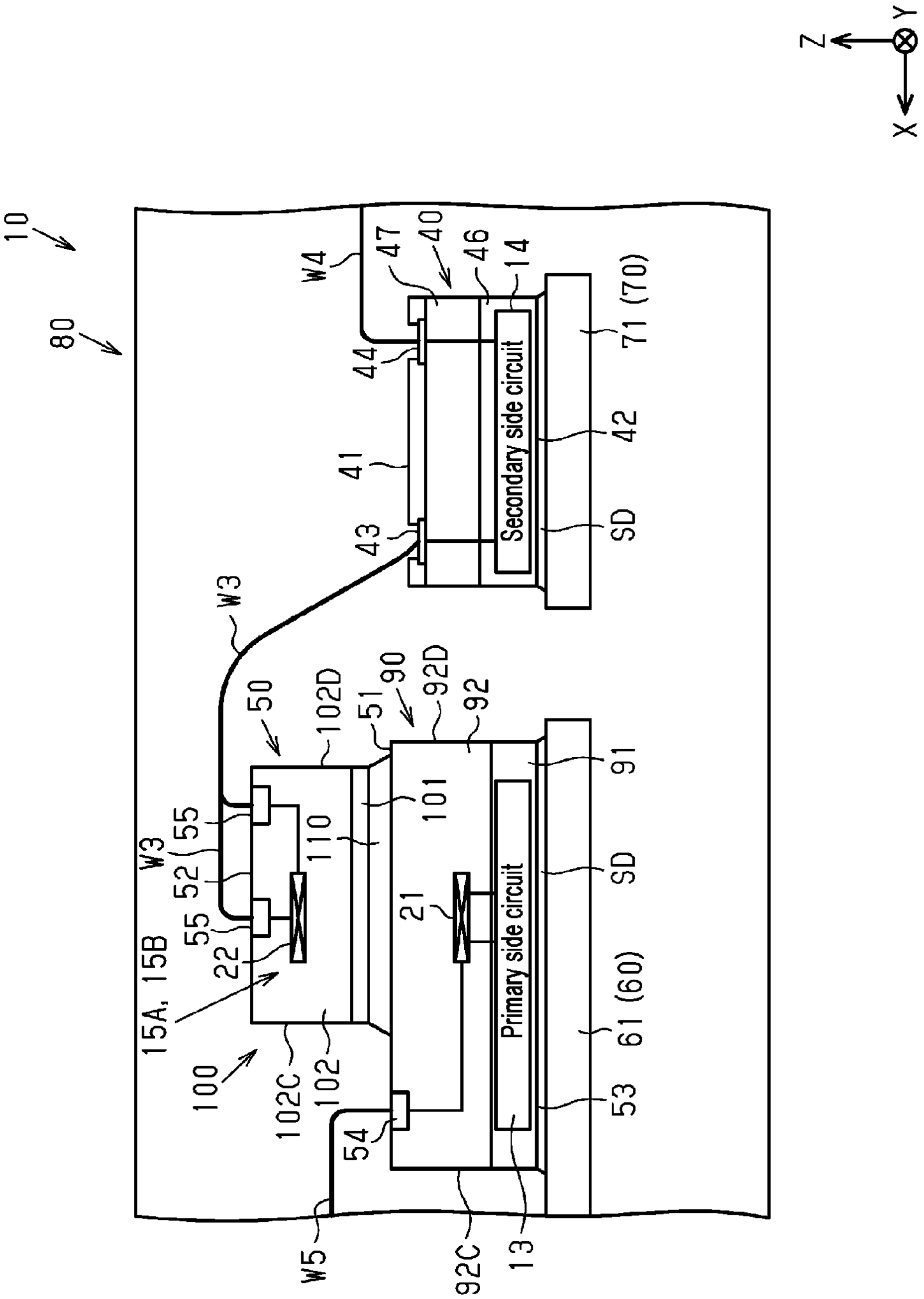
FIG. 29 is a schematic cross-sectional view schematically showing a signal transmission device according to a modification.

In the first embodiment, as shown in FIG. 29, the transformer chip 50 may include the primary-side circuit 13. The primary-side circuit 13 is provided in the first unit 90. More specifically, the primary-side circuit 13 is provided, for example, on the first semiconductor substrate 91. The first coil 21 and the primary-side circuit 13 are electrically connected to each other within the transformer chip 50. More specifically, the first coil 21 and the primary-side circuit 13 are electrically connected to each other within the first unit 90. The wiring layer that electrically connects the first coil 21 and the primary-side circuit 13 is provided, for example, in the first element insulating layer 92. In this case, the plurality of first electrode pads 54 are electrically connected individually to the plurality of first leads 62 (see FIG. 2) of the first lead frame 60 by a plurality of wires W5.

The configuration of the capacitor chip 130 of the second embodiment may be similarly changed to include the primary-side circuit 13. The first electrode plate 121 and the primary-side circuit 13 are electrically connected to each other within the capacitor chip 130. The wiring layer that electrically connects the first electrode plate 121 and the primary-side circuit 13 is provided, for example, in the first element insulating layer 92. Similarly, the configuration of the transformer chip 50 of the third embodiment may be changed to include the primary-side circuit 13. In this case, the primary-side circuit 13 is provided on the first substrate 91A.

Figure 30:
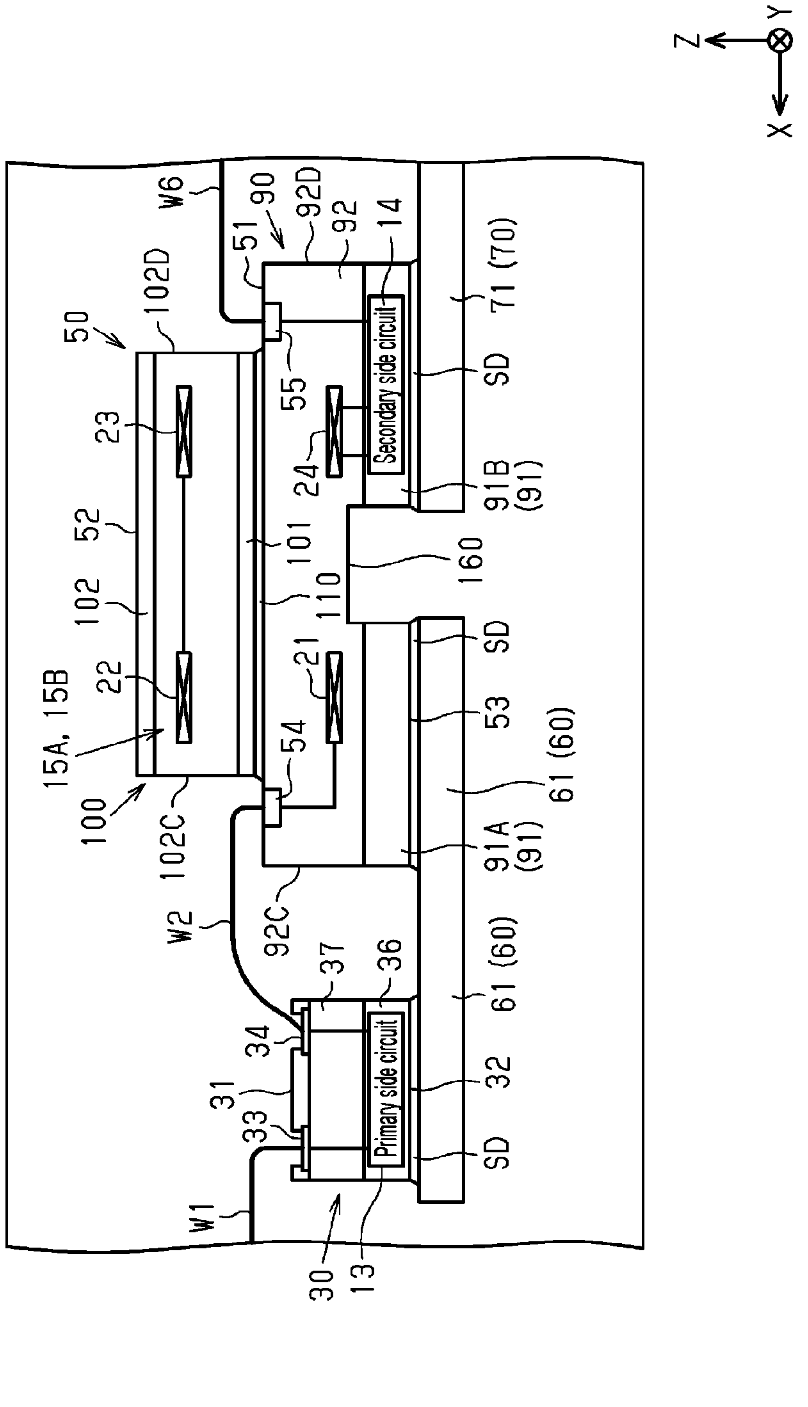
FIG. 30 is a schematic cross-sectional view schematically showing a signal transmission device according to a modification.

In the third embodiment, as shown in FIG. 30, the transformer chip 50 may include the secondary-side circuit 14. The secondary-side circuit 14 is provided in the first unit 90. More specifically, the secondary-side circuit 14 is provided, for example, on the second substrate 91B. The fourth coil 24 and the secondary-side circuit 14 are electrically connected to each other within the transformer chip 50. More specifically, the fourth coil 24 and the secondary-side circuit 14 are electrically connected to each other within the first unit 90. The wiring layer that electrically connects the fourth coil 24 and the secondary-side circuit 14 is provided, for example, in the first element insulating layer 92. In this case, the plurality of second electrode pads 55 are electrically connected individually to the plurality of first leads 62 (see FIG. 2) of the first lead frame 60 by a plurality of wires W6.

Figure 31:
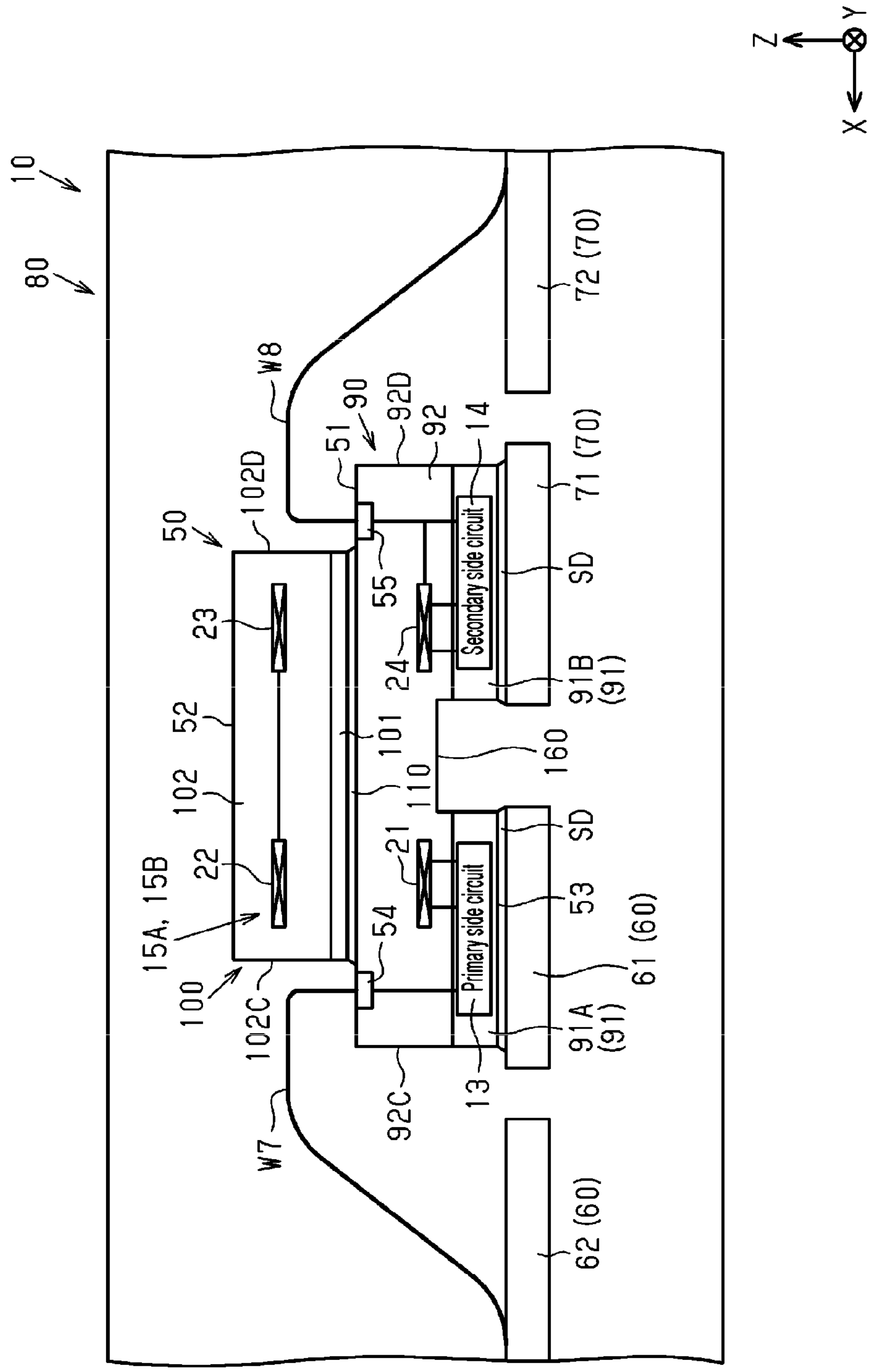
FIG. 31 is a schematic cross-sectional view schematically showing a signal transmission device according to a modification.

In the third embodiment, as shown in FIG. 31, the transformer chip 50 may include both the primary-side circuit 13 and the secondary-side circuit 14. The primary-side circuit 13 and the secondary-side circuit 14 are provided in the first unit 90. More specifically, the primary-side circuit 13 is provided, for example, on the first substrate 91A of the first semiconductor substrate 91, and the secondary-side circuit 14 is provided, for example, on the second substrate 91B of the first semiconductor substrate 91. The first coil 21 and the primary-side circuit 13 are electrically connected to each other within the transformer chip 50, and the fourth coil 24 and the secondary-side circuit 14 are electrically connected to each other within the transformer chip 50. More specifically, the first coil 21 and the primary-side circuit 13 are electrically connected to each other within the first unit 90. The fourth coil 24 and the secondary-side circuit 14 are electrically connected to each other within the second unit 100. The wiring layer that electrically connects the first coil 21 and the primary-side circuit 13 is provided, for example, in the first element insulating layer 92. The wiring layer that electrically connects the fourth coil 24 and the secondary-side circuit 14 is provided, for example, in the first element insulating layer 92.

The plurality of first electrode pads 54 are electrically connected individually to the plurality of first leads 62 of the first lead frame 60 by a plurality of wires W7. The plurality of second electrode pads 55 are electrically connected individually to the plurality of second leads 72 of the second lead frame 70 by a plurality of wires W8.

Figure 32:
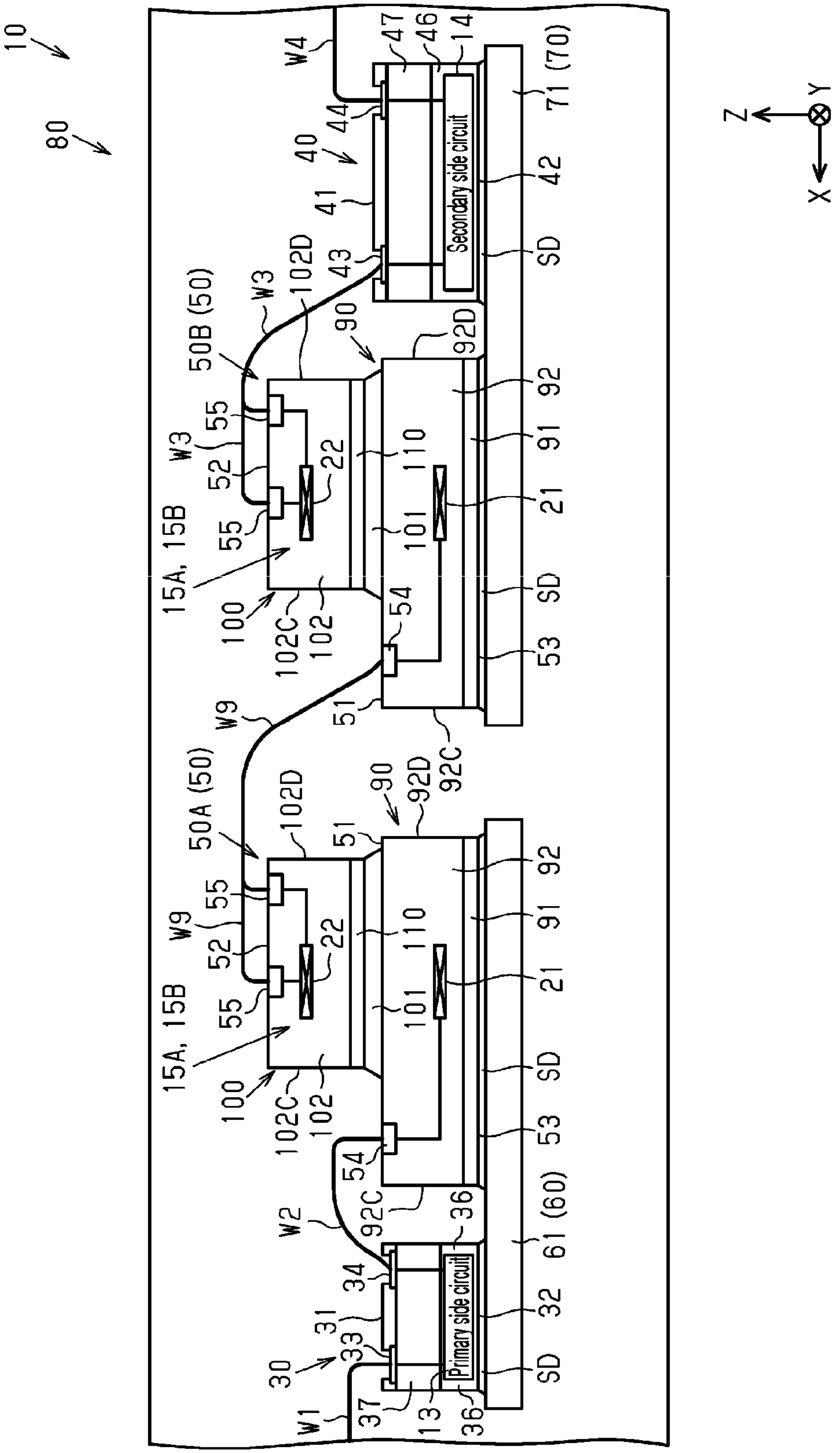
FIG. 32 is a schematic cross-sectional view schematically showing a signal transmission device according to a modification.

In the first and second embodiments, the signal transmission device 10 may include, for example, a plurality of insulation chips. In one example, as shown in FIG. 32, the signal transmission device 10 may include two transformer chips 50. Here, for the sake of convenience in description, the two transformer chips 50 are referred to as a "first transformer chip 50A" and a "second transformer chip 50B." The first transformer chip 50A is arranged on the first die pad 61 of the first lead frame 60. The second transformer chip 50B is arranged on the second die pad 71 of the second lead frame 70. In this way, both the first transformer chip 50A and the first chip 30 are arranged on the first die pad 61, and both the second transformer chip 50B and the second chip 40 are arranged on the second die pad 71. Here, the first transformer chip 50A is an example of a "first insulation chip," and the second transformer chip 50B is an example of a "second insulation chip."

The first transformer chip 50A is arranged to be closer to the second chip 40 than the first chip 30. The second transformer chip 50B is arranged to be closer to the first chip 30 than the second chip 40. Therefore, the first chip 30, the first transformer chip 50A, the second transformer chip 50B, and the second chip 40 are arranged in this order from the first lead 62 of the first lead frame 60 to the second lead 72 of the second lead frame 70.

The first chip 30 and the first transformer chip 50A are electrically connected to each other by the plurality of wires W1. The second chip 40 and the second transformer chip 50B are electrically connected to each other by the plurality of wires W3. The manner in which the first chip 30 and the first transformer chip 50A are connected to each other by the plurality of wires W1 is the same as the manner in which the first chip 30 and the transformer chip 50 are connected to each other by the plurality of wires W1 in the first embodiment. The manner in which the second chip 40 and the second transformer chip 50B are connected to each other by the plurality of wires W2 is the same as the manner in which the second chip 40 and the transformer chip 50 are connected to each other by the plurality of wires W2 in the first embodiment.

The first transformer chip 50A and the second transformer chip 50B are electrically connected to each other by a plurality of wires W9. More specifically, the plurality of second electrode pads 55 of the first transformer chip 50A are individually connected to the plurality of first electrode pads 54 of the second transformer chip 50B by the plurality of wires W9. As a result, the second coil 22 of the first transformer chip 50A and the first coil 21 of the second transformer chip 50B are electrically connected to each other.

With this configuration, since the first chip 30 and the second chip 40 are insulated from each other by a double insulation structure of the first transformer chip 50A and the second transformer chip 50B, as compared to a configuration in which the first chip 30 and the second chip 40 are insulated from each other by a single transformer chip, the dielectric breakdown voltage of the signal transmission device 10 may be improved.

In addition, since the first transformer chip 50A and the second transformer chip 50B are provided separately from the first chip 30 and the second chip 40, a common transformer chip may be used for the different first chip 30 and second chip 40. As a result, manufacturing costs may be reduced when manufacturing multiple types of signal transmission devices 10 in which at least one of the first chip 30 or the second chip 40 is different.

The transformer chip 50 may be applied to systems other than the signal transmission device 10 of each embodiment.

In a first example, the transformer chip 50 may be applied to, for example, a primary-side circuit module. The primary-side circuit module includes a first chip 30, a transformer chip 50, and a sealing resin that seals these chips 30 and 50. The primary-side circuit module also includes a first die pad 61 on which both the first chip 30 and the transformer chip 50 are arranged. In this case, the primary-side circuit module corresponds to an "insulation module." As shown in FIG. 29, the transformer chip 50 may be configured to include the primary-side circuit 13. In this case, the first chip 30 is omitted. Further, the primary-side circuit module may include a capacitor chip 130 instead of the transformer chip 50.

In a second example, the transformer chip 50 may be applied to, for example, a secondary-side circuit module. The secondary-side circuit module includes a second chip 40, a transformer chip 50, and a sealing resin that seals these chips 40 and 50. The secondary-side circuit module also includes a second die pad 71 on which the second chip 40 and the transformer chip 50 are arranged. In this case, the secondary-side circuit module corresponds to an "insulation module."

In a third example, the transformer chip 50 may be modularized. That is, the insulation module includes a transformer chip 50 and a sealing resin that seals the transformer chip 50. The insulation module also includes a die pad on which the transformer chip 50 is arranged. Further, the insulation module may include a capacitor chip 130 instead of the transformer chip 50.

Based on the above-described first to third examples, the configuration of the signal transmission device 10 may be changed as follows.

In one example, the signal transmission device 10 may include the above-mentioned primary-side circuit module and the second chip 40. In this case, the second chip 40 may be arranged on the second die pad 71, and both the second die pad 71 and the second chip 40 may be configured as a module sealed with a sealing resin. In other words, this module is provided separately from the primary-side circuit module. The signal transmission device 10 includes the primary-side circuit module and the above-mentioned module.

Additionally, in one example, the signal transmission device 10 may include the above-mentioned secondary-side circuit module and the first chip 30. In this case, the first chip 30 may be arranged on the first die pad 61, and both the first die pad 61 and the first chip 30 may be configured as a module sealed with a sealing resin. In other words, this module is provided separately from the secondary-side circuit module. The signal transmission device 10 includes the secondary-side circuit module and the above-mentioned module.

Additionally, in one example, the signal transmission device 10 may include an insulation module, a first chip 30, and a second chip 40. In this case, the first chip 30 may be arranged on the first die pad 61, and both the first die pad 61 and the first chip 30 may be configured as a first module sealed with a sealing resin. The second chip 40 may be arranged on the second die pad 71, and both the second die pad 71 and the second chip 40 may be configured as a second module sealed with a sealing resin. In other words, the first module, the second module, and the insulation module are provided separately from each other. The signal transmission device 10 includes the first module, the second module, and the insulation module.

In each of the above-described embodiments, the signal transmission device 10 transmits the set signal and the reset signal from the primary-side circuit 13 to the secondary-side circuit 14, but the present disclosure is not limited thereto. In one example, the signal transmission device 10 may transmit signals from the secondary-side circuit 14 to the primary-side circuit 13. In one example, the signal transmission device 10 may transmit signals bi-directionally such as transmitting a signal from the primary-side circuit 13 to the secondary-side circuit 14 and transmitting a signal from the secondary-side circuit 14 to the primary-side circuit 13.

One or more of the various examples described in the present disclosure may be combined to the extent that they are not technically contradictory. The terms such as "first," "second," and "third" in the present disclosure are used merely to distinguish between objects and are not intended to rank the objects.

In the present disclosure, "at least one selected from the group consisting of A and B" should be understood to mean "A alone, or B alone, or both A and B." The term "on" as used in the present disclosure includes the meanings of "on" and "above" unless clearly stated otherwise in the context. Therefore, the expression "a first element is arranged on a second element" is intended that in some embodiments, the first element may be directly arranged on the second element in contact with the second element, while in other embodiments, the first element may be arranged above the second element without contacting the second element. That is, the term "on" does not exclude a structure in which other elements are formed between the first element and the second element.

The Z direction used in the present disclosure does not necessarily have to be the vertical direction, and it does not have to be exactly the same as the vertical direction. Therefore, various structures according to the present disclosure are not limited to the Z direction "up" and "down" described herein being the vertical direction "up" and "down." For example, the X direction may be the vertical direction, or the Y direction may be the vertical direction.

<Supplementary Notes>

The technical ideas that may be grasped from the present disclosure are described below. In addition, for the purpose of aiding understanding and not for the purpose of limitation, constituent elements described in supplementary notes are labeled with the reference numerals of the corresponding constituent elements in the above-described embodiments. The reference numerals are provided as examples to aid understanding, and the constituent elements described in supplementary notes should not be limited to the constituent elements indicated by the reference numerals.

<Supplementary Note 1>

An insulation chip 50 including:

a first unit 90;

a second unit 100 provided on the first unit 90; and an insulating bonding material 110 that bonds the first unit 90 and the second unit 100, wherein the first unit 90 includes:

a first element insulating layer 92 including a first element front surface 92A facing the second unit 100 and a first element back surface 92B opposite to the first element front surface 92A; and a first insulating element 21 buried in the first element insulating layer 92 at a position spaced apart from the first element front surface 92A in a thickness direction (Z direction) of the first element insulating layer 92, wherein the second unit 100 includes:

a second element insulating layer 102 including a second element front surface 102A and a second element back surface 102B opposite to the second element front surface 102A;

a second insulating element 22 buried in the second element insulating layer 102 at a position spaced apart from the second element front surface 102A in a thickness direction (Z direction) of the second element insulating layer 102; and a second semiconductor substrate 101 in contact with the second element back surface 102B, wherein in a unit bonding state in which the second unit 100 is bonded to the first unit 90 by the insulating bonding material 110, the first insulating element 21 and the second insulating element 22 are arranged to face each other in the thickness direction (Z direction) of the first element insulating layer 92, and wherein the insulating bonding material 110 bonds the first element insulating layer 92 and the second semiconductor substrate 101.

<Supplementary Note 2>

In the insulation chip of Supplementary Note 1 above, the first unit 90 includes a first semiconductor substrate 91 in contact with the first element back surface 92B of the first element insulating layer 92, and an impurity concentration of the second semiconductor substrate 101 is lower than an impurity concentration of the first semiconductor substrate 91.

<Supplementary Note 3>

In the insulation chip of Supplementary Note 2 above, the impurity concentration of the second semiconductor substrate 101 is $1\times10^{13}$ $cm^{-3}$ or more and $1\times10^{14}$ $cm^{-3}$ or less.

<Supplementary Note 4>

In the insulation chip of Supplementary Note 1 above, the first unit 90 includes a first semiconductor substrate 91 in contact with the first element back surface 92B of the first element insulating layer 92, and an impurity concentration of the second semiconductor substrate 101 is equal to an impurity concentration of the first semiconductor substrate 91.

<Supplementary Note 5>

In the insulation chip of Supplementary Note 4 above, the impurity concentration of each of the first semiconductor substrate 91 and the second semiconductor substrate 101 is $1\times10^{13}$ $cm^{-3}$ or more and $1\times10^{14}$ $cm^{-3}$ or less.

<Supplementary Note 6>

In the insulation chip of Supplementary Note 1 above, the first unit 90 includes a first semiconductor substrate 91 in contact with the first element back surface 92B of the first element insulating layer 92, and a resistivity of the second semiconductor substrate 101 is higher than a resistivity of the first semiconductor substrate 91.

<Supplementary Note 7>

In the insulation chip of Supplementary Note 6 above, the resistivity of the second semiconductor substrate 101 is equal to or more than 100 Ωcm and less than 10,000 Ωcm.

<Supplementary Note 8>

In the insulation chip of Supplementary Note 1 above, the first unit 90 includes a first semiconductor substrate 91 in contact with the first element back surface 92B of the first element insulating layer 92, and a resistivity of the second semiconductor substrate 101 is equal to a resistivity of the first semiconductor substrate 91.

<Supplementary Note 9>

In the insulation chip of Supplementary Note 8 above, the resistivity of each of the first semiconductor substrate 91 and the second semiconductor substrate 101 is equal to or more than 100 Ωcm and less than 10,000 Ωcm.

<Supplementary Note 10>

In the insulation chip of any one of Supplementary Notes 1 to 9 above, the first unit 90 includes a first semiconductor substrate 91 in contact with the first element back surface 92B of the first element insulating layer 92, and a thickness T2 of the second semiconductor substrate 101 is thinner than a thickness T1 of the first semiconductor substrate 91.

<Supplementary Note 11>

In the insulation chip of any one of Supplementary Notes 1 to 10 above, the insulating bonding material 110 includes at least one of an epoxy resin or a bismaleimide resin.

<Supplementary Note 12>

In the insulation chip of any one of Supplementary Notes 1 to 11 above, the second unit 100 is formed to be smaller in size than the first unit 90 in a plan view, the first unit 90 includes a first electrode pad 54 provided on the first element insulating layer 92 to be electrically connected to the first insulating element 21 and exposed from the first element front surface 92A, the second unit 100 includes a second electrode pad 55 provided on the second element insulating layer 102 to be electrically connected to the second insulating element 22 and exposed from the second element front surface 102A, and in the unit bonding state, the first electrode pad 54 is provided at a different position from the second unit 100 in a plan view.

<Supplementary Note 13>

In the insulation chip of any one of Supplementary Notes 1 to 12 above, the first insulating element 21 is arranged to be closer to the first element back surface 92B than the first element front surface 92A, and the second insulating element 22 is arranged to be closer to the second element front surface 102A than the second element back surface 102B.

<Supplementary Note 14>

In the insulation chip of any one of Supplementary Notes 1 to 13 above, the first insulating element 21 and the second insulating element 22 are coils.

<Supplementary Note 15>

In the insulation chip of any one of Supplementary Notes 1 to 13 above, the first insulating element 121 and the second insulating element 122 are electrode plates.

<Supplementary Note 16>

A signal transmission device 10 includes:

the insulation chip 50 of any one of Supplementary Notes 1 to 15;

a first circuit 13; and a second circuit 14 connected to the first circuit 13 via the insulation chip 50, wherein the first circuit 13 and the second circuit 14 are configured to transmit a signal via the insulation chip 50.

<Supplementary Note 17>

In the signal transmission device of Supplementary Note 16 above, the first unit 90 includes the first circuit 13, and the second circuit 14 is provided separately from the insulation chip 50.

<Supplementary Note 18>

The signal transmission device of Supplementary Note 16 above further includes:

a first chip 30 including the first circuit 13; and a second chip 40 including the second circuit 14.

<Supplementary Note 19>

In the insulation chip of Supplementary Note 12 above, the first unit 90 includes:

a wiring layer 93A that is provided within the first element insulating layer 92 and is electrically connected to the first insulating element 21; and a connection wiring 93B (93C) that is provided within the first element insulating layer 92 and electrically connects the wiring layer 93A and the first electrode pad 54.

<Supplementary Note 20>

In the insulation chip of Supplementary Note 12 above, the second unit 100 includes:

a wiring layer 104A that is provided within the second element insulating layer 102 and is electrically connected to the second insulating element 22; and a connection wiring 104B that is provided within the second element insulating layer 102 and electrically connects the wiring layer 104A and the second electrode pad 55.

<Supplementary Note 21>

An insulation chip 50 includes:

a first unit 90;

a second unit 100 bonded to the first unit 90; and an insulating bonding material 110 that bonds the first unit 90 and the second unit 100, wherein the first unit 90 includes:

a first element insulating layer 92 including a first element front surface 92A facing the second unit 100 and a first element back surface 92B opposite to the first element front surface 92A, the first element back surface 92B being in contact with a first semiconductor substrate 91; and a first insulating element 21 and a fourth insulating element 24 that are buried in the first element insulating layer 92 at positions spaced apart from the first element front surface 92A in a thickness direction (Z direction) of the first element insulating layer 92, are arranged to be spaced apart from each other in a first direction (X direction) along the first element front surface 92A, and are electrically insulated from each other, wherein the second unit 100 includes:

a second element insulating layer 102 including a second element front surface 102A and a second element back surface 102B opposite to the second element front surface 102A;

a second insulating element 22 and a third insulating element 23 that are buried in the second element insulating layer 102 at positions spaced apart from the second element front surface 102A in a thickness direction (Z direction) of the second element insulating layer 102, are arranged to be spaced apart from each other in the first direction (X direction), and are electrically connected to each other; and a second semiconductor substrate 101 in contact with the second element back surface 102B, wherein in a unit bonding state in which the second unit 100 is bonded to the first unit 90 by the insulating bonding material 110, the first insulating element 21 and the second insulating element 22 are arranged to face each other in the thickness direction (Z direction) of the first element insulating layer 92, and the third insulating element 23 and the fourth insulating element 24 are arranged to face each other in the thickness direction (Z direction) of the first element insulating layer 92, wherein the first semiconductor substrate 91 includes a first substrate 91A and a second substrate 91B arranged apart from each other in the first direction (X direction), wherein the first substrate 91A is arranged at a position overlapping the first insulating element 21 and the second insulating element 22 in a plan view, wherein the second substrate 91B is arranged at a position overlapping the third insulating element 23 and the fourth insulating element 24 in a plan view, and wherein the insulating bonding material 110 bonds the first element insulating layer 92 and the second semiconductor substrate 101.

<Supplementary Note 22>

In the insulation chip of Supplementary Note 21 above, the first element insulating layer 92 has a concave portion 160 recessed from the first element back surface 92B toward the first element front surface 92A, and wherein in the first direction (X direction), the first substrate 91A and the second substrate 91B are arranged in a distributed manner on both sides of the concave portion 160.

<Supplementary Note 23>

In the insulation chip of Supplementary Note 22 above, a bottom surface 163 of the concave portion 160 is formed to be closer to the first semiconductor substrate 91 than a bonding surface between the first unit 90 and the second unit 100 in the thickness direction (Z direction) of the first element insulating layer 92.

<Supplementary Note 24>

In the insulation chip of Supplementary Note 23 above, the bottom surface 163 of the concave portion 160 is formed to be closer to the first element back surface 92B than the first insulating element 21 and the fourth insulating element 24 in the thickness direction (Z direction) of the first element insulating layer 92.

<Supplementary Note 25>

In the insulation chip of any one of Supplementary Notes 22 to 24 above, a width WR of the concave portion 160 is equal to or more than a distance between the first insulating element 21 and the second insulating element 22 in the thickness direction (Z direction) of the first element insulating layer 92.

<Supplementary Note 26>

In the insulation chip of any one of Supplementary Notes 21 to 25 above, a distance between the first insulating element 21 and the fourth insulating element 24 in the first direction (X direction) is equal to or more than the distance between the first insulating element 21 and the second insulating element 22 in the thickness direction (Z direction) of the first element insulating layer 92.

<Supplementary Note 27>

In the insulation chip of any one of Supplementary Notes 21 to 26 above, the first unit 90 includes:

a first electrode pad 54 provided on the first element insulating layer 92 to be electrically connected to the first insulating element 21 and exposed from the first element front surface 92A; and a second electrode pad 55 provided on the first element insulating layer 92 to be electrically connected to the fourth insulating element 24 and exposed from the first element front surface 92A.

<Supplementary Note 28>

In the insulation chip of Supplementary Note 27 above, the second unit 100 is formed to be smaller in size than the first unit 90 in a plan view, and wherein in the unit bonding state, both the first electrode pad 54 and the second electrode pad 55 are provided at different positions from the second unit 100 in a plan view.

<Supplementary Note 29>

In the insulation chip of any one of Supplementary Notes 21 to 28 above, the second insulating element 22 and the third insulating element 23 are electrically connected to each other within the second element insulating layer 102.

<Supplementary Note 30>

In the insulation chip of any one of Supplementary Notes 21 to 29 above, the first insulating element 21, the second insulating element 22, the third insulating element 23, and the fourth insulating element 24 are formed by coils.

<Supplementary Note 31>

In the insulation chip of any one of Supplementary Notes 21 to 29 above, the first insulating element, the second insulating element, the third insulating element, and the fourth insulating element are formed by electrode plates.

<Supplementary Note 32>

A signal transmission device 10 includes:

the insulation chip 50 of any one of Supplementary Notes 21 to 31 above;

a first circuit 13; and a second circuit 14 connected to the first circuit 13 via the insulation chip 50, wherein the first circuit 13 and the second circuit 14 are configured to transmit a signal via the insulation chip 50.

<Supplementary Note 33>

The signal transmission device of Supplementary Note 32 above further includes:

a first die pad 61; and a second die pad 71 arranged to be spaced apart from the first die pad 61, wherein the insulation chip 50 is arranged on both the first die pad 61 and the second die pad 71 so as to cross the first die pad 61 and the second die pad 71.

<Supplementary Note 34>

In the signal transmission device of Supplementary Note 32 or 33 above, the first unit 90 includes at least one of the first circuit 13 or the second circuit 14.

<Supplementary Note 35>

The signal transmission device of Supplementary Note 33 above includes:

a first chip 30 including the first circuit 13; and a second chip 40 including the second circuit 14, wherein the first chip 30 is arranged on the first die pad 61, and wherein the second chip 40 is arranged on the second die pad 71.

The above description is merely an example. Those skilled in the art will appreciate that more combinations and substitutions are possible beyond the constituent elements and methods (manufacturing processes) listed for the purposes of illustrating the techniques of the present disclosure. The present disclosure is intended to cover all alternatives, modifications, and changes that fall within the scope of the present disclosure, including the claims.

What is claimed is:

1. An insulation chip comprising:

a first unit;

a second unit provided on the first unit; and an insulating bonding material configured to bond the first unit and the second unit, wherein the first unit includes:

a first element insulating layer including a first element front surface facing the second unit and a first element back surface opposite to the first element front surface; and a first insulating element buried in the first element insulating layer at a position spaced apart from the first element front surface in a thickness direction of the first element insulating layer, wherein the second unit includes:

a second element insulating layer including a second element front surface and a second element back surface opposite to the second element front surface;

a second insulating element buried in the second element insulating layer at a position spaced apart from the second element front surface in a thickness direction of the second element insulating layer; and a second semiconductor substrate in contact with the second element back surface, wherein in a unit bonding state in which the second unit is bonded to the first unit by the insulating bonding material, the first insulating element and the second insulating element are arranged to face each other in the thickness direction of the first element insulating layer, and wherein the insulating bonding material bonds the first element insulating layer and the second semiconductor substrate.

2. The insulation chip of claim 1, wherein the first unit includes a first semiconductor substrate in contact with the first element back surface of the first element insulating layer, and wherein an impurity concentration of the second semiconductor substrate is lower than an impurity concentration of the first semiconductor substrate.

3. The insulation chip of claim 2, wherein the impurity concentration of the second semiconductor substrate is $1\times10^{13}$ $cm^{-3}$ or more and $1\times10^{14}$ $cm^{-3}$ or less.

4. The insulation chip of claim 1, wherein the first unit includes a first semiconductor substrate in contact with the first element back surface of the first element insulating layer, and wherein an impurity concentration of the second semiconductor substrate is equal to an impurity concentration of the first semiconductor substrate.

5. The insulation chip of claim 4, wherein the impurity concentration of each of the first semiconductor substrate and the second semiconductor substrate is $1\times10^{13}$ $cm^{-3}$ or more and $1\times10^{14}$ $cm^{-3}$ or less.

6. The insulation chip of claim 1, wherein the first unit includes a first semiconductor substrate in contact with the first element back surface of the first element insulating layer, and wherein a resistivity of the second semiconductor substrate is higher than a resistivity of the first semiconductor substrate.

7. The insulation chip of claim 6, wherein the resistivity of the second semiconductor substrate is equal to or more than 100 Ωcm and less than 10,000 Ωcm.

8. The insulation chip of claim 1, wherein the first unit includes a first semiconductor substrate in contact with the first element back surface of the first element insulating layer, and wherein a resistivity of the second semiconductor substrate is equal to a resistivity of the first semiconductor substrate.

9. The insulation chip of claim 8, wherein the resistivity of each of the first semiconductor substrate and the second semiconductor substrate is equal to or more than 100 Ωcm and less than 10,000 Ωcm.

10. The insulation chip of claim 1, wherein the first unit includes a first semiconductor substrate in contact with the first element back surface of the first element insulating layer, and wherein a thickness of the second semiconductor substrate is thinner than a thickness of the first semiconductor substrate.

11. The insulation chip of claim 1, wherein the insulating bonding material includes at least one of an epoxy resin or a bismaleimide resin.

12. The insulation chip of claim 1, wherein the second unit is formed to be smaller in size than the first unit in a plan view, wherein the first unit includes a first electrode pad provided on the first element insulating layer to be electrically connected to the first insulating element and exposed from the first element front surface, wherein the second unit includes a second electrode pad provided on the second element insulating layer to be electrically connected to the second insulating element and exposed from the second element front surface, and wherein in the unit bonding state, the first electrode pad is provided at a different position from the second unit in a plan view.

13. The insulation chip of claim 1, wherein the first insulating element is arranged to be closer to the first element back surface than the first element front surface, and wherein the second insulating element is arranged to be closer to the second element front surface than the second element back surface.

14. The insulation chip of claim 1, wherein the first insulating element and the second insulating element are coils.

15. The insulation chip of claim 1, wherein the first insulating element and the second insulating element are electrode plates.

16. A signal transmission device comprising:

the insulation chip of claim 1;

a first circuit; and a second circuit connected to the first circuit via the insulation chip, wherein the first circuit and the second circuit are configured to transmit a signal via the insulation chip.

17. The signal transmission device of claim 16, wherein the first unit includes the first circuit, and wherein the second circuit is provided separately from the insulation chip.

18. The signal transmission device of claim 16, comprising:

a first chip including the first circuit; and a second chip including the second circuit.

* * * * *